US012643730B2

(12) United States Patent
Sollie et al.

(10) Patent No.: US 12,643,730 B2
(45) Date of Patent: *Jun. 2, 2026

(54) FILM DEPOSITION DELIVERY CONTAINER

(71) Applicant: Pratt Corrugated Holdings, Inc., Brookhaven, GA (US)

(72) Inventors: Greg Sollie, Sharpsburg, GA (US); Jamie Waltermire, Peachtree City, GA (US); Shifeng Chen, Newport News, VA (US)

(73) Assignee: Pratt Corrugated Holdings, Inc., Brookhaven, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 19/070,793

(22) Filed: Mar. 5, 2025

(65) Prior Publication Data

US 2025/0197089 A1     Jun. 19, 2025

Related U.S. Application Data

(63) Continuation of application No. 18/386,187, filed on Nov. 1, 2023.

(Continued)

(51) Int. Cl.
*B65D 81/38* (2006.01)
*B65D 30/08* (2006.01)
(Continued)

(52) U.S. Cl.
CPC ......... *B65D 81/3897* (2013.01); *B65D 31/02* (2013.01); *B65D 31/04* (2013.01);
(Continued)

(58) Field of Classification Search
CPC .... B65D 81/3897; B65D 31/02; B65D 31/04; B65D 65/42; B65D 81/3893
(Continued)

(56) References Cited

U.S. PATENT DOCUMENTS 1,720,016 A     7/1929   Tinsley
2,084,296 A  *  6/1937   Eustis ................... B65D 31/04
                                                        383/102
(Continued)

FOREIGN PATENT DOCUMENTS

EP          3708026        9/2020
GB          580826         9/1946
(Continued)

OTHER PUBLICATIONS

Sollie, Greg; Applicant-Initiated Interview Summary for U.S. Appl. No. 18/386,187, filed Nov. 1, 2023, mailed Feb. 26, 2025, 3 pgs.
(Continued)

*Primary Examiner* — Rafael A Ortiz
*Assistant Examiner* — Jenine Spicer
(74) *Attorney, Agent, or Firm* — Smith, Gambrell & Russell, LLP

(57) ABSTRACT

A blank includes an inner sheet having at least a base layer having a first side and a second side opposite the first side, the inner sheet including a film coupled to the first side of the base layer, and an outer sheet coupled to the second side of the base layer by an adhesive deposited between the outer sheet and the base layer such that a plurality of voids are formed between the outer sheet and the inner sheet, wherein the blank is configured to be folded into a multi-ply bag such that the film defines the inner cavity of the multi-ply bag.

14 Claims, 39 Drawing Sheets

Related U.S. Application Data

(60) Provisional application No. 63/462,800, filed on Apr. 28, 2023.

(51) Int. Cl.

| | |
|---|---|
| *B65D 30/20* | (2006.01) |
| *B65D 33/08* | (2006.01) |
| *B65D 33/10* | (2006.01) |
| *B65D 65/42* | (2006.01) |
| *C23C 14/20* | (2006.01) |

(52) U.S. Cl.
CPC ............. *B65D 31/10* (2013.01); *B65D 33/08* (2013.01); *B65D 33/105* (2013.01); *B65D 65/42* (2013.01); *B65D 81/3893* (2013.01); *C23C 14/20* (2013.01)

(58) Field of Classification Search
USPC .......................... 383/100, 101, 102, 103, 110
See application file for complete search history.

(56)      References Cited

U.S. PATENT DOCUMENTS

| | | | | |
|---|---|---|---|---|
| 2,505,442 | A | 4/1950 | Manville | |
| 2,551,324 | A | 5/1951 | Frieders et al. | |
| 3,114,493 | A | 12/1963 | Dunkin | |
| 3,362,610 | A | 1/1968 | Van Dyke | |
| 3,647,134 | A * | 3/1972 | Carnevalino | B65D 31/02 |
| | | | | 206/455 |
| 4,331,231 | A | 5/1982 | Boyle | |
| 4,550,441 | A * | 10/1985 | Keppel | B65D 33/01 |
| | | | | 383/103 |
| 4,874,620 | A | 10/1989 | Mendenhall et al. | |
| 4,982,064 | A | 1/1991 | Hartman et al. | |
| 5,492,410 | A | 2/1996 | Cocozza | |
| RE35,875 | E | 8/1998 | Shuert | |
| 5,857,612 | A | 1/1999 | Smith et al. | |
| 6,471,826 | B2 | 10/2002 | Glover et al. | |
| 7,862,688 | B2 | 1/2011 | Thomas | |
| 8,308,900 | B2 | 11/2012 | Covarrubias et al. | |
| D881,011 | S | 4/2020 | Wolf | |
| D919,432 | S | 5/2021 | Muse et al. | |
| 11,261,017 | B2 | 3/2022 | Waltermire et al. | |
| 11,365,025 | B2 | 6/2022 | Birnstihl | |
| 11,958,777 | B2 | 4/2024 | Schabel, Jr. et al. | |
| D1,042,111 | S | 9/2024 | Zhu | |
| 12,091,233 | B2 | 9/2024 | Melchor | |
| 12,304,706 | B2 | 5/2025 | Sollie et al. | |
| D1,083,588 | S | 7/2025 | Ott et al. | |
| 12,441,508 | B2 | 10/2025 | Sollie et al. | |
| 12,448,171 | B2 | 10/2025 | Sollie et al. | |
| D1,106,816 | S | 12/2025 | Ott et al. | |
| 12,497,229 | B2 | 12/2025 | Sollie | |
| 12,497,230 | B2 | 12/2025 | Ott et al. | |
| 2006/0045392 | A1 * | 3/2006 | Bannister | B65D 33/01 |
| | | | | 383/102 |
| 2008/0121681 | A1 | 5/2008 | Wiedmeyer | |
| 2010/0008603 | A1 | 1/2010 | Smith et al. | |
| 2011/0123137 | A1 * | 5/2011 | Smith | B65D 31/08 |
| | | | | 383/125 |
| 2011/0158562 | A1 | 6/2011 | Desilets et al. | |
| 2011/0192852 | A1 * | 8/2011 | Chebli | B65D 5/6664 |
| | | | | 220/592.21 |
| 2011/0240515 | A1 | 10/2011 | Ridgeway | |
| 2012/0305435 | A1 | 12/2012 | Matta et al. | |
| 2017/0327298 | A1 | 11/2017 | Morasse et al. | |
| 2018/0148246 | A1 * | 5/2018 | Fu | B32B 29/02 |
| 2018/0208387 | A1 | 7/2018 | Cantrell et al. | |
| 2018/0290815 | A1 | 10/2018 | Waltermire et al. | |
| 2018/0327172 | A1 | 11/2018 | Waltermire et al. | |
| 2019/0359412 | A1 | 11/2019 | Sollie et al. | |
| 2020/0189256 | A1 * | 6/2020 | Field | B32B 29/007 |
| 2020/0283959 | A1 * | 9/2020 | Flynn | D21H 19/385 |
| 2020/0346841 | A1 | 11/2020 | Sollie et al. | |

| | | | | |
|---|---|---|---|---|
| 2021/0139200 | A1 * | 5/2021 | O'Hara | B65D 81/18 |
| 2022/0185563 | A1 | 6/2022 | Fu et al. | |
| 2023/0365304 | A1 | 11/2023 | Kaminaga et al. | |
| 2024/0317481 | A1 | 9/2024 | Sollie et al. | |
| 2025/0197090 | A1 | 6/2025 | Sollie et al. | |
| 2025/0197091 | A1 | 6/2025 | Sollie et al. | |
| 2025/0197092 | A1 | 6/2025 | Sollie et al. | |
| 2025/0206514 | A1 | 6/2025 | Ott et al. | |
| 2025/0242991 | A1 | 7/2025 | Sollie | |
| 2025/0388360 | A1 | 12/2025 | Sollie et al. | |
| 2026/0015125 | A1 | 1/2026 | Sollie et al. | |
| 2026/0042572 | A1 | 2/2026 | Sollie et al. | |
| 2026/0054912 | A1 | 2/2026 | Ott et al. | |
| 2026/0077939 | A1 | 3/2026 | Sollie | |

FOREIGN PATENT DOCUMENTS

| | | |
|---|---|---|
| GB | 2205083 | 11/1988 |
| JP | 2001213478 | 8/2001 |
| JP | D1713371 | 4/2022 |
| KR | 20210089477 A | 7/2021 |
| KR | 102420062 | 7/2022 |
| KR | 301248487 | 2/2024 |
| WO | 2025165790 | 8/2025 |

OTHER PUBLICATIONS

Sollie, Greg; Applicant-Initiated Interview Summary for U.S. Appl. No. 18/386,187, filed Nov. 1, 2023, mailed May 19, 2025, 2 pgs.

Sollie, Greg; Final Office Action for U.S. Appl. No. 18/386,187, filed Nov. 1, 2023, mailed Jan. 24, 2025, 20 pgs.

Sollie, Greg; Non-Final Office Action for U.S. Appl. No. 18/386,187, filed Nov. 1, 2023, mailed Apr. 16, 2025, 21 pgs.

Sollie, Greg; Non-Final Office Action for U.S. Appl. No. 18/386,187, filed Nov. 1, 2023, mailed Oct. 1, 2024, 31 pgs.

Sollie, Greg; Requirement for Restriction/Election for U.S. Appl. No. 18/386,187, filed Nov. 1, 2023, mailed Aug. 12, 2024, 9 pgs.

Sollie, Greg; Non-Final Office Action for U.S. Appl. No. 19/070,803, filed Mar. 5, 2025, mailed May 22, 2025, 15 pgs.

Sollie, Greg; Notice of Allowance for U.S. Appl. No. 18/425,552, filed Jan. 29, 2024, mailed Aug. 12, 2025, 16 pgs.

Sollie, Greg; Applicant-Initiated Interview Summary for U.S. Appl. No. 18/386,187, filed Nov. 1, 2023, mailed Aug. 1, 2025, 2 pgs.

Sollie, Greg; Non-Final Office Action for U.S. Appl. No. 18/386,187, filed Nov. 1, 2023, mailed Oct. 27, 2025, 29 pgs.

Sollie, Greg; Final Office Action for U.S. Appl. No. 19/070,799, filed Mar. 5, 2025, mailed Oct. 1, 2025, 22 pgs.

Sollie, Greg; Non-Final Office Action for U.S. Appl. No. 19/070,799, filed Mar. 5, 2025, mailed Jun. 5, 2025, 25 pgs.

Sollie, Greg; Final Office Action for U.S. Appl. No. 19/070,803, filed Mar. 5, 2025, mailed Oct. 7, 2025, 24 pgs.

Sollie, Greg; Final Office Action for U.S. Appl. No. 19/070,809, filed Mar. 5, 2025, mailed Oct. 28, 2025, 17 pgs.

Sollie, Greg; Non-Final Office Action for U.S. Appl. No. 19/070,809, filed Mar. 5, 2025, mailed Jul. 2, 2025, 13 pgs.

Sollie, Greg; Final Office Action for U.S. Appl. No. 18/222,272, filed Jul. 14, 2023, mailed Jul. 30, 2025, 83 pgs.

Sollie, Greg; Non-Final Office Action for U.S. Appl. No. 18/222,272, filed Jul. 14, 2023, mailed Nov. 21, 2025, 97 pgs.

Sollie, Greg; Notice of Allowance for U.S. Appl. No. 18/986,285, filed Dec. 18, 2024, mailed Jun. 24, 2025, 16 pgs.

Sollie, Greg; Requirement for Restriction/Election for U.S. Appl. No. 19/362,134, filed Oct. 17, 2025, mailed Nov. 13, 2025, 6 pgs.

Sollie, Greg; Requirement for Restriction/Election for U.S. Appl. No. 19/181,118, filed Apr. 16, 2025, mailed Nov. 26, 2025, 5 pgs.

Sollie, Greg; Notice of Allowance for U.S. Appl. No. 18/222,298, filed Jul. 14, 2023, mailed Jun. 11, 2025, 5 pgs.

Ott, Paul; Notice of Allowance for U.S. Appl. No. 19/079,307, filed Mar. 13, 2025, mailed Jul. 29, 2025, 9 pgs.

Sollie, Greg; Examination Report for Australian Application No. 2024203860, filed Jun. 6, 2024, mailed May 30, 2025, 10 pgs.

Sollie, Greg; Examination Report No.2 for Australian Application No. 2024203860, filed Jun. 6, 2024, mailed Sep. 12, 2025, 5 pgs.

(56) References Cited

OTHER PUBLICATIONS

Sollie, Greg; Examination Report for New Zealand Application No. 811776, filed Jun. 6, 2024, mailed Nov. 10, 2025, 3 pgs.

Sollie, Greg; Examination Report for Australian Patent Application No. 2024203861, filed Jun. 6, 2024, mailed May 30, 2025, 10 pgs.

Sollie, Greg; Examination Report for New Zealand Patent Application No. 811747, filed Jun. 6, 2024, mailed Nov. 10, 2025, 3 pgs.

Sollie, Greg; Examination Report for Australian Patent Application No. 2024203862, filed Jun. 6, 2024, mailed May 30, 2025, 11 pgs.

Sollie, Greg; Examination Report for New Zealand Patent Application No. 811748, filed Jun. 6, 2024, mailed Nov. 10, 2025, 4 pgs.

Sollie, Greg; Examination Report for Australian Patent Application No. 2024203863, filed Jun. 6, 2024, mailed May 30, 2025, 10 pgs.

Sollie, Greg; Examination Report for New Zealand Patent Application No. 811749, filed Jun. 6, 2024, mailed Nov. 10, 2025, 3 pgs.

Olympia-Tile—4' × 4'—Vulcanized Rubber Gym Tile. Date first available: Oct. 23, 2021. Site visited: Jul. 21, 2025. Available online:, https://amarcoproducts.com/products/sport-weight-room-flooring/rubber-gym-tile/ot-48-vulcanized-rubber-gym-tile (Year: 2021).

Ott, Paul; Corrected Notice of Allowance for Design U.S. Appl. No. 30/010,324, filed Jun. 26, 2025, mailed Oct. 20, 2025, 12 pgs.

Ott, Paul; Notice of Allowance for Design U.S. Appl. No. 30/010,324, filed Jun. 26, 2025, mailed Aug. 5, 2025, 10 pgs.

Pratt Retail Specialties 22 in. × 43 ft. Rafter Corrugated Attic Baffle. Date first available: Jan. 23, 2025. Site visited: Jul. 21, 2025. Available online:, https://www.homedepot.com/p/Pratt-Retail-Special ties-22-in-x-43-ft-Rafter-Corrugated-Attic-Baffle-Pack-of-50-22x43AB50P/333011583 (Year: 2025).

Sollie, Greg; Examination Report for Australian Patent Application No. 2024203863, filed Jun. 6, 2024, mailed Feb. 26, 2026, 4 pgs.

Sollie, Greg; Non-Final Office Action for U.S. Appl. No. 19/394,993, filed Nov. 20, 2025, mailed Feb. 23, 2026, 12 pgs.

Sollie, Greg; Non-Final Office Action for U.S. Appl. No. 19/181,118, filed Apr. 16, 2025, mailed Jan. 20, 2026, 19 pgs.

Sollie, Greg; Examination Report for Australian Patent Application No. 2024203862, filed Jun. 6, 2024, mailed Jan. 20, 2026, 4 pgs.

Sollie, Greg; Non-Final Office Action for U.S. Appl. No. 19/362,134, filed Oct. 17, 2025, mailed Feb. 5, 2026, 16 pgs.

Ott, Paul; Non-Final Office Action for U.S. Appl. No. 19/375,093, filed Oct. 30, 2025, mailed Feb. 19, 2026, 15 pgs.

Sollie, Greg; Applicant-Initiated Interview Summary for U.S. Appl. No. 19/070,809, filed Mar. 5, 2025, Jan. 30, 2026, 3 pgs.

Ott, Paul; Ex Parte Quayle Action for Design U.S. Appl. No. 30/034,229, filed Nov. 24, 2025, mailed Jan. 29, 2026, 7 pgs.

Dish Pack Partition Kit S-4751—Uline. Date first available: Nov. 28, 2009. Site visited: Dec. 17, 2025. Available online: https://www.uline.com/ProducUDetail/S-4751/Moving-Boxes/Dish-Pack-Partition-Kit (Year: 2009).

Sollie, Greg; Non-Final Office Action for U.S. Appl. No. 19/070,809, filed Mar. 5, 2025, mailed Feb. 25, 2026, 15 pgs.

Sollie, Greg; Examination Report for Australian Patent Application No. 2024203863, filed Jun. 6, 2024, mailed Apr. 21, 2026, 4 pgs.

Sollie, Greg; Examination Report for Australian Patent Application No. 2024203862, filed Jun. 6, 2024, mailed Apr. 21, 2026, 4 pgs.

Sollie, Greg; Non-Final Office Action for U.S. Appl. No. 19/070,799, filed Mar. 5, 2025, mailed Apr. 9, 2026, 28 pgs.

Sollie, Greg; Notice of Allowance for U.S. Appl. No. 18/222,272, filed Jul. 14, 2023, mailed Apr. 7, 2026, 61 pgs.

Sollie, Greg; Examination Report for Australian Patent Application No. 2024203861, filed Jun. 6, 2024, mailed Mar. 12, 2026, 6 pgs.

Sollie, Greg; Examination Report for New Zealand Patent Application No. 811747, filed Jun. 6, 2024, mailed Feb. 19, 2026, 4 pgs.

Sollie, Greg; Examination Report for New Zealand Patent Application No. 811748, filed Jun. 6, 2024, mailed Feb. 23, 2026, 6 pgs.

Sollie, Greg; Final Office Action for U.S. Appl. No. 18/386,187, filed Nov. 1, 2023, mailed Mar. 10, 2026, 27 pgs.

* cited by examiner

100

164

172

100

- - - Milk   —— Yogurt   ··· Sausage   —— Cheese   ···· Chicken   ······Chamber   —— Failing Limit (63F)

3500

3600

FILM DEPOSITION DELIVERY CONTAINER

CROSS-REFERENCE TO RELATED APPLICATIONS

This application is a continuation of U.S. Patent Application bearing application Ser. No. 18/386,187, filed Nov. 1, 2023, which claimed the benefit of U.S. Provisional Application No. 63/462,800, filed Apr. 28, 2023, both of which are hereby specifically incorporated by reference herein in their entirety.

TECHNICAL FIELD

This disclosure relates to packaging. Specifically, this disclosure relates to packaging for food items.

BACKGROUND

The packaging of food often involves thermal management considerations. For example, packaging solutions for refrigerated or frozen foods may be designed to prevent the contents from warming, such as during transport or delivery. Likewise, packaging solutions for hot foods may be designed to prevent the contents from cooling. Many existing solutions utilize bulky insulators that produce large volumes of non-biodegradable and non-recyclable waste.

SUMMARY

It is to be understood that this summary is not an extensive overview of the disclosure. This summary is exemplary and not restrictive, and it is intended to neither identify key or critical elements of the disclosure nor delineate the scope thereof. The sole purpose of this summary is to explain and exemplify certain concepts of the disclosure as an introduction to the following complete and extensive detailed description.

Disclosed is a repulpable multiple-ply container adapted for thermal management of a payload, the container including: a film layer defining an interior of the container configured to accept the payload therewithin, the film layer further configured to offer low emissivity and high reflectivity to radiant heat; a first paper layer coextensive with and continuously coupled to the film layer, the film layer and the first paper layer together providing an efficient combined R-value for thermal management within the interior of the container; an adhesive layer providing intermittent bonding points; and a second paper layer coextensive with the first paper layer, intermittently bonded to the first paper layer opposite the film layer via the adhesive layer bonding points, wherein a plurality of air-filled gaps are created by the first paper layer, the second paper layer, and the adhesive layer bonding points further insulating the interior of the container while maintaining the repulpability of the container.

Also disclosed is a container adapted for thermal management of a payload, the container including: a blank assembly including a first sheet assembly, the first sheet assembly including a base layer and a metallized film applied to the base layer, the metallized film including a reflective layer and a protective layer; a second sheet adhered to the base layer, the second sheet adhered to the base layer by an adhesive arranged at intermittent bonding points such that a plurality of voids are defined by the inner sheet assembly, the outer sheet assembly, and the adhesive, at least one of the plurality of voids being vented; wherein the blank assembly is defined from a plurality of wall panels, each wall panel being one of a main panel and a side panel; wherein the blank assembly is formed into the container by arranging the wall panels in end-to-end relationship to define a side wall of the container and by arranging a portion of the blank assembly as the bottom of the container such that the second sheet defines an outer surface of the container, wherein the metallized film is arranged to define an interior surface of the container, the interior surface defining a cavity configured to accept the payload therewithin, the metallized film further configured to offer low emissivity and high reflectivity to radiant heat; wherein the metallized film includes a polymer; wherein each of the base layer and the second sheet are of paper; wherein each of the base layer, the second sheet, and the metallized film are repulpable.

Also disclosed is a blank for forming a multi-ply bag having an inner cavity, the blank including: an inner sheet, the inner sheet including a base layer having a first side and a second side opposite the first side, the inner sheet including a film coextensive with and coupled to the first side of the base layer; and an outer sheet coextensive with and coupled to the second side of the base layer by an adhesive deposited between the outer sheet and the base layer such that a plurality of voids are formed between the outer sheet and the inner sheet, wherein the blank is configured to be folded into the multi-ply bag such that the film defines the inner cavity of the multi-ply bag.

Various implementations described in the present disclosure may include additional systems, methods, features, and advantages, which may not necessarily be expressly disclosed herein but will be apparent to one of ordinary skill in the art upon examination of the following detailed description and accompanying drawings. It is intended that all such systems, methods, features, and advantages be included within the present disclosure and protected by the accompanying claims. The features and advantages of such implementations may be realized and obtained by means of the systems, methods, features particularly pointed out in the appended claims. These and other features will become more fully apparent from the following description and appended claims, or may be learned by the practice of such exemplary implementations as set forth hereinafter.

BRIEF DESCRIPTION OF THE DRAWINGS

The features and components of the following figures are illustrated to emphasize the general principles of the present disclosure. The drawings are not necessarily drawn to scale. Corresponding features and components throughout the figures may be designated by matching reference characters for the sake of consistency and clarity.

DETAILED DESCRIPTION

Figure 1:
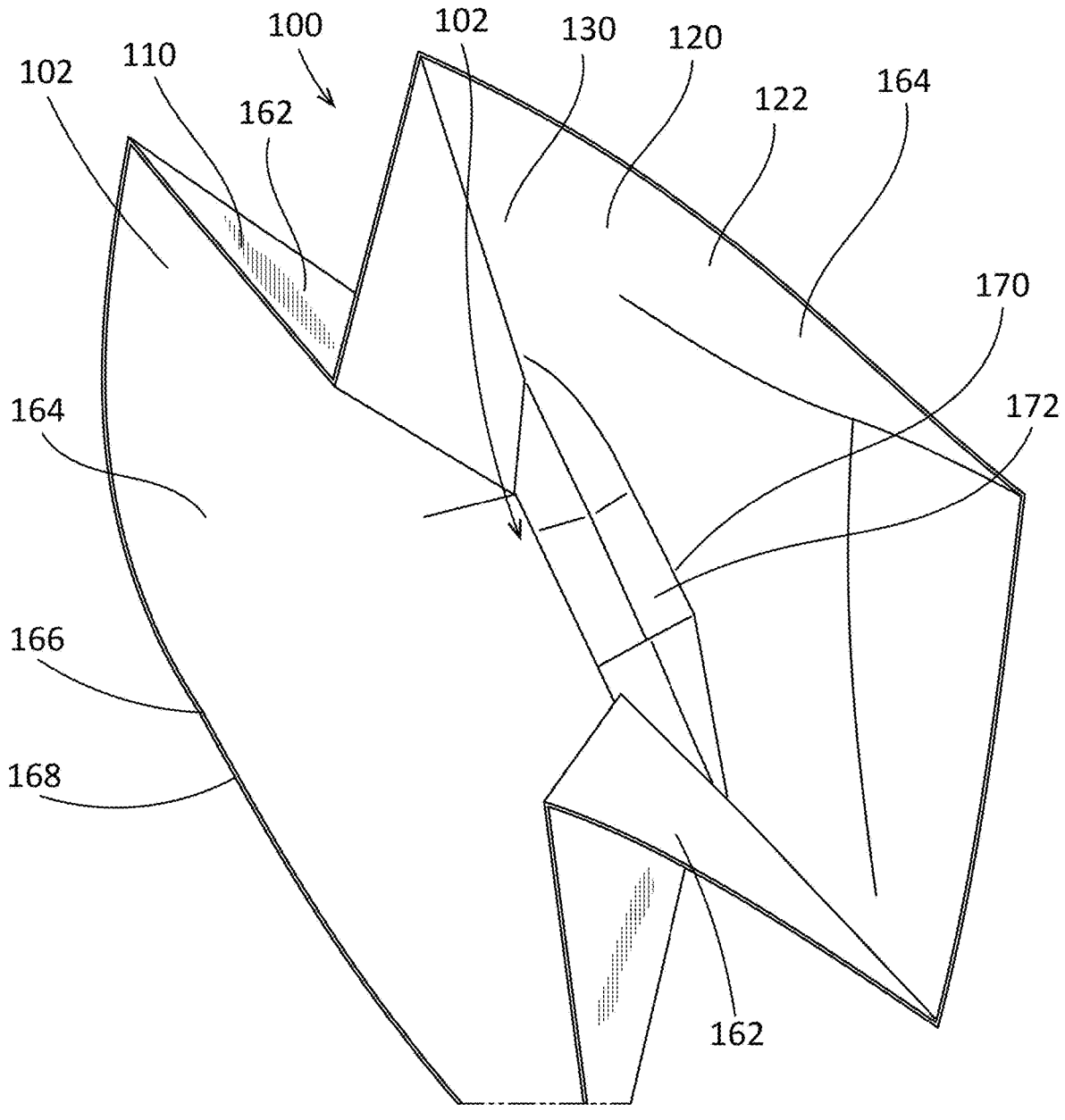
FIG. 1 is a perspective top view of a container comprising a base layer and a film with the container in an open configuration, wherein the container is a bag, in accordance with one aspect of the present disclosure.

The present disclosure can be understood more readily by reference to the following detailed description, examples, drawings, and claims, and the previous and following description. However, before the present devices, systems, and/or methods are disclosed and described, it is to be understood that this disclosure is not limited to the specific devices, systems, and/or methods disclosed unless otherwise specified, and, as such, can, of course, vary. It is also to be understood that the terminology used herein is for the purpose of describing particular aspects only and is not intended to be limiting.

The following description is provided as an enabling teaching of the present devices, systems, and/or methods in its best, currently known aspect. To this end, those skilled in the relevant art will recognize and appreciate that many changes can be made to the various aspects of the present devices, systems, and/or methods described herein, while still obtaining the beneficial results of the present disclosure. It will also be apparent that some of the desired benefits of the present disclosure can be obtained by selecting some of the features of the present disclosure without utilizing other features. Accordingly, those who work in the art will recognize that many modifications and adaptations to the present disclosure are possible and can even be desirable in certain circumstances and are a part of the present disclosure. Thus, the following description is provided as illustrative of the principles of the present disclosure and not in limitation thereof.

As used throughout, the singular forms "a," "an" and "the" include plural referents unless the context clearly dictates otherwise. Thus, for example, reference to "an element" can include two or more such elements unless the context indicates otherwise.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

For purposes of the current disclosure, a material property or dimension measuring about X or substantially X on a particular measurement scale measures within a range between X plus an industry-standard upper tolerance for the specified measurement and X minus an industry-standard lower tolerance for the specified measurement. Because tolerances can vary between different materials, processes and between different models, the tolerance for a particular measurement of a particular component can fall within a range of tolerances.

As used herein, the terms "optional" or "optionally" mean that the subsequently described event or circumstance can or cannot occur, and that the description includes instances where said event or circumstance occurs and instances where it does not.

The word "or" as used herein means any one member of a particular list and also includes any combination of members of that list. Further, one should note that conditional language, such as, among others, "can," "could," "might," or "may," unless specifically stated otherwise, or otherwise understood within the context as used, is generally intended to convey that certain aspects include, while other aspects do not include, certain features, elements and/or steps. Thus, such conditional language is not generally intended to imply that features, elements and/or steps are in any way required for one or more particular aspects or that one or more particular aspects necessarily include logic for deciding, with or without user input or prompting, whether these features, elements and/or steps are included or are to be performed in any particular aspect.

Disclosed are components that can be used to perform the disclosed methods and systems. These and other components are disclosed herein, and it is understood that when combinations, subsets, interactions, groups, etc. of these components are disclosed, that while specific reference of each various individual and collective combinations and permutations of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific aspect or combination of aspects of the disclosed methods.

Disclosed is a container and associated methods, systems, devices, and various apparatus. The container can comprise a base layer and a film directly or indirectly coupled to the base layer. It would be understood by one of skill in the art that the disclosed container is described in but a few exemplary aspects among many. No particular terminology or description should be considered limiting on the disclosure or the scope of any claims issuing therefrom.

FIG. 1 is a perspective top view of a container 100 comprising a base layer 110 and a film 120. The base layer 110 and the film 120 can be coupled together, and in the present aspect, a blank 130 can comprise the base layer 110 and the film 120. In the present aspect, the container 100 can be a bag 102, such as a grocery bag for example and without limitations. In some aspects, the container 100 can be a different type of container, such as a box for example and without limitations. A packaging material having a paper layer and a film layer is disclosed in U.S. Pat. No. 11,072, 148, which is hereby specifically incorporated by reference herein in its entirety.

The container 100 can define a pair of opposing side panels 162, and a pair of opposing main panels 164. Each side panel 162 of the pair of opposing side panels 162 can be attached to each main panel 164 of the pair of opposing main panels 164. The pair of opposing side panels 162 and the pair of opposing main panels 164 can define a top end 166 and a bottom end 170 of the container 100. The container 100 can further comprise a bottom panel 172 that can attach to each of the pair of opposing side panels 162 and each of the pair of opposing main panels 164 to enclose the bottom end 170.

The pair of opposing side panels 162, the pair of opposing main panels 164, and the bottom panel 172 can together define a cavity 101 within the container 100. In the present aspect, the film 120 can be positioned facing the cavity 101, and the film 120 can define the cavity 101. More specifically, a film surface 122 defined by the film 120 can define the cavity 101. In some aspects, the film 120 and the film surface 122 can face outwards, and the base layer 110 can define the cavity 101. In some aspects, the blank 130 can comprise two of the films 120 coupled to opposite sides of the base layer 110.

The top end 166 can define an opening 168 to the cavity 101. In the present aspect, the container 100 can be in an open configuration wherein the opening 168 to the cavity 101 can be uncovered, thereby exposing the cavity 101. In the open configuration, the bottom panel 172 can be substantially perpendicular to each of the pair of opposing main panels 164 and the pair of opposing side panels 162.

In some aspects, the film 120 can be deposited directly upon the base layer 110. In such aspects, the film 120 can be bonded to the base layer 110. In some aspects, the film 120 can be deposited on an intermediary layer 515 (shown in FIG. 5), which can then be attached to the base layer 110 to couple the film 120 to the base layer 110. In the present aspect, the base layer 110 can comprise a paper material, such as Kraft paper for example and without limitation. In some aspects, the base layer 110 can comprise a different material, such as corrugated cardboard, posterboard, or any other suitable material.

The film 120 can be a functional film that can bond to the base layer 110. In some aspects, the film 120 can be a functional organic layer. A composition of the film 120 can vary. For example, in some aspects, the film 120 can comprise one or more metals, metallic elements, metal alloys, polymers, salts, silicon, or other suitable materials, mixtures, elements, compounds, or combinations thereof. In the present aspect, the film 120 can be a metallic film, such as one comprising aluminum or any other suitable metallic material.

A morphology of the film 120 can vary. A texture and an appearance of the film 120 can be affected, at least in part, by the morphology. For example, in some aspects, the film surface 122 defined by the film 120 can conform to a roughness, or topography, of the underlying base layer 110. In some aspects, the film surface 122 can be substantially planar and level, regardless of the roughness or topography of the underlying base layer 110. In some aspects, the film surface 122 can define a micro-texture of controlled roughness, such as to provide a light-diffusing or hydrophobic effect. The morphology of the film 120 can range in thickness from a few nanometers to a few hundred nanometers. The film 120 can provide various textures and appearances, such as a mirror-like finish, a matte finish, a patterned finish such as an intentional ornamental design, a logo, or any other haptic, tactile, or visual texture or appearance. For example and without limitations, in aspects wherein the film 120 is positioned on the base layer 110 facing outwards and away from the cavity 101, the film 120 and the film surface 122 can have a matte finish.

In some aspects, the film 120 can range in thickness from 225 nm to 675 nm. In preferred aspects, the film 120 can range in thickness from 315 nm to 585 nm. In more preferred aspects, the film 120 can range in thickness from 360 nm to 540 nm. In most preferred aspects, the film 120 can range in thickness from 405 nm to 495 nm. In the present aspect, the thickness of the film 120 can be approximately 450 nm.

In the present aspect, the film 120 and film surface 122 can be configured to offer low emissivity and high reflectivity to radiant heat, such as energy in the infrared (IR) spectrum. In some aspects, the film 120 can define an emissivity value less than or equal to 0.20 (reflectivity value of 80%). In preferred aspects, the film 120 can define an emissivity value less than or equal to 0.10 (reflectivity value of 90%). In more preferred aspects, the film 120 can define an emissivity value less than or equal to 0.05 (reflectivity value of 95%). In most preferred aspects, the film 120 can define an emissivity value less than or equal to 0.03 (reflectivity value of 97%). The film 120 and the base layer 110 can together provide an efficient combined R-value for thermal management within the cavity 101. For example, in some aspects, the film 120 and the base layer 110 can provide an R-value of 0.5. In other aspects, the R-value can be larger or smaller than 0.5.

Figure 2:
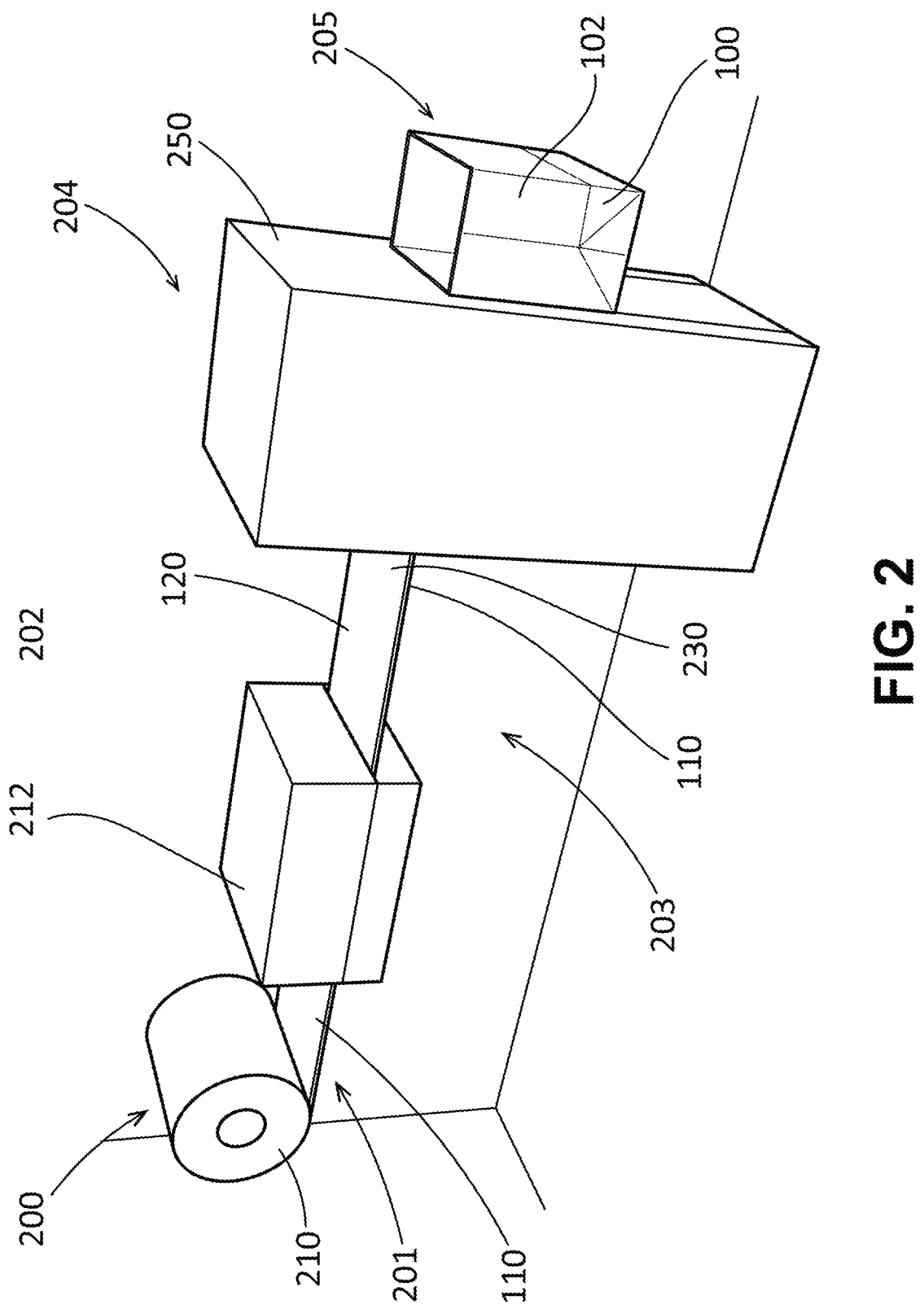
FIG. 2 is a method view demonstrating the process of forming the container of FIG. 1 in accordance with another aspect of the present disclosure.

FIG. 2 is a method view demonstrating the process 200 of forming the container 100 of FIG. 1. In the present aspect, the process 200 can comprise five steps 201,202,203,204, 205. In step 201, the base layer 110 can be fed into a vapor deposition module 212. In the present aspect, the base layer 110 can be Kraft paper, and the base layer 110 can be fed off of a roll 210, or spool, and into the vapor deposition module 212. In other aspects, the base layer 110 can be a different type of material, such as a polymer film or polymer sheet material or any other suitable film, woven material, nonwoven material, or fiber-based material.

In step 202, the film 120 can be applied and bonded to the base layer 110 within the vapor deposition module 212. Step 202 can comprise a high-rate physical vapor deposition process for producing the film 120 from nanoparticles and bonding it to the base layer 110. It can comprise multiple inline steps, including vaporization, condensation, and polymerization of liquid monomers, oligomers, and other compatible materials, for example and without limitation. The product of step 201 can be radiant metallized paper stock 230, from which blanks can be produced, such as the blank 130 of FIG. 1.

Figure 5:
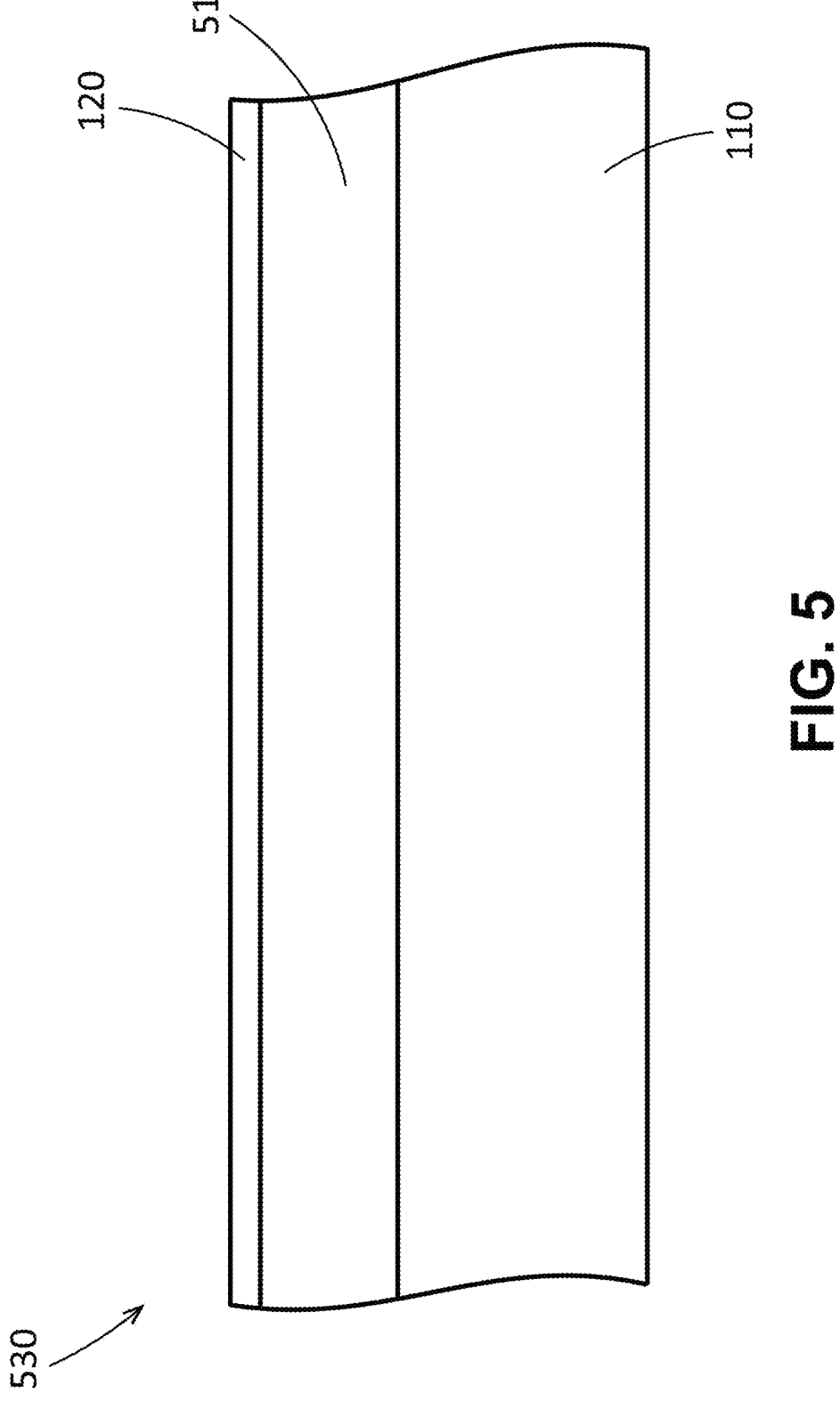
FIG. 5 is a side cross-sectional view of a blank comprising the base layer, the film, and an intermediary layer in accordance with another aspect of the present disclosure.

In other aspects, the film 120 can be deposited on an intermediate layer, such as intermediary layer 515 (shown in FIG. 5). The intermediary layer 515 can be bonded to the base layer 110 to couple the film 120 to the base layer 110. In some aspects, the film 120 can first be deposited to the intermediary layer 515, and the intermediary layer 515 can then be bonded to the base layer 110. In other aspects, the intermediary layer 515 can be bonded to the base layer 110, and the film 120 can then be deposited upon the intermediary layer 515. In some aspects, the intermediary layer 515 can be positioned between the base layer 110 and the film 120. The intermediary layer 515 can comprise a polyester film, a starch-based film, such as a plant-based starch film, or any other suitable material. In aspects involving the starch film, a vacuum process can be utilized in forming the radiant metallized paper stock 230. The starch film can enhance the repulping of the material.

In the present aspect, the radiant metallized paper stock 230 can be compatible with flow-through paper re-pulping processes commonly used in paper recycling. For example, the radiant metallized paper stock 230 can breakdown under normal pulping properties, such as at a specified water temperature, mechanical agitation, and time duration. For example and without limitation, repulping can occur in a target pH range of approximately 7.0-7.1, which is slightly basic to prevent calcification, though the pH can oscillate sufficiently from the target range to be basic or acidic to achieve full oxidation. The repulping residence time (the time the material spends in the pulper) can be approximately 20 minutes, although the residence time can be highly variable and may be longer or shorter than 20 minutes. Repulping can occur with a target temperature range of approximately 100-115 degrees Fahrenheit ("F"); however, the temperature can rise to 130 degrees F. or higher as the process continues due to sanitization, which can aid in the breakdown of the material because heat can increase the rate of chemical reaction. Repulping can occur in the presence of anionic dye(s) that can neutralize any harmful ink chemicals, polymer(s) configured to bind the fibers, biocide(s) (both acidic and basic) to treat the paper and kill off any biologic parasites or microbes in the paper, and/or starch, such as starch use for a binder. The repulping process can create mechanical shear forces that can strip off outer oxidized layers of the film 120, such as an aluminum film for example and without limitation, to expose unoxidized layers of the film 120 that can in turn be oxidized by the process once exposed. By repeating this process, the film 120 can be fully oxidized and dissolved.

Under these conditions, the nanoparticles comprising the film 120 can fragment, oxidize, and filter through the re-pulping process in a positive manner, without causing any problems related to the metallic content in food packaging.

Figure 3:
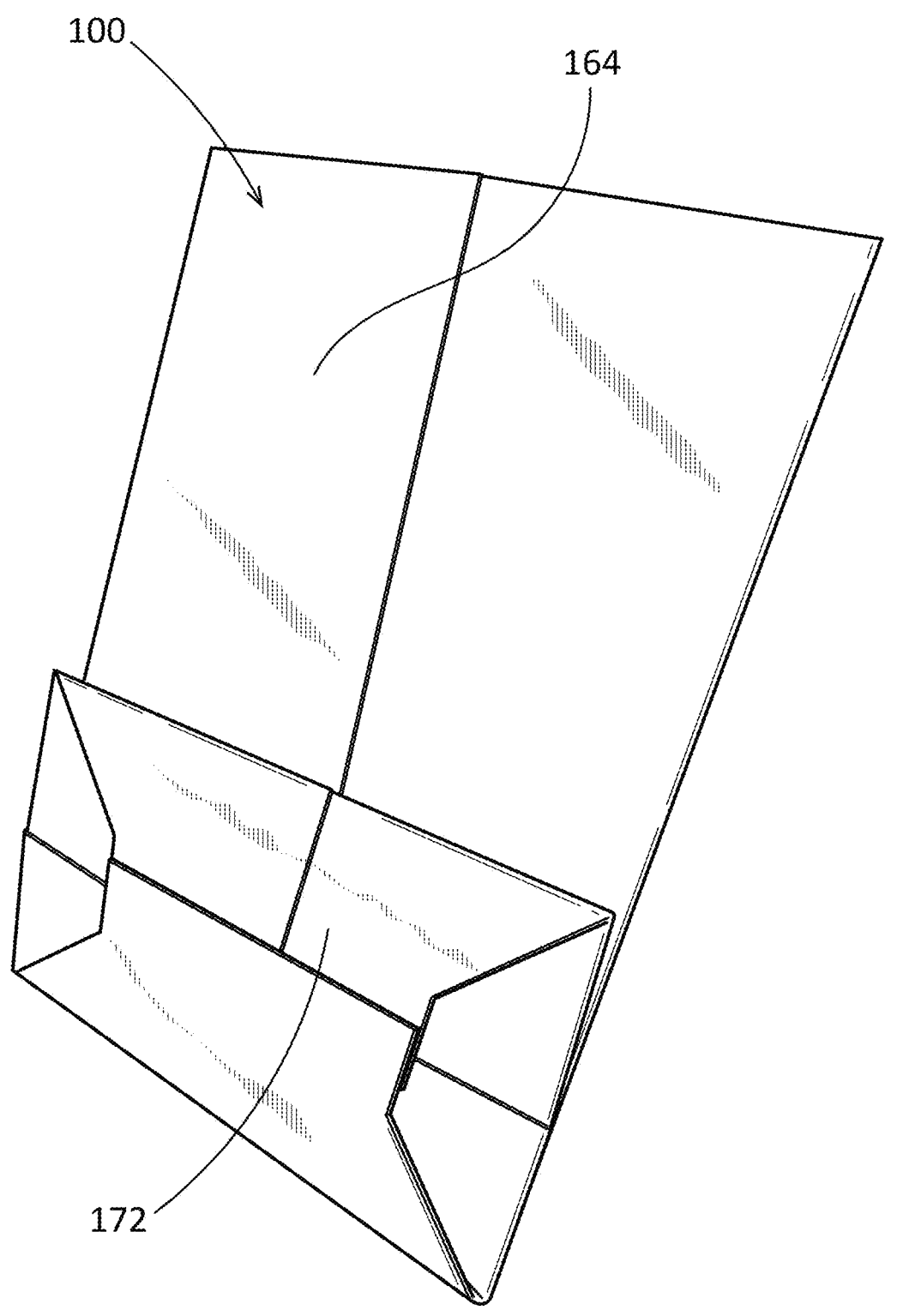
FIG. 3 is a perspective view of the container of FIG. 1 in a collapsed configuration.

In step 203, the radiant metallized paper stock 230 can be fed into a bag machine 250, wherein the radiant metallized paper stock 230 can be cut and formed into the container 100, such as bag 102, within the bag machine 250 during step 204. In step 205, the finished container 100 can be turned out from the bag machine 250. The containers 100 can be turned out in an expanded form, as shown in FIG. 2, or in a collapsed form, as shown in FIG. 3.

In the collapsed form, the pair of opposing main panels 164 can be positioned substantially adjacent to one another while the pair of opposing side panels 162 (shown in FIG. 1) can be folded inward towards the cavity 101 (shown in FIG. 1) lengthwise substantially in half, such that the pair of opposing side panels 162 can be disposed between the pair of opposing main panels 164. In some aspects, the pair of opposing main panels 164 can be positioned at least partially in facing engagement with one another in the collapsed form. The bottom panel 172 can be folded to lie adjacent to one of the main panels 164 of the pair of opposing main panels 164, and the pair of opposing main panels 164 and bottom panel 172 can be positioned in a substantially parallel orientation together in the collapsed configuration.

Figure 4:
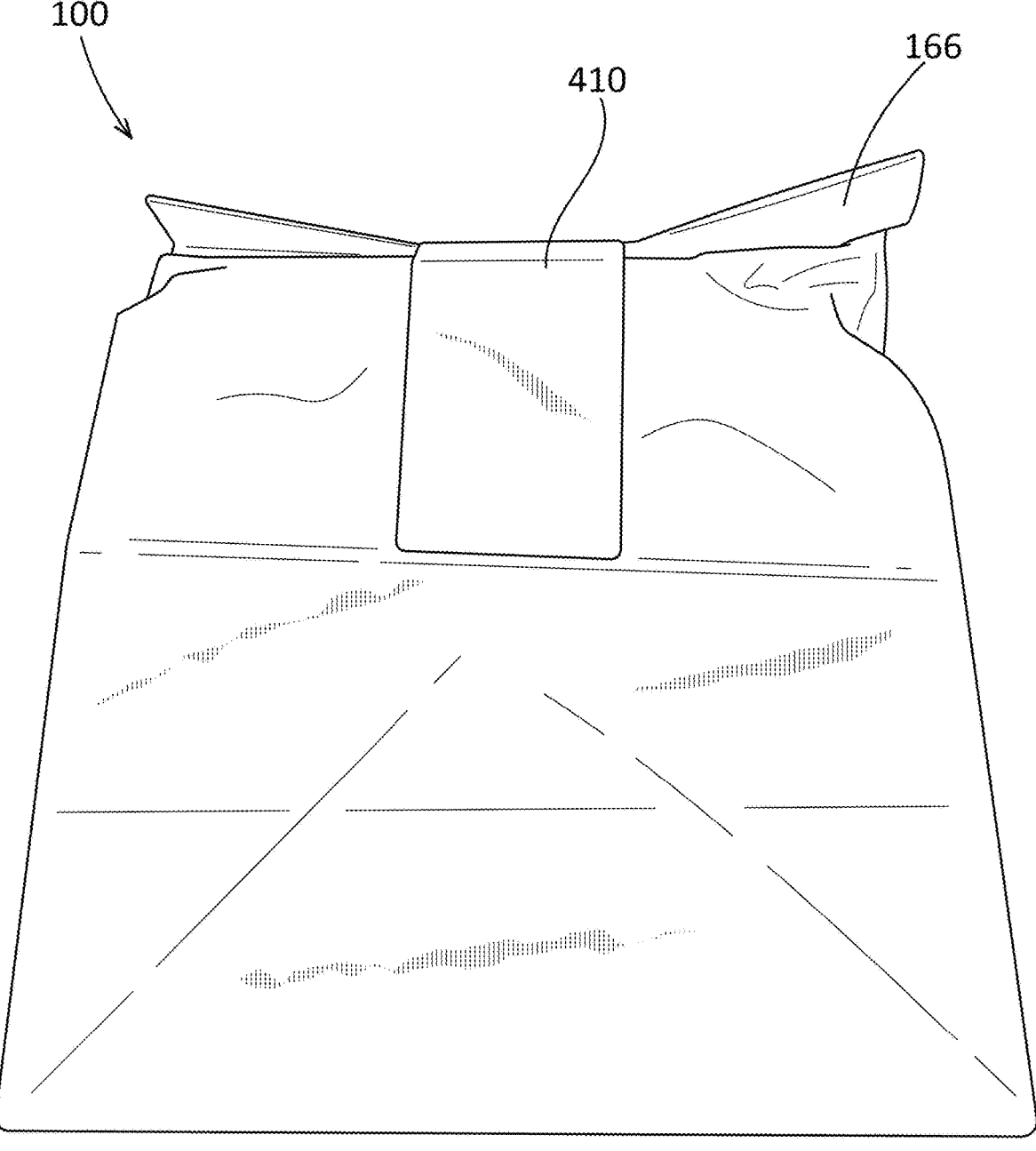
FIG. 4 is a front perspective view of the container of FIG. 1 in a closed configuration.

FIG. 4 is a front perspective view of the container 100 in a closed configuration. In the closed configuration, the opening 168 (shown in FIG. 1) to the cavity 101 (shown in FIG. 1) can be sealed off, thereby enclosing the cavity 101. For example, in the present aspect, the top end 166 of the container 100 can be rolled and sealed with a tape strip 410 to seal the container 100 in the closed configuration. In the closed configuration, contents, such as groceries for example and without limitation, can be maintained in a thermally controlled state within the enclosed cavity 101.

This container 100 can easily pass standard thermal testing for grocery delivery and can exceed requirements depending on temperature profile, coolant configuration, and payload. The container 100 can keep contents cool for adequate duration to provide a window to complete a multiple-customer delivery cycle, such as when groceries are delivered to the customer's door, while storing fresh foods at safe temperatures.

Figure 6:
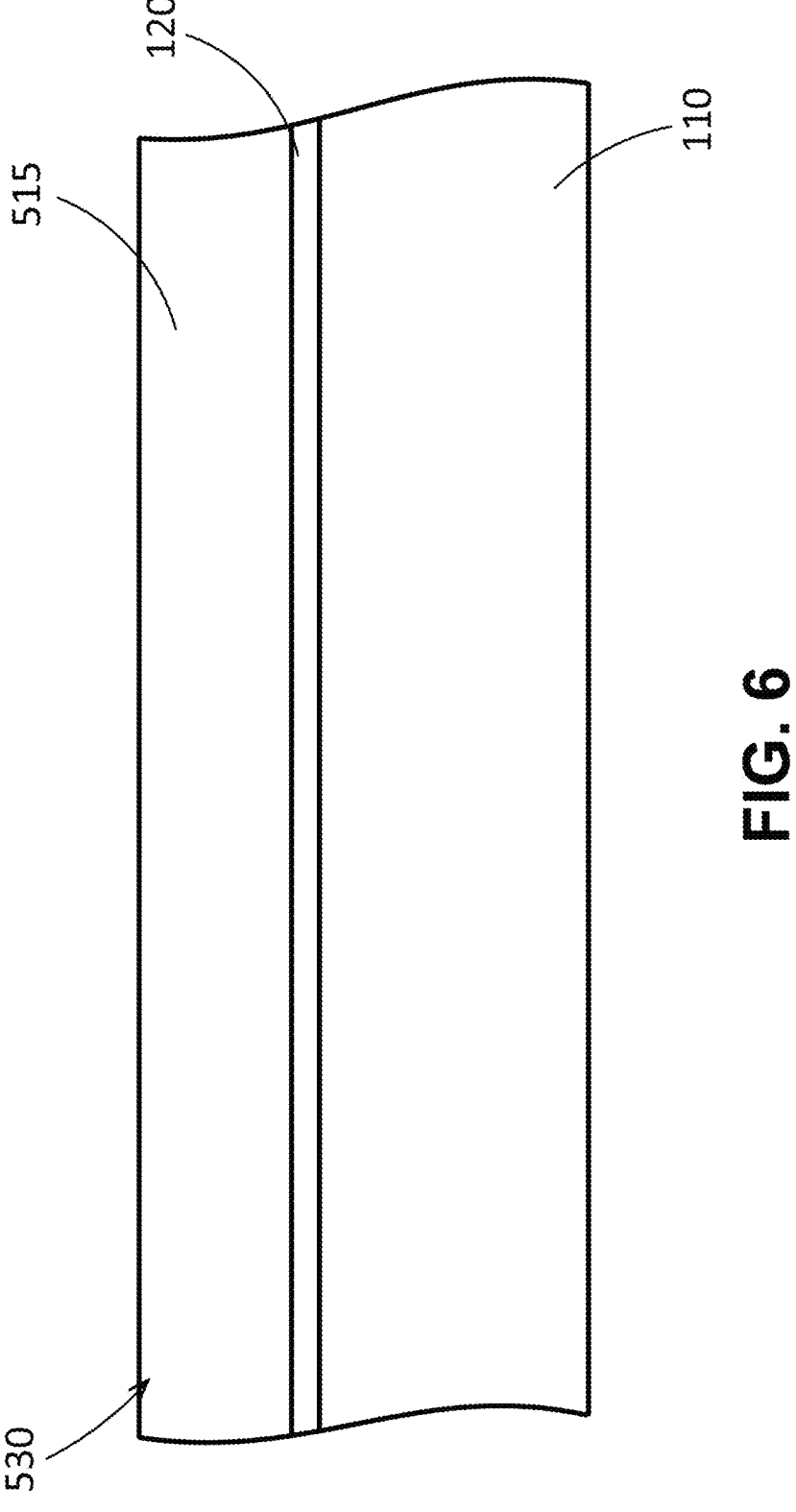
FIG. 6 is a side cross-sectional view of the blank of FIG. 5 wherein the film is positioned between the intermediary layer and the base layer.

FIG. 5 is a side cross-section of another aspect of a blank 530 comprising the base layer 110, the film 120, and the intermediary layer 515 in accordance with another aspect of the present disclosure. The relative thicknesses of the base layer 110, the film 120, and the intermediary layer 515 are not intended to be limiting. As shown, the film 120 can be deposited upon the intermediary layer 515, and the intermediary layer 515 can be attached to the base layer 110 to couple the film 120 to the base layer 110. As shown in FIG. 6, in some aspects of the blank 530, the film 120 can be positioned between the intermediary layer 515 and the base layer 110, and the intermediary layer 515 can laminate the film 120 to the base layer 110. In such aspects, the intermediary layer 515 can protect the film 120, such as from oxidation or mechanical abrasion for example and without limitation, that might degrade the emissivity of the film 120.

Figure 7:
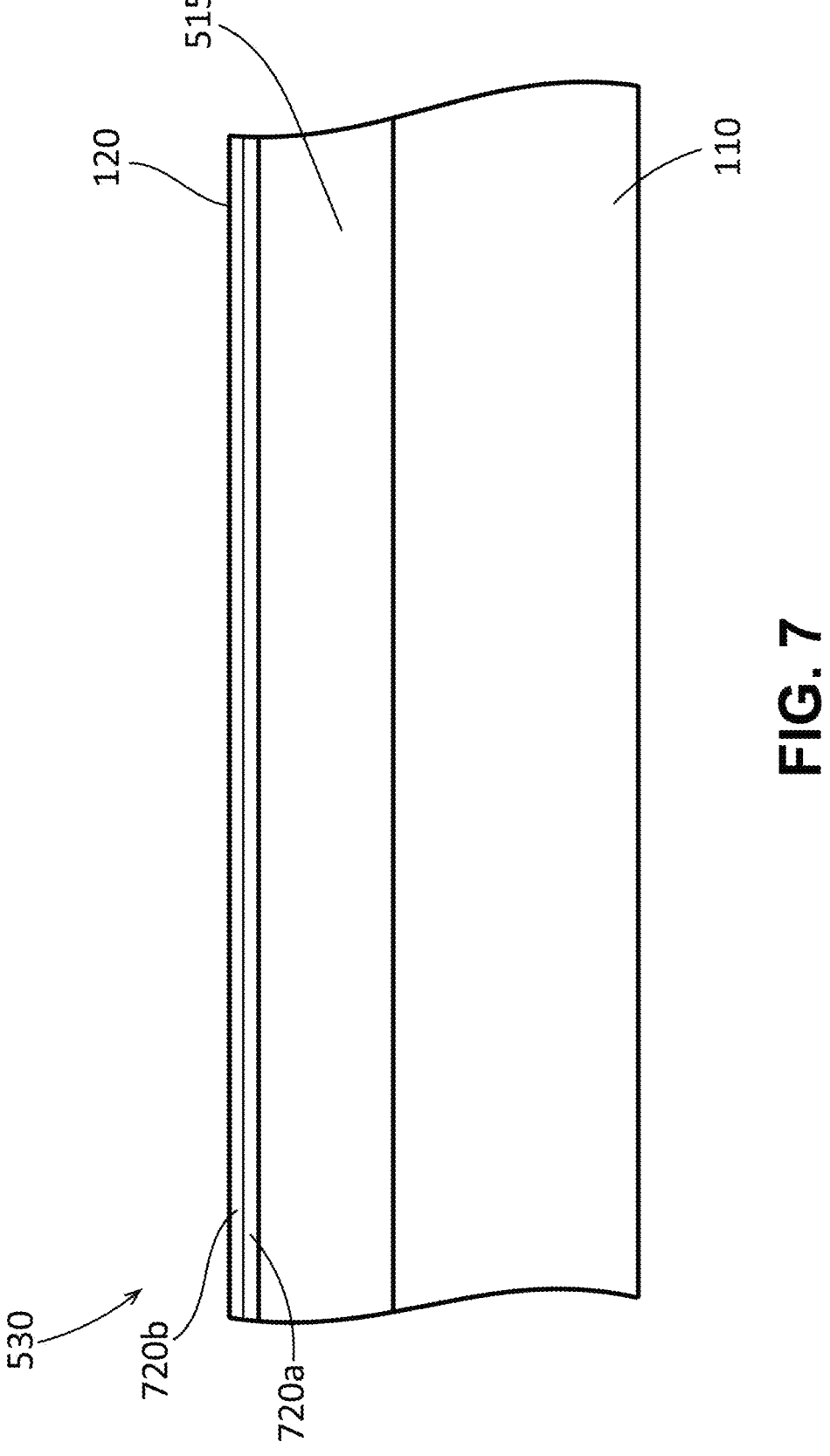
FIG. 7 is a side cross-sectional view of the blank of FIG. 5 wherein the film comprises multiple layers.
Figure 8:
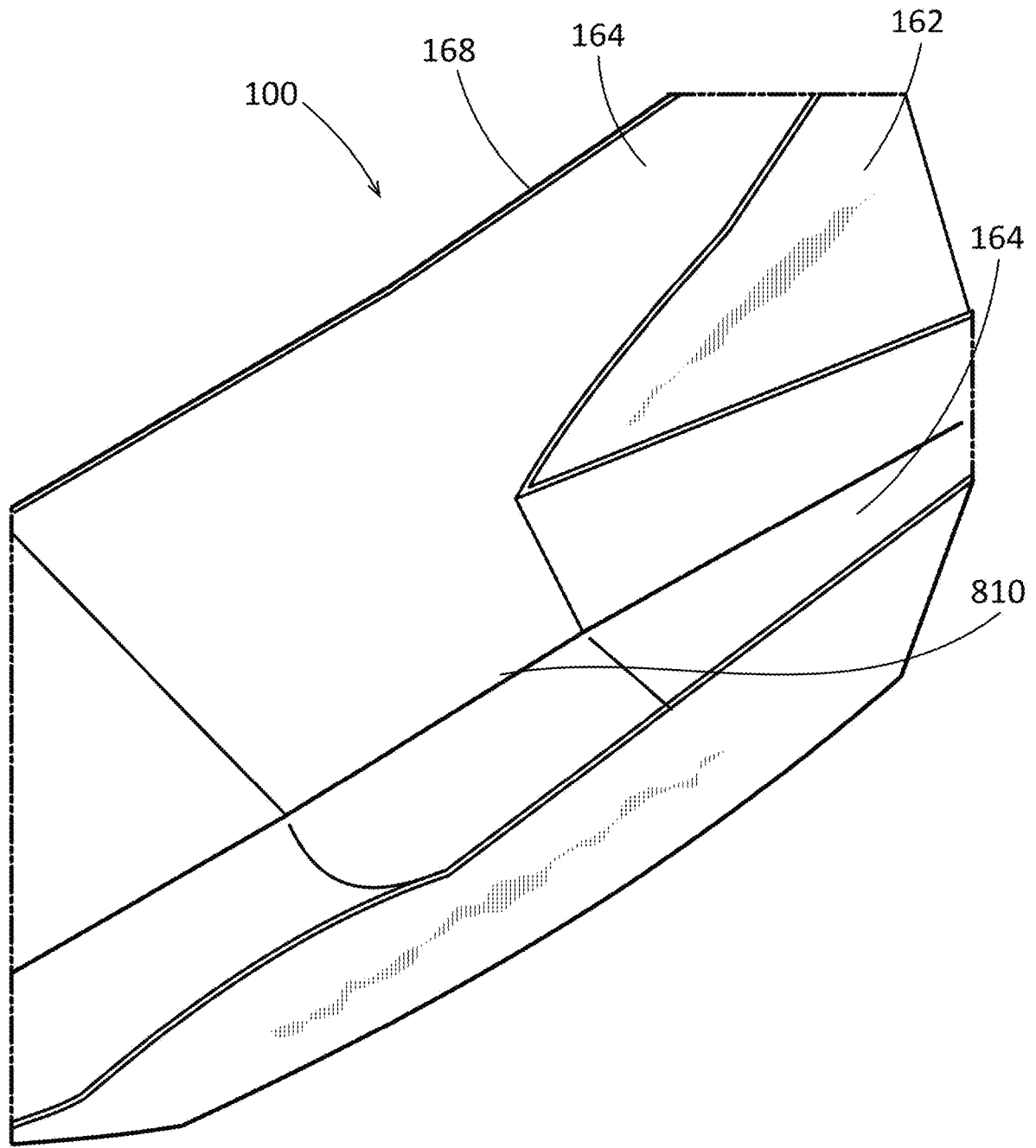
FIG. 8 is a perspective top view of an opening of the container of FIG. 1.
Figure 9:
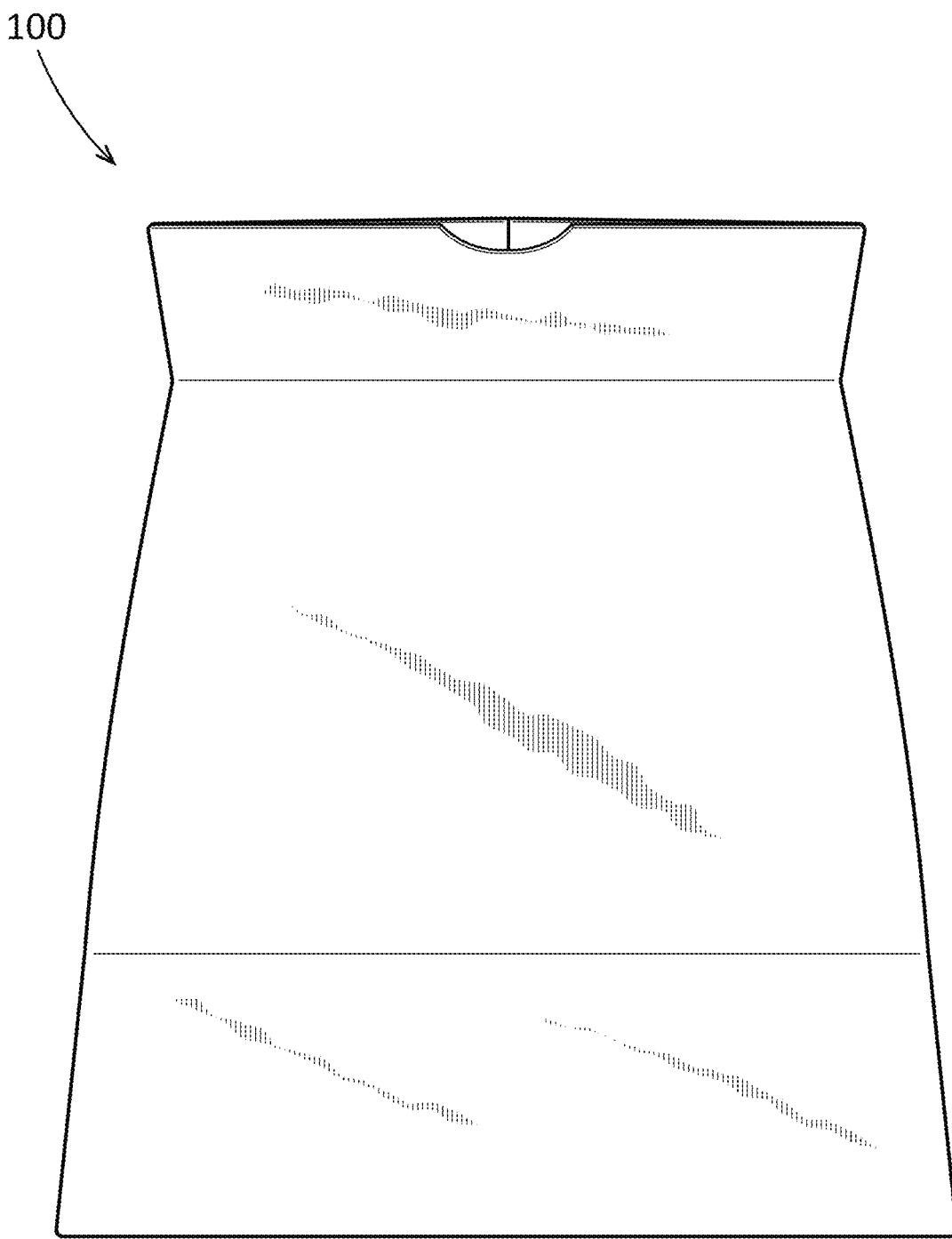
FIG. 9 is a front perspective view of the container of FIG. 1.
Figure 10:
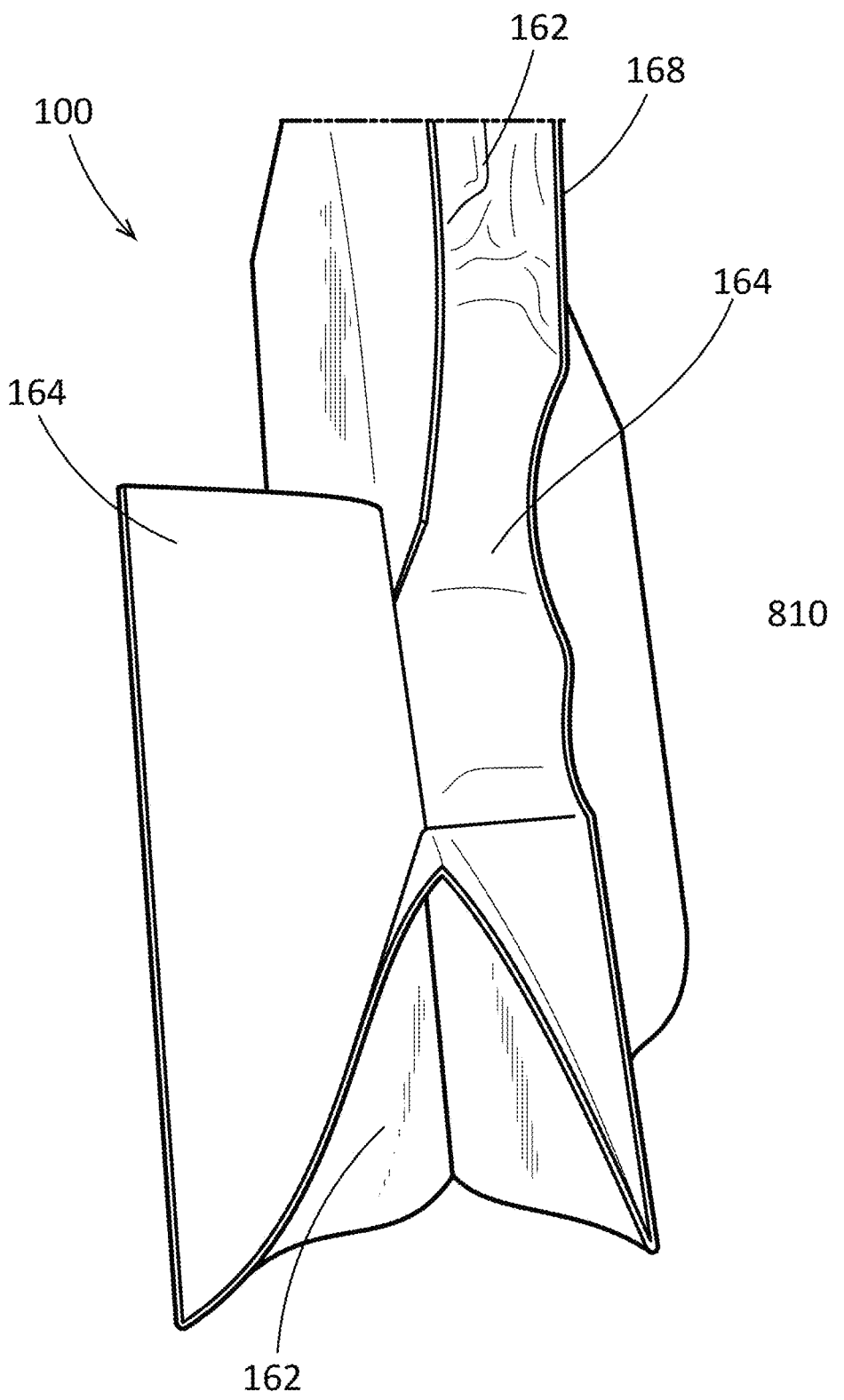
FIG. 10 is a top view of the opening of the container of FIG. 1.
Figure 11:
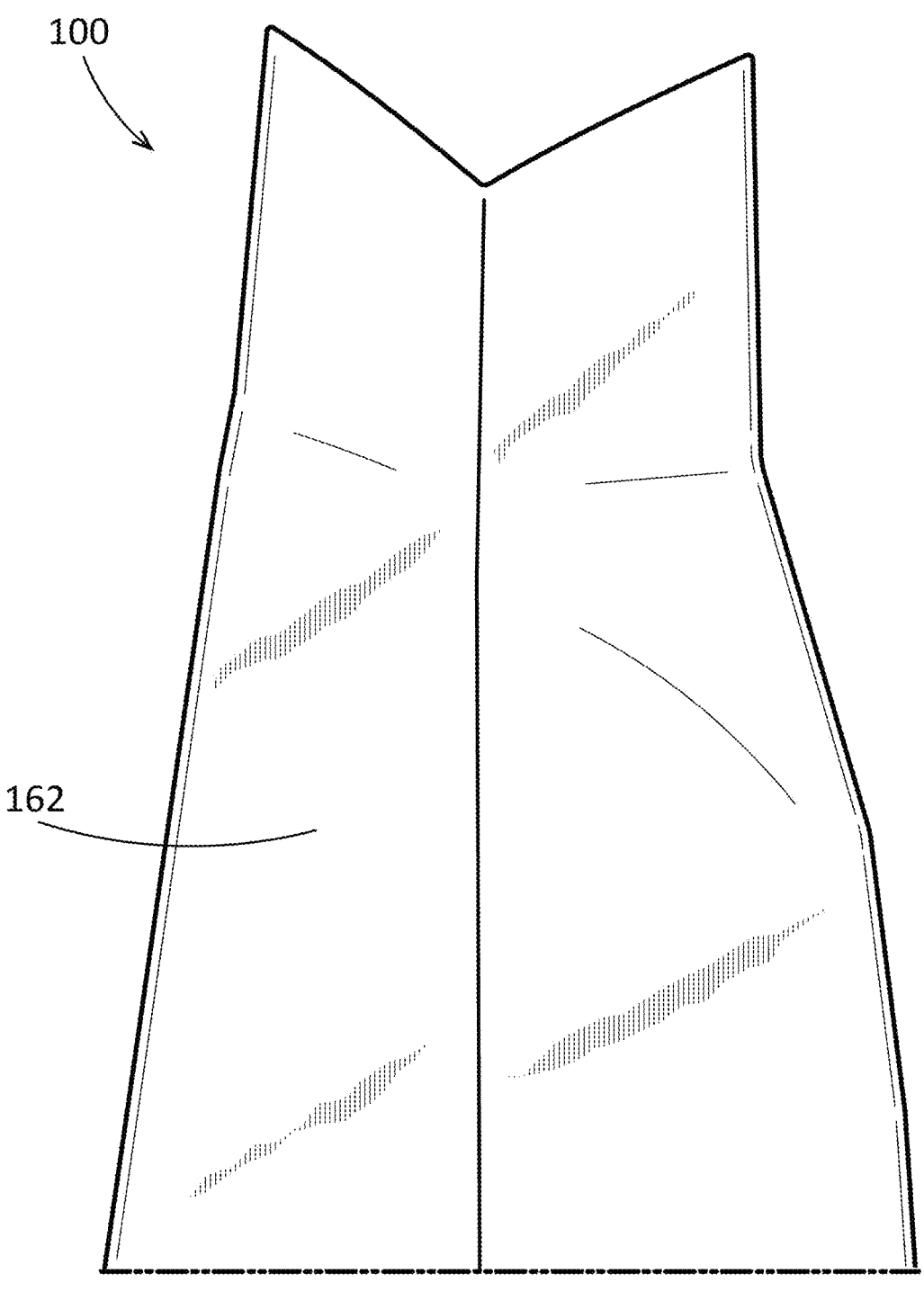
FIG. 11 is a side perspective view of the container of FIG. 1.
Figure 12:
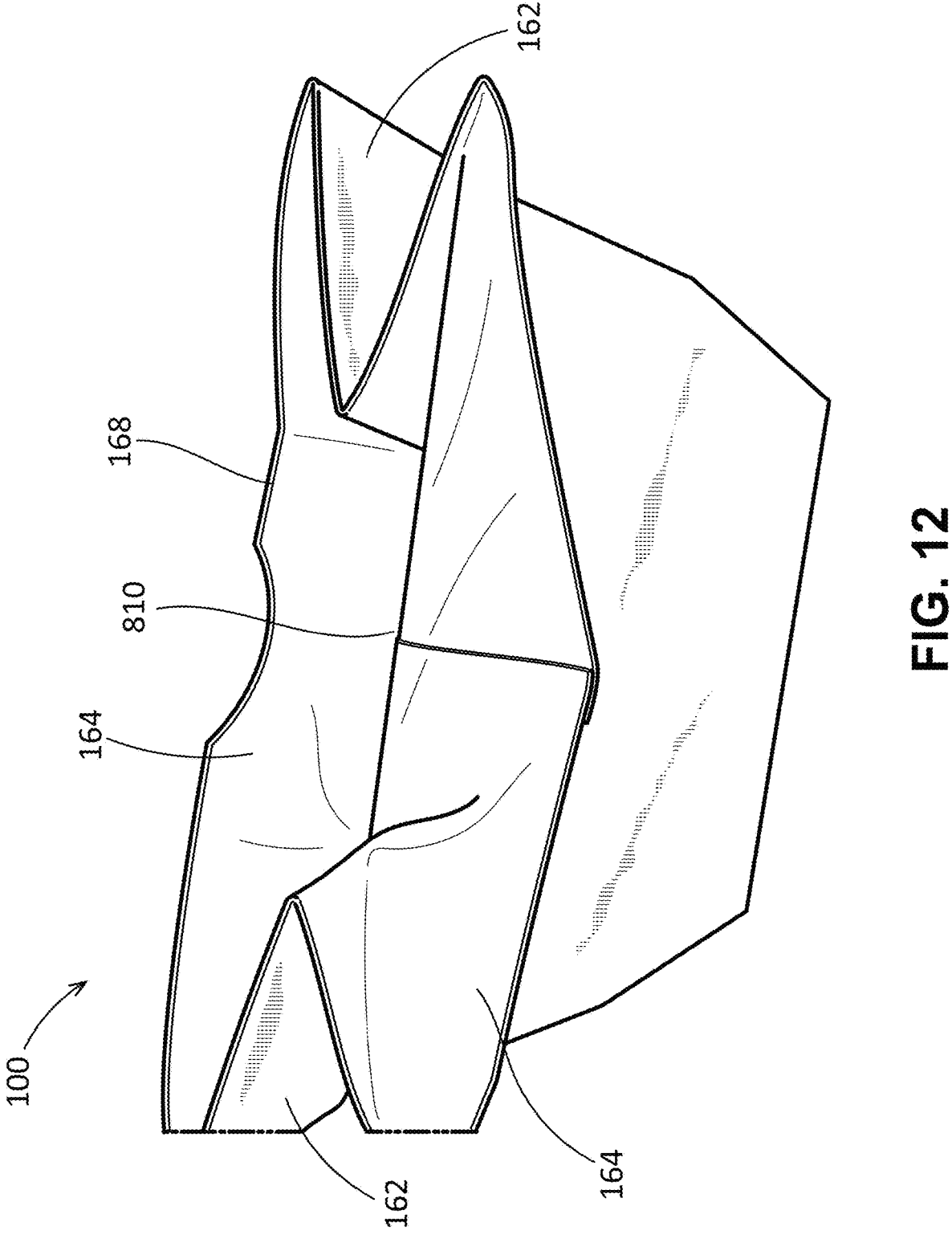
FIG. 12 is a perspective top view of the opening of the container of FIG. 1.

As shown in FIG. 7, the film 120 can comprise multiple layers of nanoparticles. For example and without limitation, the film 120 can comprise a reflective layer 720a and a protective layer 720b positioned over the reflective layer 720a. In some aspects, the protective layer 720b can be a polymer layer, or coating, such as polyester, polyethylene, polypropylene, polyethylene terephthalate, or any other suitable polymer. In some aspects, the protective layer 720*b* can be a wax or lacquer layer, or coating. Such aspects of the film 120 can be compatible with versions of the blank 130,530 with or without the intermediary layer 515. The reflective layer 720*a* can be a metallized layer, and the protective layer 720*b* can protect the metallized layer from oxidation, mechanical abrasion, etc. that may degrade the emissivity of the metallized layer, for example and without limitation. In some aspects, the reflective layer 720*a* and the protective layer 720*b* can cooperate to reflect different wave lengths of radiant heat energy. In some aspects, the film 120 can comprise more than two layers.

A method for metallizing a base layer 110 can comprising vaporizing a film material; depositing the film material to form the film 120; and coupling the film 120 to the base layer 110. In some aspects, depositing the film material to from the film 120 can comprise depositing the film 120 directly to the base layer 110, and coupling the film 120 to the base layer 110 can comprise bonding the film 120 to the base layer 110. In some aspects, depositing the film material to from the film 120 can comprise depositing the film 120 directly to an intermediary layer 515; and coupling the film 120 to the base layer 110 can comprise attaching the intermediary layer 515 to the base layer 110. The intermediary layer 515 can positioned between the film 120 and the base layer 110. In other aspects, the intermediary layer 515 can laminated the film 120 to the base layer 110 so that the film 120 is positioned between the intermediary layer 515 and the base layer 110. In some aspects, the intermediary layer 515 can comprise starch, such as a starch-based film, for example and without limitation. For example and without limitation, corn starch can be utilized to form a film for the intermediary layer 515. In some aspects, the intermediary layer 515 can comprise a polymer, such as polyester, polyethylene, poly-propylene, polyethylene terephthalate, or any other suitable plastic. In some aspects, the film 120 can be a metallized film.

FIGS. 8-12 provide various views of the container 100 of FIG. 1 in another aspect of the closed configuration. In the aspect of the closed configuration shown in FIGS. 8-12, the main panels 164 can be coupled together below the opening 168, thereby enclosing a portion of the cavity 101 (shown in FIG. 1). In some aspects, the side panels 162 can also be coupled to the main panels 164. In some aspects, the method of coupling the various panels 162,164 together can form a seal 810, which can be liquid-tight and/or air-tight in various aspects. By forming a liquid-tight and/or air-tight seal, heat loss via the escape of convective fluids form the cavity 101 (shown in FIG. 1) can be avoided.

In some aspects, the seal 810 can be a hot seal formed by heating a material, pressing together the various panels 162,164 to be sealed, and allowing the material to cool, thereby bonding the material to the panels 162,164. In some aspects, the material can be heated to a molten, amorphous, or liquid state and then allowed to re-solidify or transition to a glass state. In some aspects, heating may simply sensitize, or soften, the material rather than melt the material. In some aspect, the film 120 (shown in FIG. 1) itself can be heated to form the seal 810. In some aspects, a coating placed over the film 120, such as the intermediary layer 515 (shown in FIG. 5) or the protective layer 720*b* (shown in FIG. 7) can be sensitized or melted to form the seal 810. For example, the protective layer 720*b* can be a meltable coating, such as a polymer, and portions of the protective layer 720*b* of the various panels 162,164 can be heated and welded together by the hot seal. In some aspects, the seal 810 may not be a hot seal. In such aspects, an adhesive or cohesive can be used to form the seal. For example and without limitation, the adhesive could be applied as a spray or liquid, a tape, or any other suitable means of depositing a sealing material.

In some aspects, the material used to form the seal 810 can be selected for its tamper-resistant properties. For example and without limitation, the material can be selected so that the container 100 can only be opened by destructive means, such as by cutting or tearing the container 100, which result in obvious damage to the container 100. This can prevent contents of the container 100 from being tampered with, such as while the container 100 is in transit, without leaving tell-tale signs of the tampering in the form of the damage to the container 100.

Figure 13:
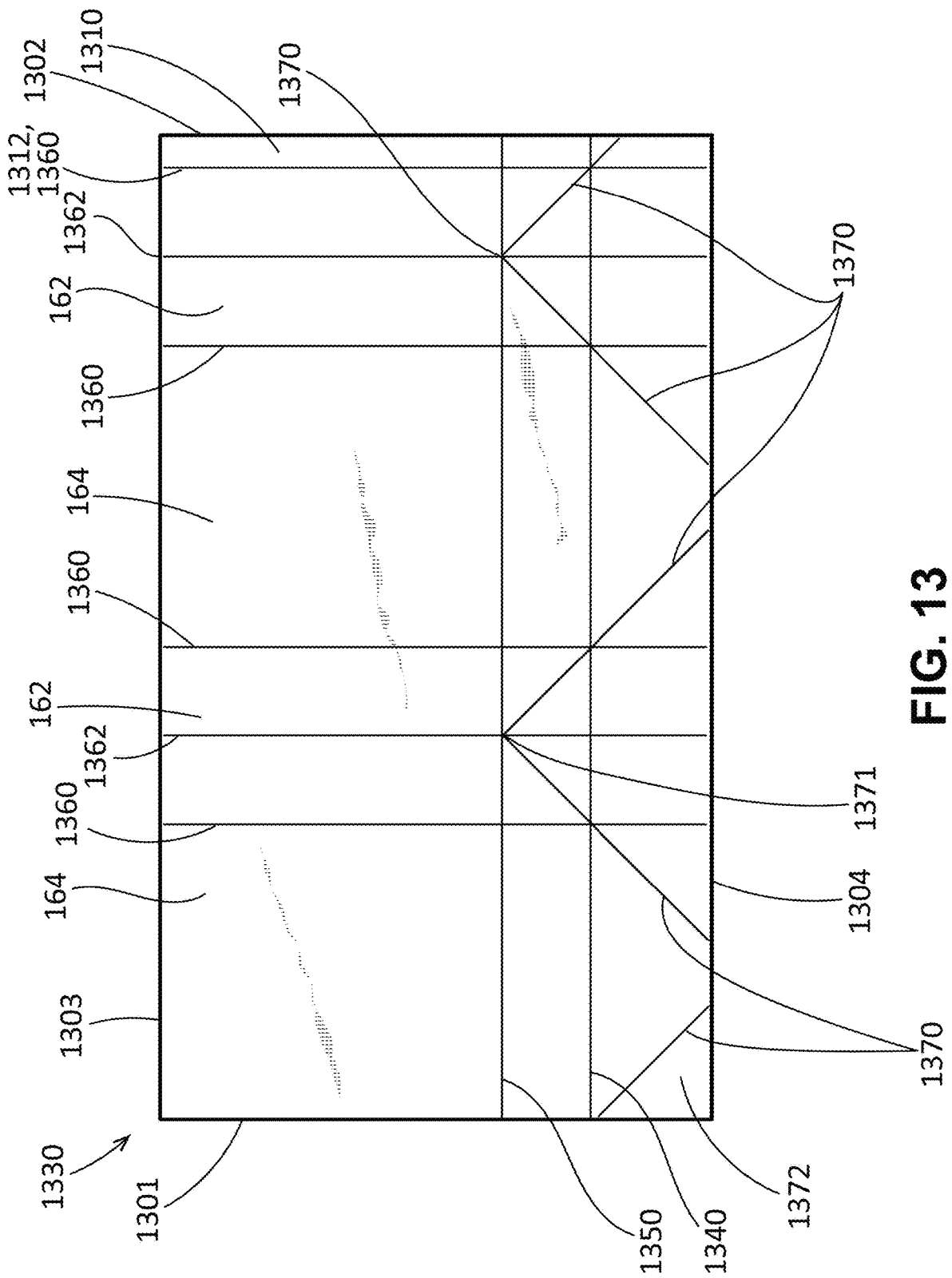
FIG. 13 is a plan view of another blank in accordance with another aspect of the present disclosure.
Figure 14:
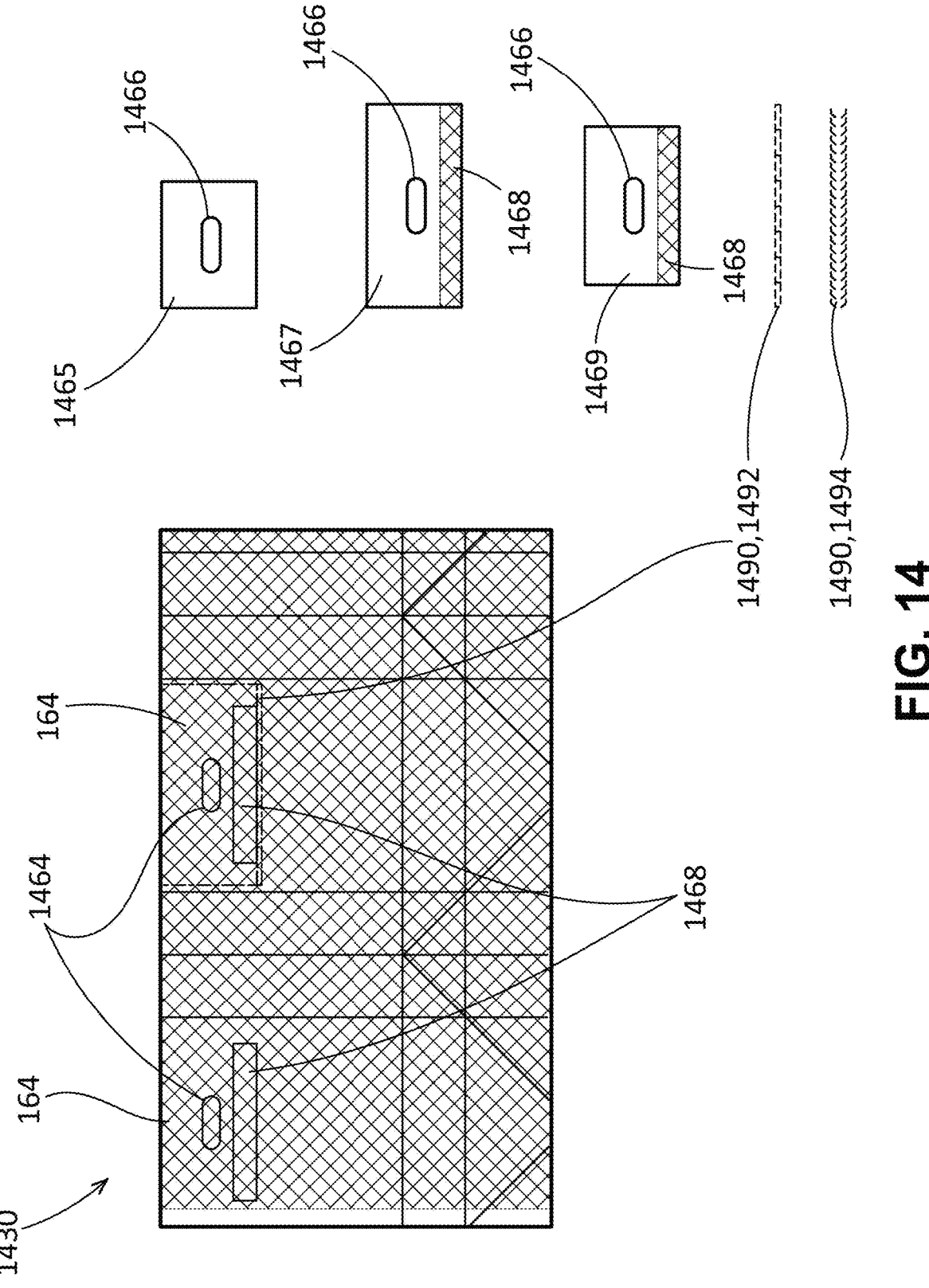
FIG. 14 is a plan view of another blank in accordance with another aspect of the present disclosure.
Figure 15:
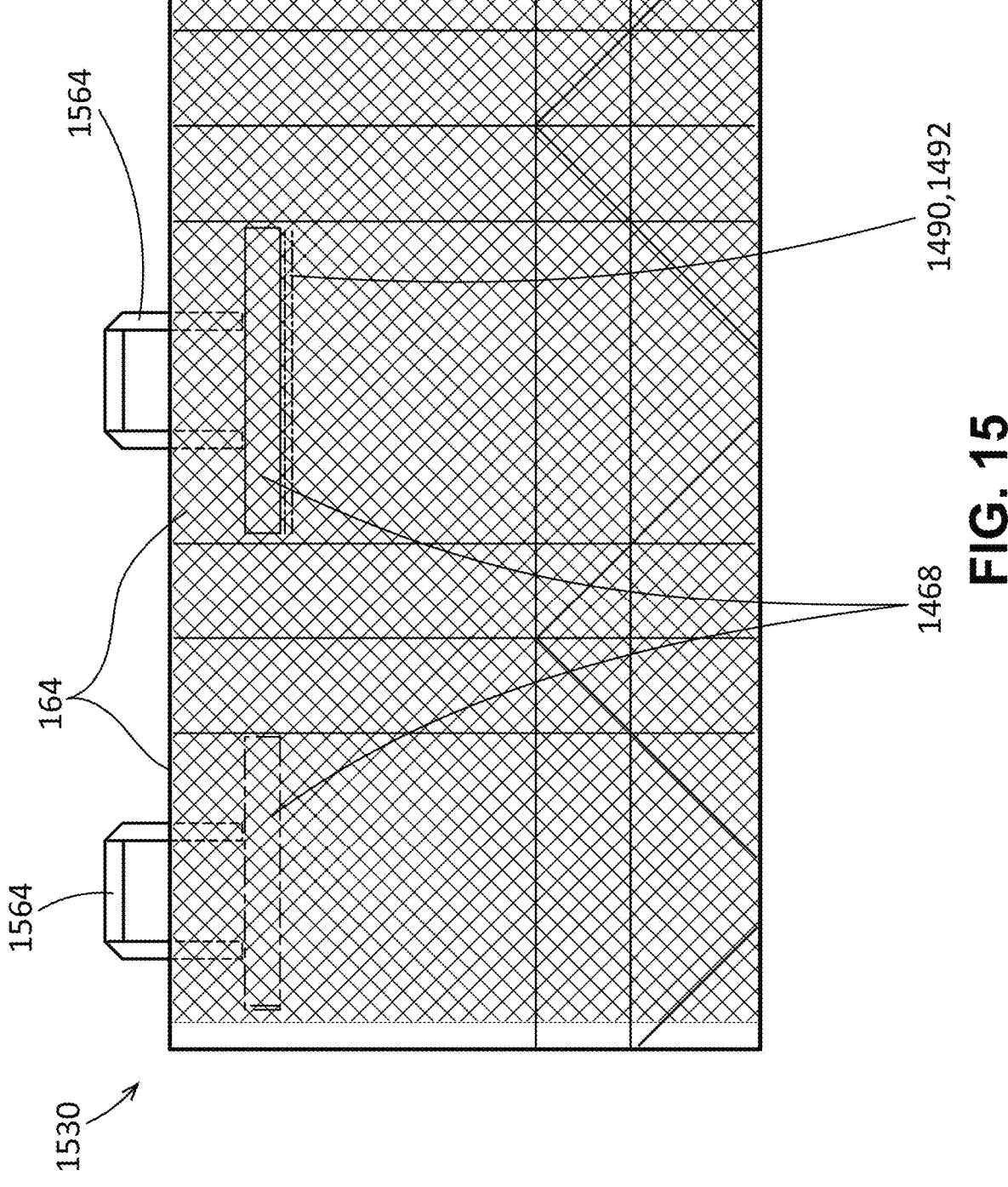
FIG. 15 is a plan view of another blank in accordance with another aspect of the present disclosure.

FIGS. 13-15 show plan views of various aspects of a blank 1330,1430,1530. Each of the blanks 1330,1430,1530 can comprise the base layer 110 and at least one film 120 (base layer 110 and film 120 shown in FIGS. 1 and 5-7). For each blank 1330,1430,1530, the dimensions shown are merely exemplary and should not be viewed as limiting. The blank 1330 of FIG. 13 can comprise the pair of opposing main panels 164, the pair of opposing side panels 162, and a plurality of bottom subpanels 1372. When a container is formed from the blank 1330, such as a container similar to the container 100 of FIG. 1, the plurality of bottom subpanels 1372 can be coupled together to form a bottom panel, which can be similar to the bottom panel 172 of the container 100 of FIG. 1.

The blank 1330 can define a first end 1301 and a second end 1302. The blank 1330 can further comprise a connecting strip 1310 at one of the ends 1301,1302. In the present aspect, the connecting strip 1310 can be hingedly connected to one of the side panels 162 by a connecting fold line 1312. The aspects shown can be for a "corner-seam" design. In various aspects, the connecting strip 1310 can be attached to one of the side panels 162, one of the main panels 164, or a subpanel thereof. For example and without limitation, one of the main panels 164 can be bisected such that a subpanel thereof is positioned at or near each end 1301,1302, and the connecting strip 1310 can be connected to one of the subpanels at either end 1301,1302. Such an aspect is often referred to as a "center-seam" design, wherein the connect-ing strip 1310 can couple together the subpanels to from a panel with a seam along the respective panel.

When assembling the blank 1330 into a container, such as a container similar or identical to the container 100 of FIG. 1, the connecting strip 1310 can be adhered to the opposite end 1301,1302 of the blank 1330. In the aspect shown wherein the connecting strip 1310 is hingedly connected at the second end 1302, the connecting strip 1310 can be adhered to the first end 1301 as one step in forming a container.

The side panels 162, the main panels 164, and the connecting strip 1310 can define a top end 1303 of the blank 1330. The plurality of bottom subpanels 1372 and the connecting strip 1310 can define a bottom end 1304 of the blank 1330. The blank 1330 can define a bottom fold line 1340 and an intermediate fold line 1350 extending between the first end 1301 and the second end 1302. The bottom fold line 1340 and the intermediate fold line 1350 can be posi-tioned between the top end 1303 and the bottom end 1304. Specifically, the bottom fold line 1340 can extend between the plurality of bottom subpanels 1372 and the side and main panels 162,164. The bottom fold line 1340 can hingedly couple the side and main panels 162,164 to the plurality of bottom subpanels 1372. The intermediate fold line 1350 can extend across the side and main panels 162,164.

The side panels 162 can be connected to the main panels 164 by corner fold lines 1360. In the aspect shown, when a container is assembled from the blank 1330, the side panel 162 near the second end 1302 can be coupled to the main panel 164 defining the first end 1301 by the connecting strip 1310. Accordingly, in the present aspect, the connecting fold line 1312 can be a corner fold line 1360. Each corner fold line 1360 can extend from the top end 1303 to the bottom end 1304 between the first end 1301 and the second end 1302.

Each side panel 162 can be bisected by a side fold line 1362 extending between the top end 1303 and the bottom end 1304. The side panels 162 can be configured to fold about the side fold lines 1362. When the blank 1330 is folded into a container, similar to the container 100 of FIG. 1, the side panels 162 can fold inwards toward one another to collapse the container 100. The side panels 162 are shown partially folded in FIGS. 1, 8, and 10-12. When the container 100 is fully collapsed, as shown in FIG. 3, the side panels 162 can be folded completely in half and positioned between the main panels 164.

In the fully collapsed position, the container 100 can be folded about the intermediate fold line 1350 to position the bottom panel 172 substantially parallel to the main panels 164. The blank 1330 can also define a series of oblique fold lines 1370, extending entirely or in part between the intermediate fold line 1350 and the bottom end 1304. In the aspect shown, the oblique fold lines 1370 can specifically extend from intersections 1371 between the intermediate fold line 1350 and the side fold lines 1362 towards portions of the bottom end 1304 defined beneath the main panels 164.

The blanks 1430,1530 can define substantially the same series of panels, subpanels, and fold lines as shown for the blank 1330 of FIG. 13.

Turning to FIG. 14, the blank 1430 can define hand holes 1464 extending through each of the main panels 164. Various aspects of patches 1465,1467,1469 can be coupled to the main panels 164 on an inner surface or an outer surface thereof. Each patch 1465, 1467,1469 aspect can define a complimentary hand hole 1466, and the patches 1465,1467,1469 can be coupled to the main panels 164 with the complimentary hand holes 1466 respectively aligned with the hand holes 1464. The patches 1465,1467,1469 can be configured to support and reinforce the blank 1430, such as to prevent tearing of the blank 1430 around the hand holes 1464.

The patches 1465,1467,1469 can comprise various materials, such as ordinary paper, reinforced paper, low-density polyethylene film, high-density polyethylene film, polypropylene film, polyethylene terephthalate film, glassine film, any other polymer film, a foil, or any other suitable reinforcement material. The patches 1465,1467,1469 can vary in shape and size. For example and without limitation, the patch 1467 can be approximately as wide as each main panel 164 in the present aspect, while patches 1465,1469 can be narrower than the main panel 164.

The blank 1430 and/or the patches 1467,1469 can comprise tape 1468. The tape 1468 can form the seal 810 (shown in FIG. 8). In some aspects, the tape 1468 can comprise a backing strip to cover an adhesive until it is desired to form the seal 810. The backing strip can then be peeled away to expose the adhesive. In some aspects, the seal 810 can be a cohesive material, and the tape 1468 can be configured to only adhere to other strips of tape 1468. In some aspects, the tape 1468 may not be adhesive. For example and without limitation, the tape 1468 can be a material selected for hot sealing, as described above. In some aspects, the patches 1465,1467,1469 can comprise a material selected for hot sealing. For example and without limitation, the patch 1465, itself, can comprise a material suitable for hot sealing, in which case the tape 1468 may be excluded.

The blank 1430 can further comprise, or define, an opening feature 1490. For example and without limitation, the opening feature 1490 can be a strip of tear tape 1492 or a series of perforations defining a zipper 1494. The blank 1430 can be configured to form the seal 810 (shown in FIG. 8) between the opening feature 1490 and the hand holes 1464 and/or opening 168 (shown in FIG. 8). The opening feature 1490 can facilitate tearing of the blank 1430, which can be desirable for opening a container, such as one similar to the container 100 of FIG. 1, formed from the blank 1430.

Turning to FIG. 15, the blank 1530 can comprise handle loops 1564. The handle loops 1564 can mount to an outer surface of the blank 1530 or an inner surface of the blank 1530. In some aspects, the tape 1468 can secure the handle loops 1564 to the blank 1530. In some aspects, the tape 1468 can secure the handle loops 1564 and be configured to form the seal 810 (shown in FIG. 8). The blank 1430 can be configured to form the seal 810 below the handle loops 1564. The blank 1430 can be configured to form the seal 810 above the opening feature 1490, such as the tear tape 1492 or the zipper 1494 (shown in FIG. 14).

Figure 16:
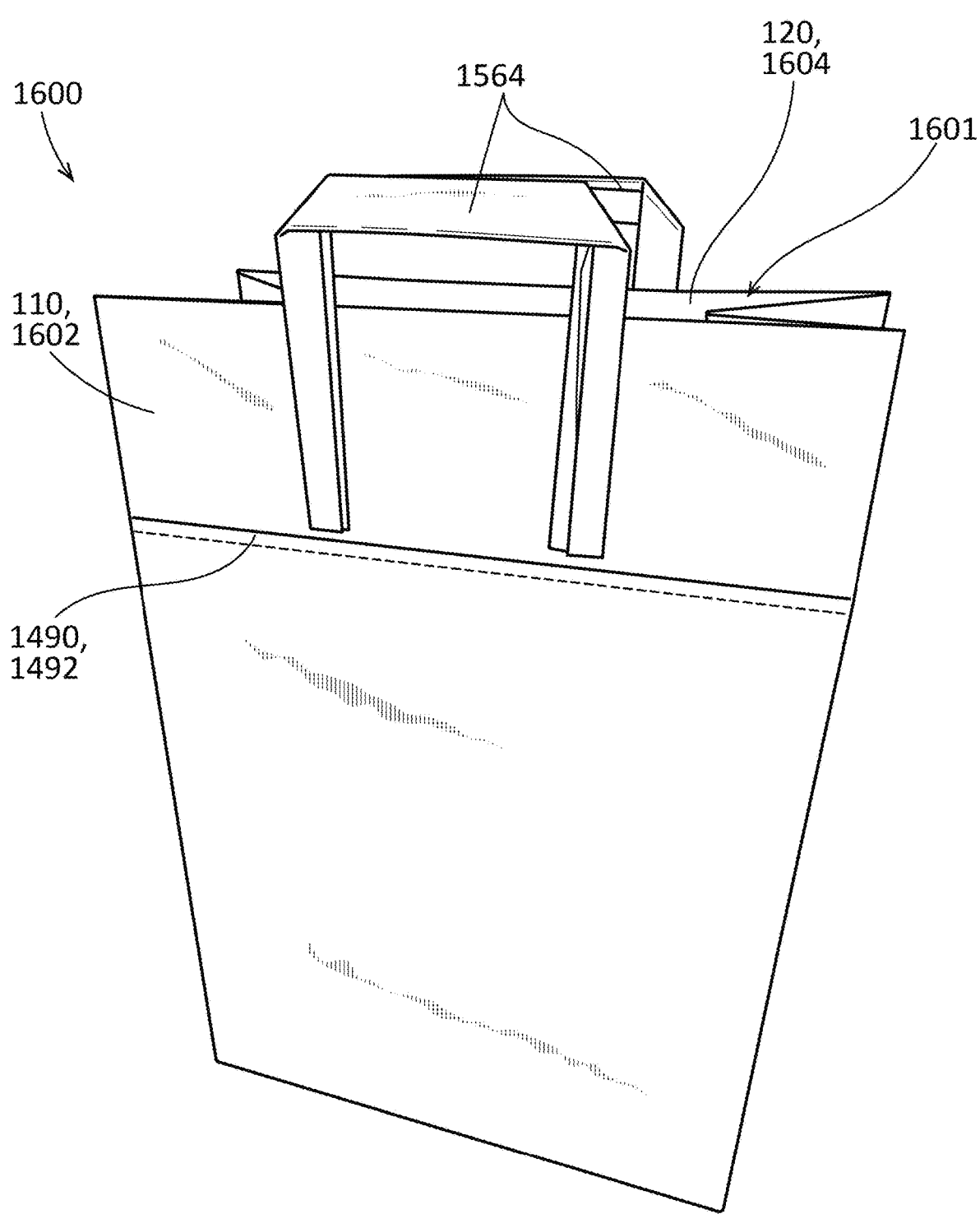
FIG. 16 is a front perspective view of another bag in accordance with another aspect of the present disclosure.
Figure 17:
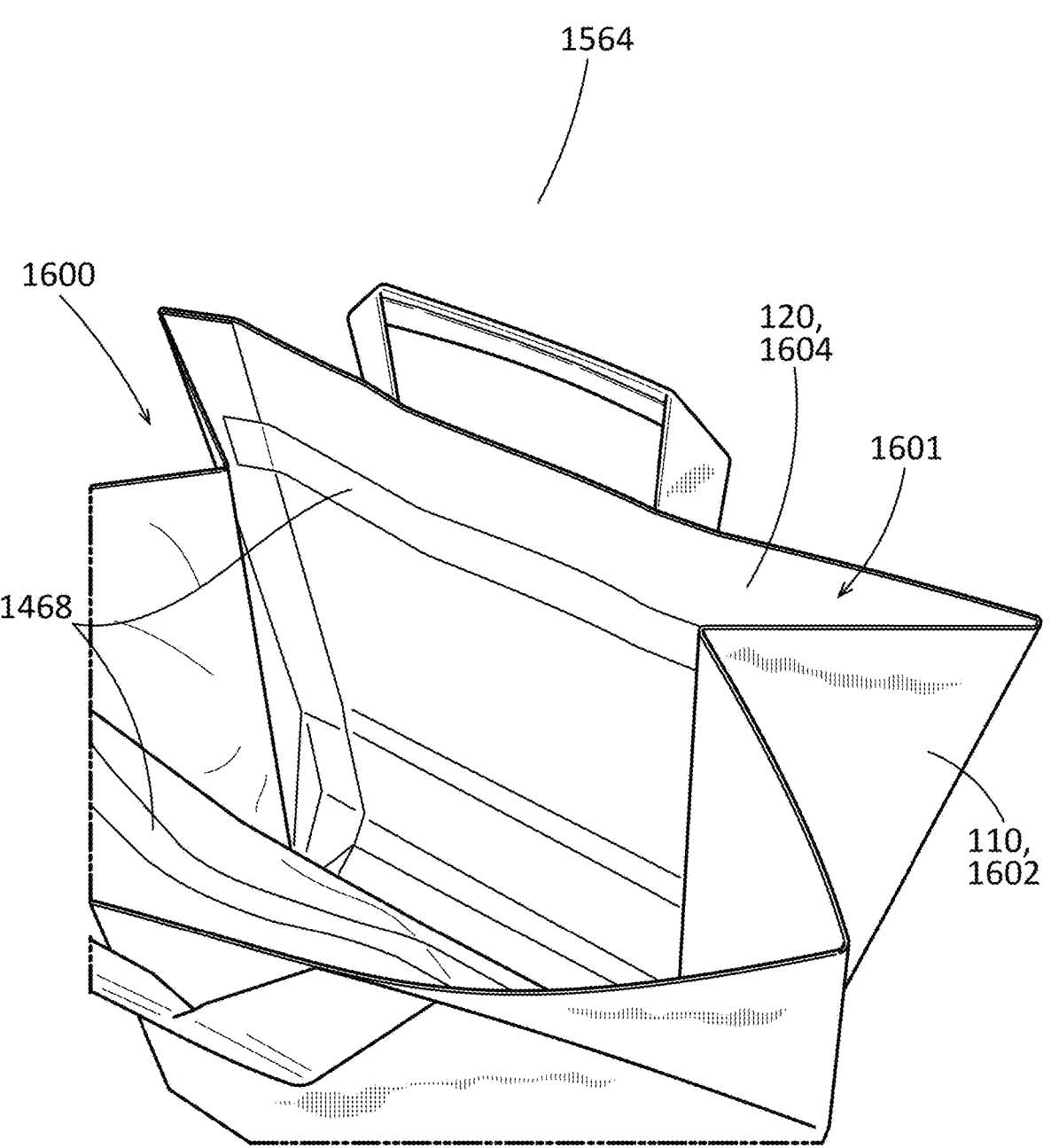
FIG. 17 is a top perspective view of the bag of FIG. 16.

FIGS. 16 and 17 show various views of a bag 1600 formed from the blank 1530 of FIG. 15. The handle loops 1564 can be coupled to an exterior surface 1602 of the bag 1600 in the aspect shown. In some aspects, the handle loops 1564 can be coupled to an interior surface 1604 of the bag 1600. The interior surface 1604 can define a cavity 1601 within the bag 1600. In the present aspect, the film 120 can face inwards towards the cavity 1601 and/or define the interior surface 1604 and the cavity 1601. In the present aspect, the base layer 110 can face away from the cavity 1601 and/or define the exterior surface 1602. In some aspects, the film 120 can face outwards, and the base layer 110 can face the cavity 1601. In some aspects, the base layer 110 can be covered by the film 120 on both sides, and the films 120 can face both outwards and inwards towards the cavity 1601.

As shown in FIG. 16, the opening feature 1490, such as the tear tape 1492 in the aspect shown, can be accessible from the exterior surface 1602. As shown in FIG. 17, the tape 1468 can be positioned within the cavity 1601.

Figure 18:
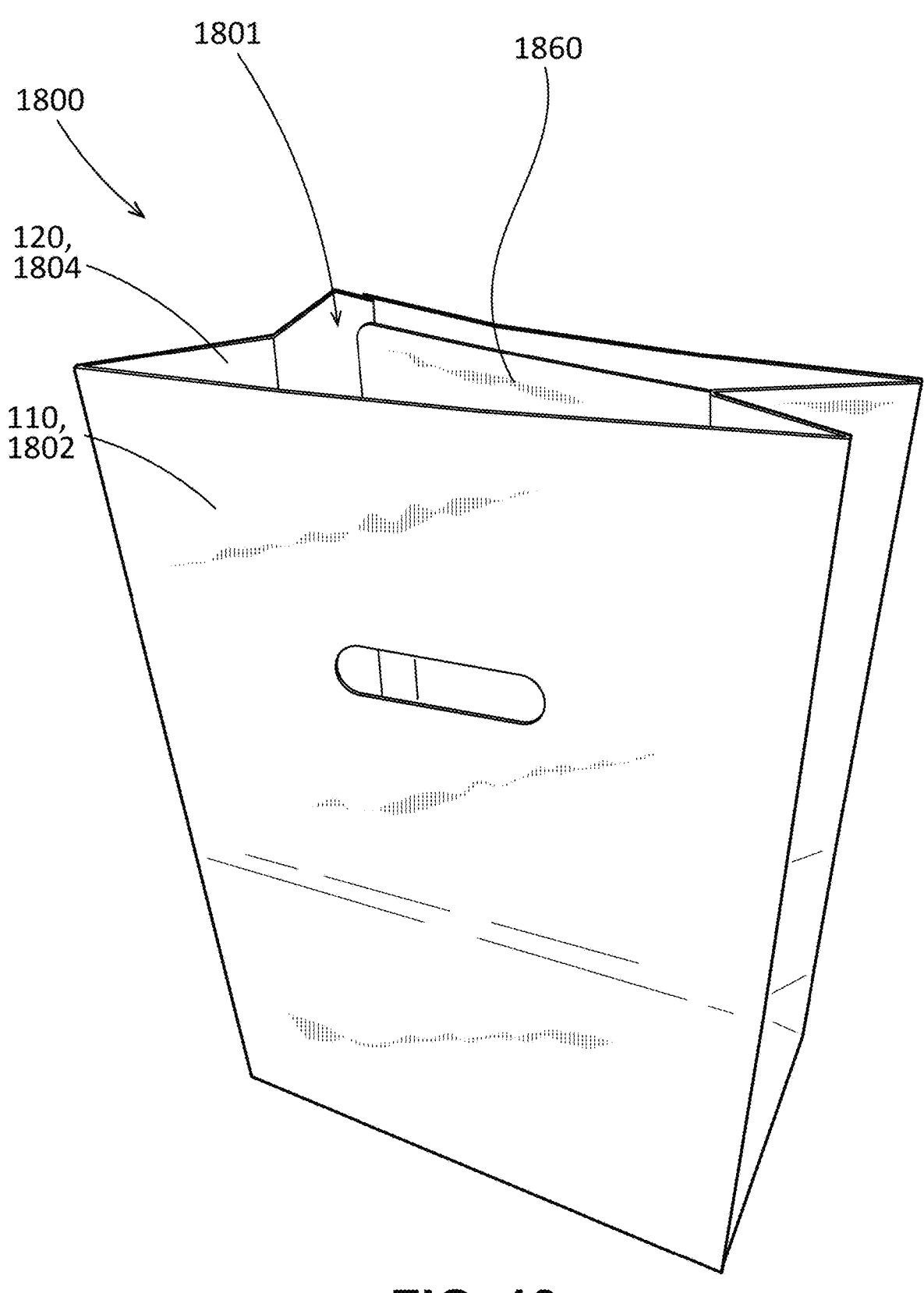
FIG. 18 is a front perspective view of another bag in accordance with another aspect of the present disclosure.
Figure 19:
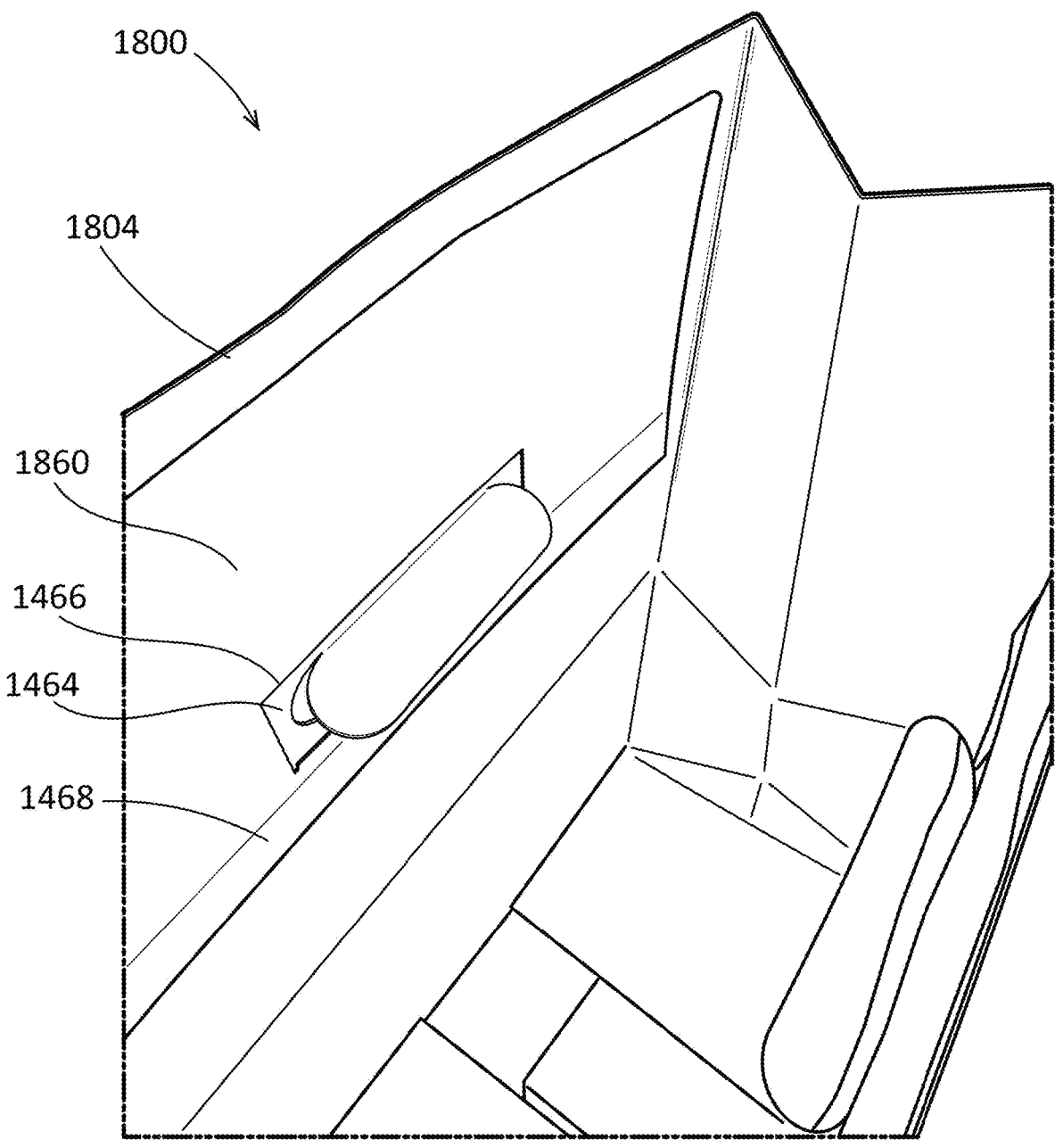
FIG. 19 is a top perspective view of the bag of FIG. 18.
Figure 20:
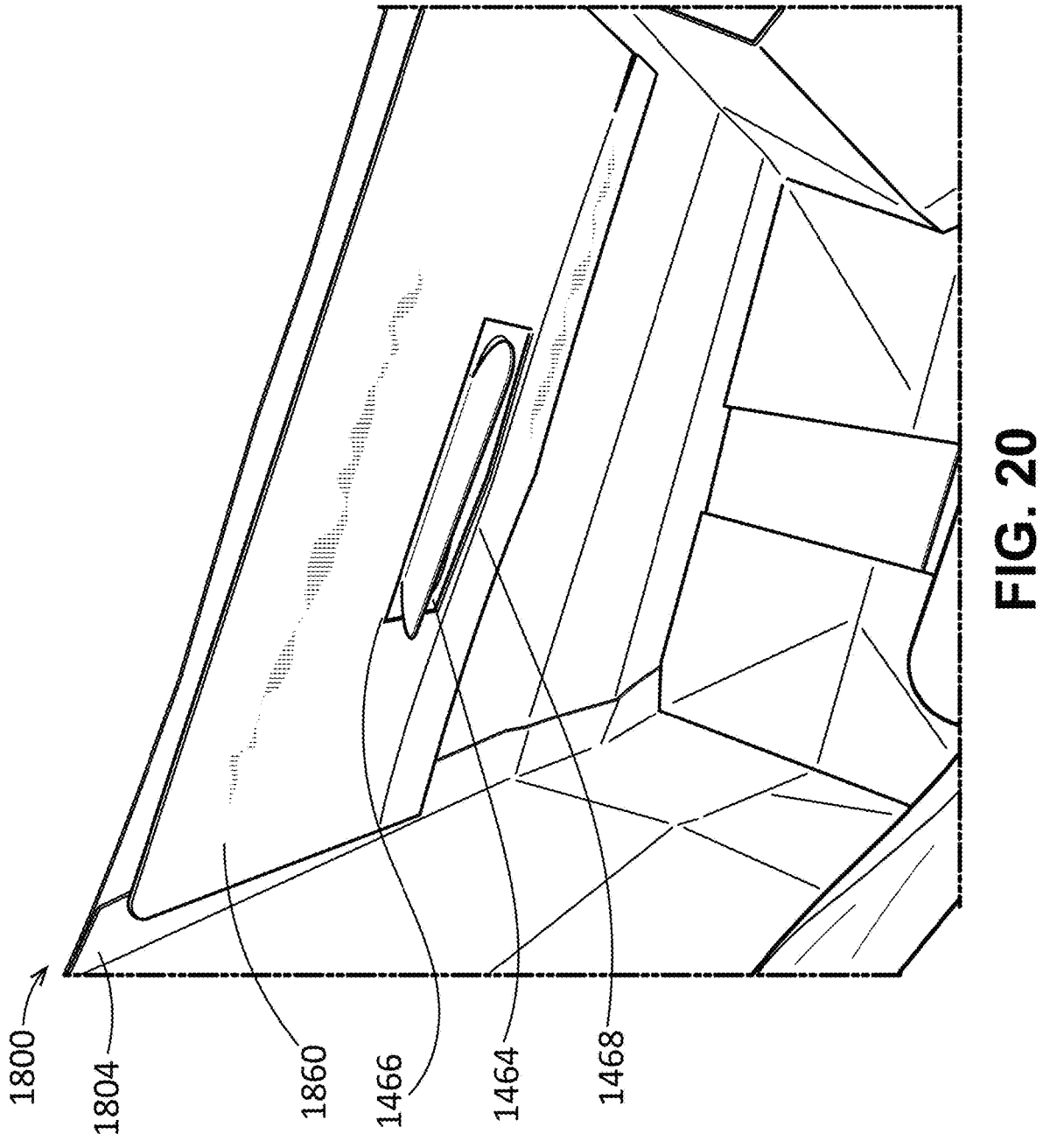
FIG. 20 is a top perspective view of the bag of FIG. 18.

FIGS. 18-20 show various views of a bag 1800 in accordance with another aspect of the present disclosure. As shown in FIG. 18, the bag 1800 can be formed from a blank similar to the blank 1430 of FIG. 14, but excluding the opening feature 1490, such as the tear tape 1492, shown in FIG. 14. The bag 1800 can define an exterior surface 1802 of the bag 1800 and an interior surface 1804 of the bag 1800. The interior surface 1804 can define a cavity 1801 within the bag 1800. The bag 1800 can define the hand holes 1464 extending from the exterior surface 1802 to the interior surface 1804. In the present aspect, the film 120 can face inwards towards the cavity 1801 and/or define the interior surface 1804 and the cavity 1801. In the present aspect, the base layer 110 can face away from the cavity 1801 and/or define the exterior surface 1802. In some aspects, the film 120 can face outwards, and the base layer 110 can face the cavity 1801. In some aspects, the base layer 110 can be covered by the film 120 on both sides, and the films 120 can face both outwards and inwards towards the cavity 1801.

As shown in FIGS. 18-20, the bag 1800 can comprise a pair of patches 1860 attached to the interior surface 1804. The patches 1860 can be similar to the patches 1467 shown in FIG. 14, and the patches 1860 can comprise tape 1468, as shown in FIGS. 19 and 20. The patches 1860 can define complimentary hand holes 1466, which can be positioned to encircle and reinforce the hand holes 1464. In the aspect shown, the patches 1860 can comprise a fiber-based material, such as paper, cardboard, or other suitable material.

Figure 21:
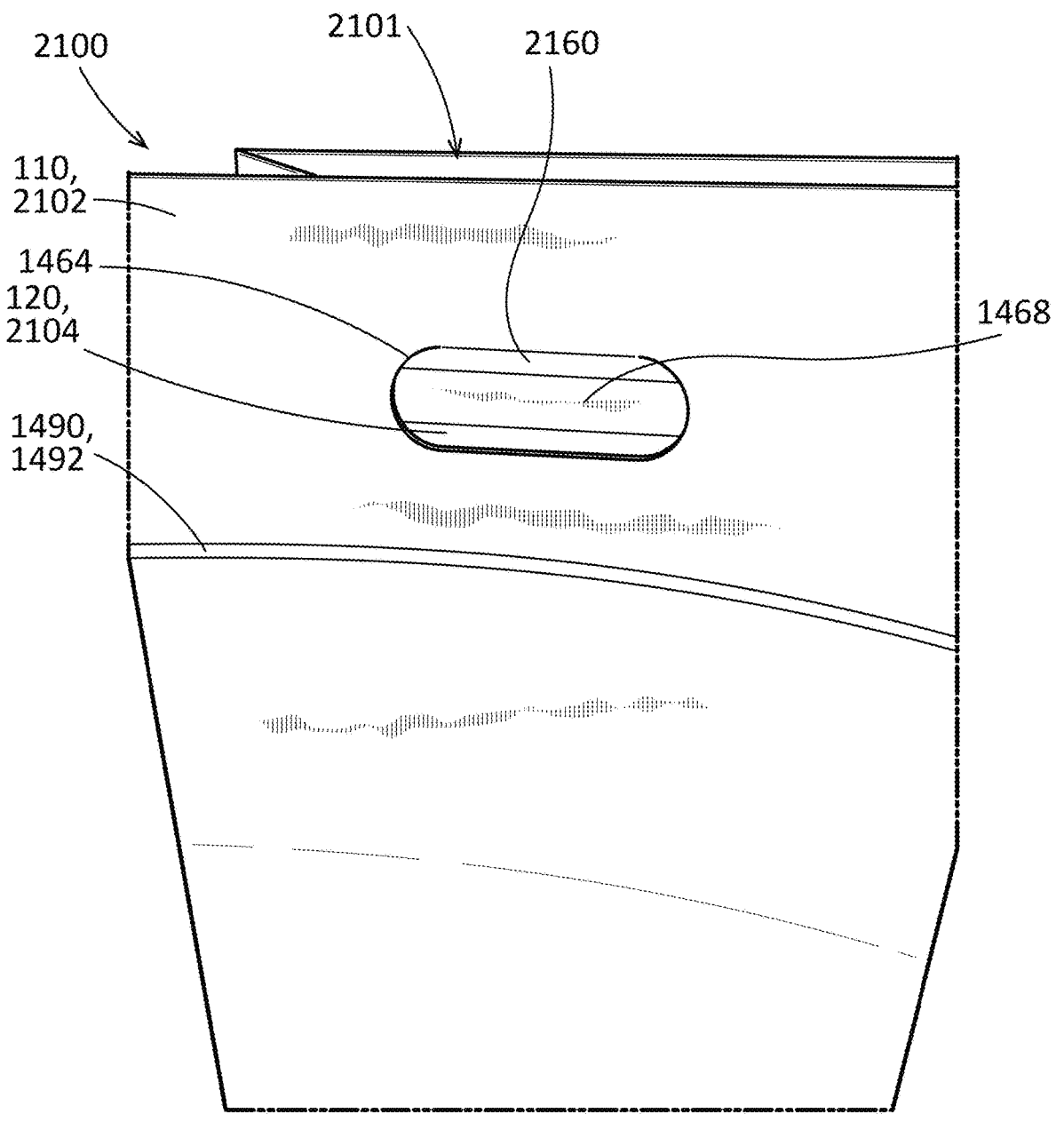
FIG. 21 is a front perspective view of another bag in accordance with another aspect of the present disclosure.
Figure 22:
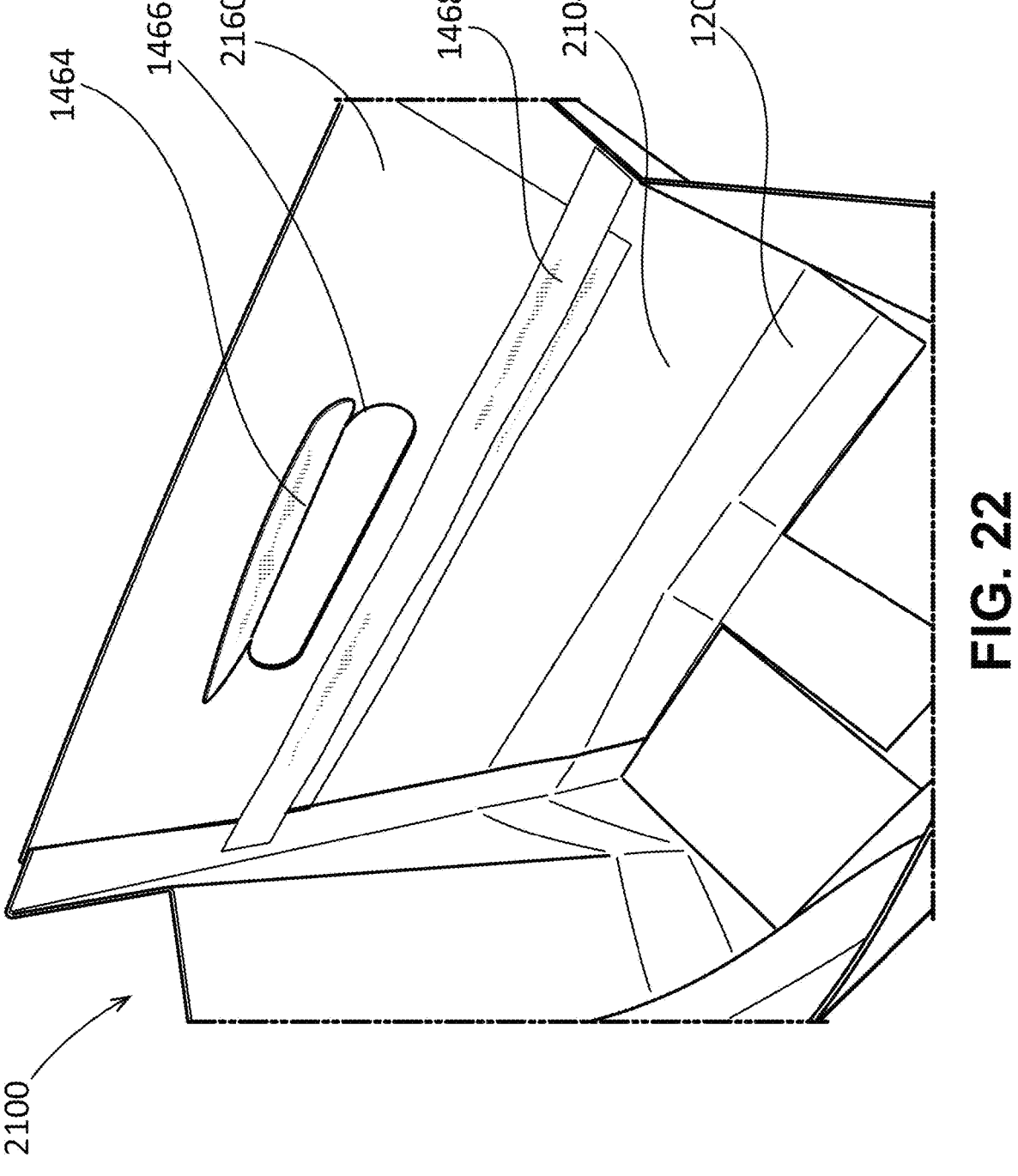
FIG. 22 is a top perspective view of the bag of FIG. 21.
Figure 23:
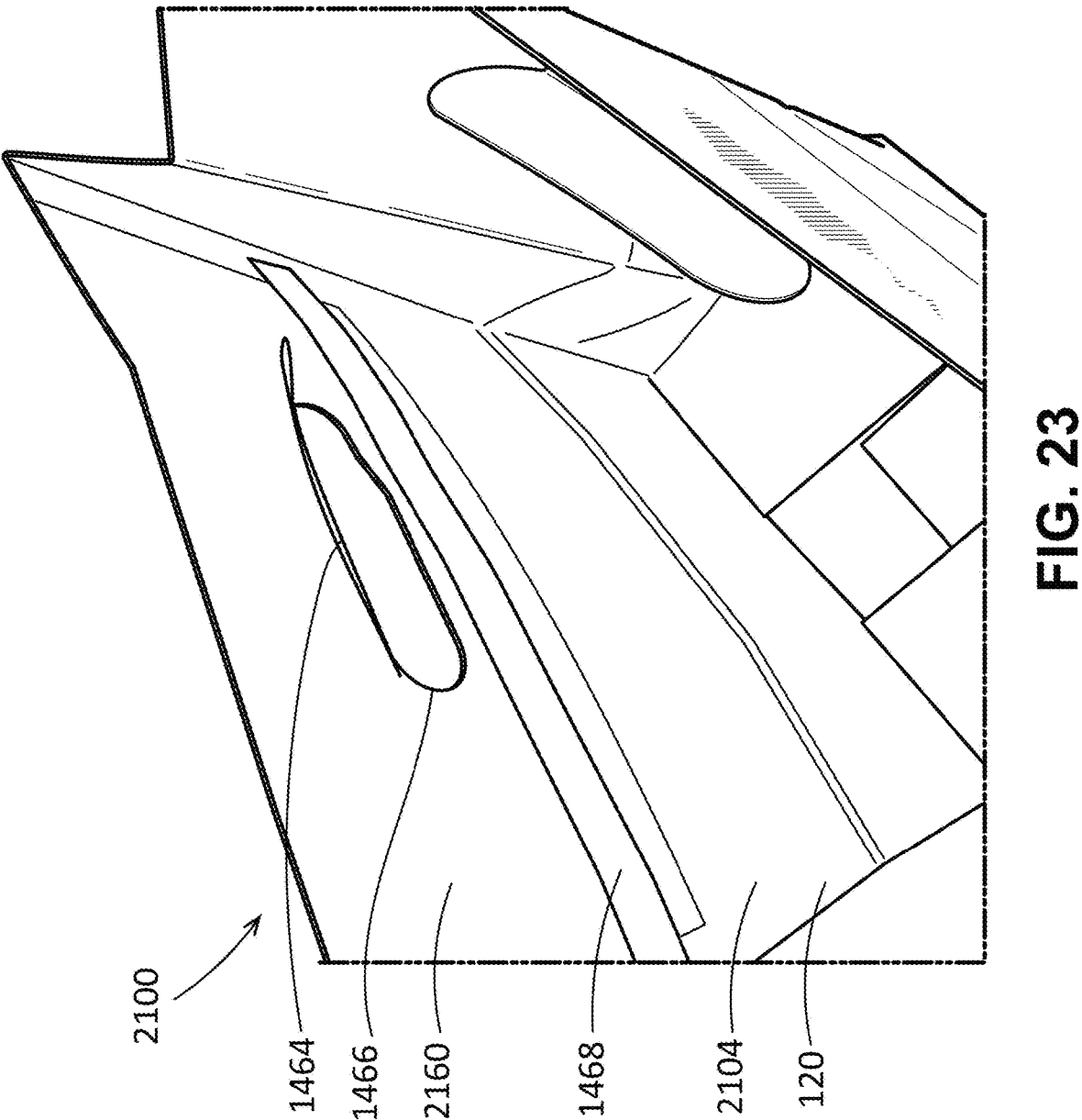
FIG. 23 is a top perspective view of the bag of FIG. 21.

FIGS. 21-23 show various views of a bag 2100 in accordance with another aspect of the present disclosure. As shown in FIG. 21, the bag 2100 can be formed from the blank 1430 of FIG. 14, including the opening feature 1490, such as the tear tape 1492, shown in FIG. 21. The bag 2100 can define an exterior surface 2102 of the bag 2100 and an interior surface 2104 of the bag 2100 (shown through the hand hole 1464). The interior surface 2104 can define a cavity 2101 within the bag 2100. The bag 2100 can define the hand holes 1464 extending from the exterior surface 2102 to the interior surface 2104. In the present aspect, the film 120 can face inwards towards the cavity 2101 and/or define the interior surface 2104 and the cavity 2101. In the present aspect, the base layer 110 can face away from the cavity 2101 and/or define the exterior surface 2102. In some aspects, the film 120 can face outwards, and the base layer 110 can face the cavity 2101. In some aspects, the base layer 110 can be covered by the film 120 on both sides, and the films 120 can face both outwards and inwards towards the cavity 2101.

As shown in FIGS. 21-23, the bag 2100 can comprise a pair of patches 2160 attached to the interior surface 2104. The patches 2160 can be similar to the patches 1467 shown in FIG. 14, and the patches 2160 can comprise tape 1468. The patches 2160 can define complimentary hand holes 1466, as shown in FIGS. 22 and 23, which can be positioned to encircle and reinforce the hand holes 1464. In the aspect shown, the patches 2160 can comprise a film material, such as a polymeric film for example and without limitation. In the aspect shown, the film material can be completely are almost completely transparent. The film 120 can be visible through the film material of the patches 2160, as shown in FIGS. 22 and 23, and the film material can be selected not to substantially alter the emissivity and/or reflectivity of the film 120. In some aspects, the film material can be translucent or opaque.

In some aspects, the patches 1465,1467, 1469, 1860,2160 can be positioned on the exterior surfaces 1802,2102, either in addition to being coupled to the interior surfaces 1804, 2104 or in place of being coupled to the interior surfaces 1804,2104.

Figure 24:
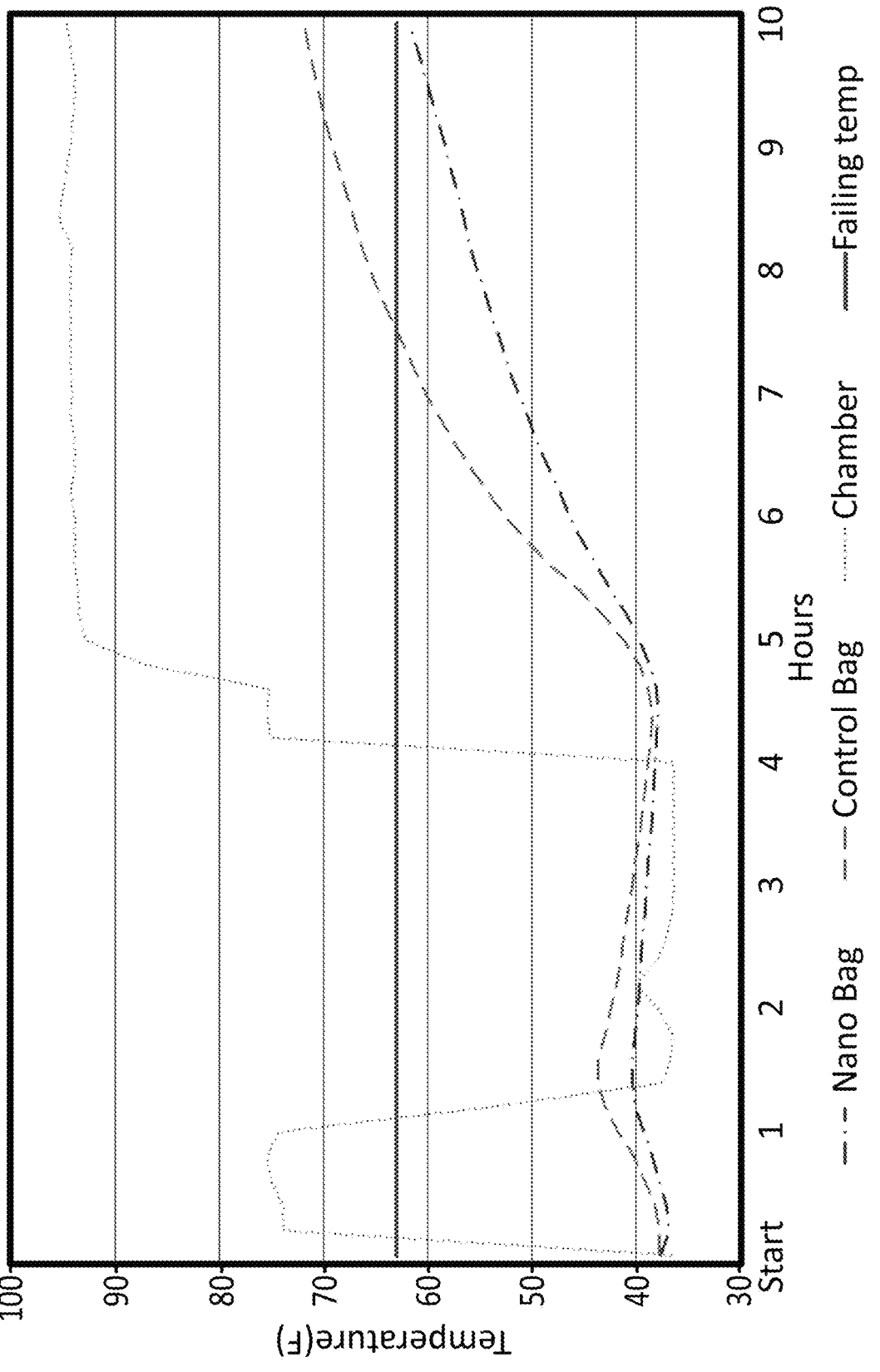
FIG. 24 is a graph showing test results comparing the bag of FIG. 1 to a control bag.
Figure 25:
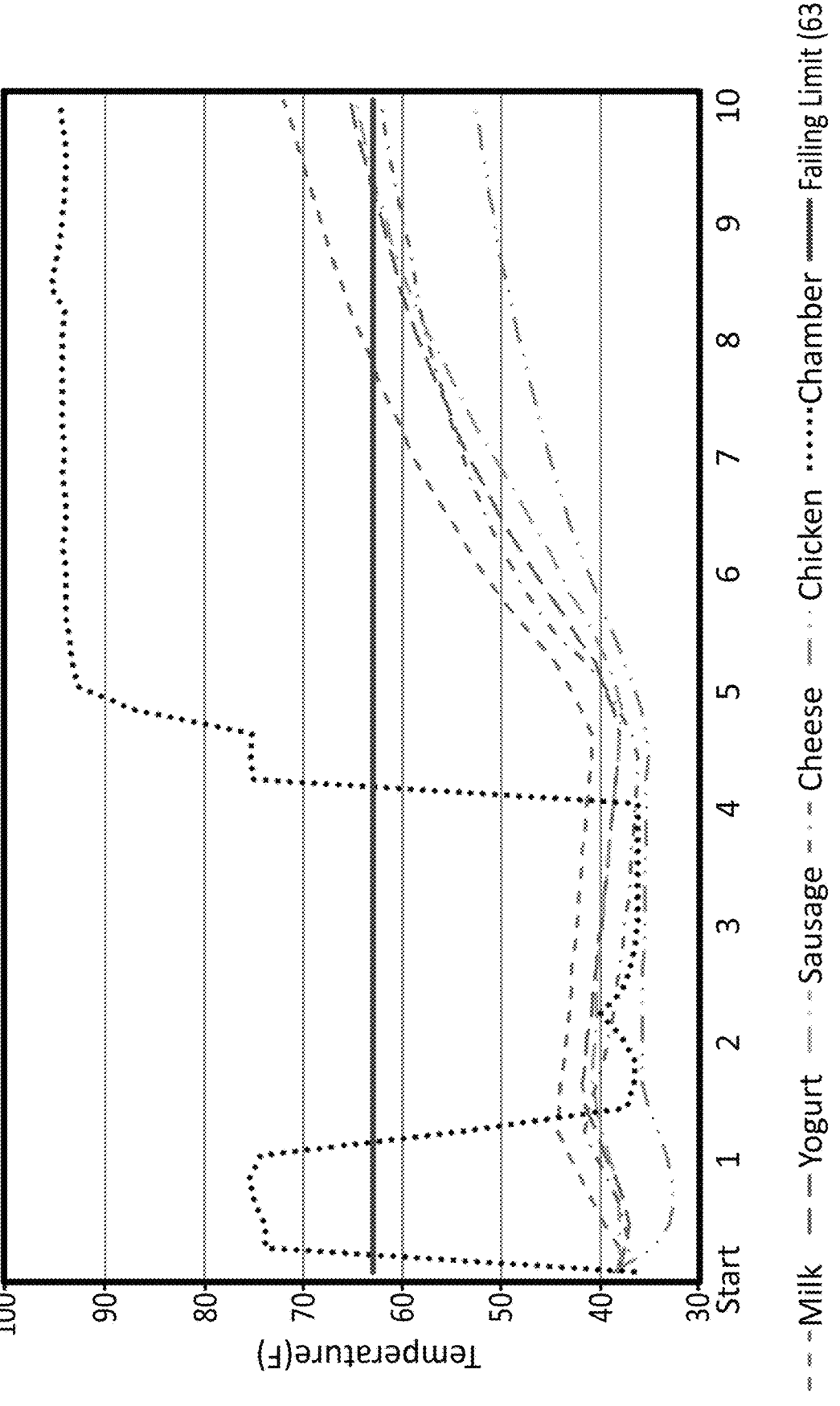
FIG. 25 is a graph showing test results of contents within the bag of FIG. 1.
Figure 26:
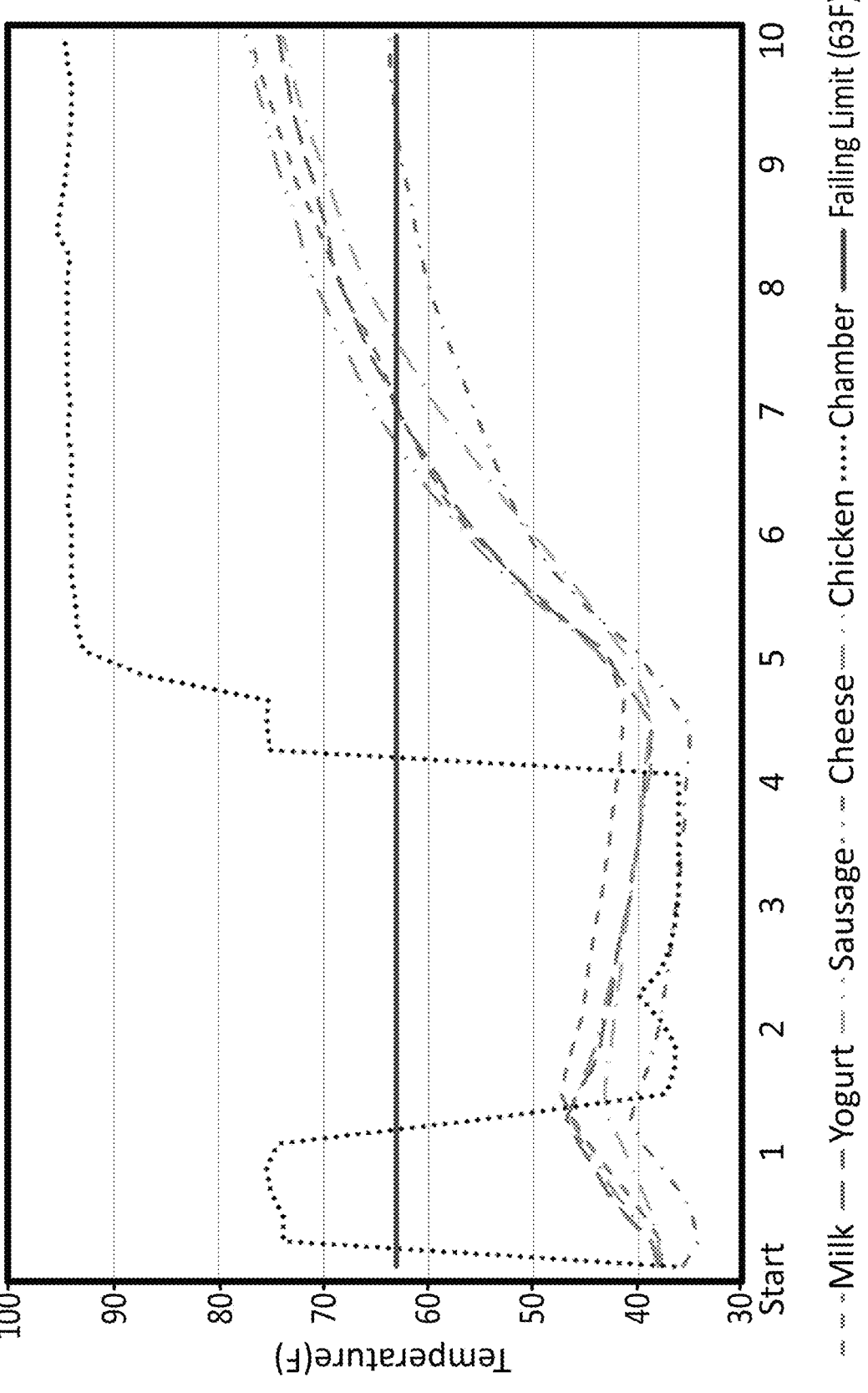
FIG. 26 is a graph showing test results of contents within the control bag.

FIGS. 24-26 show results for temperature testing of the bag 102 of FIG. 1 (referred to as the "Nano Bag" in FIG. 24) and a control bag, which was a common grocery bag made from Kraft paper.

During the testing, the bag 102 and the control bag were each filled with a payload of chicken, milk, sausage, cheese, and yogurt. Additionally, a frozen 12 fl. Oz. bottle of water was positioned in each of the bags as coolant. The bags were then placed inside of a thermal test chamber and subjected to the following temperature sequence, in order:

1 hour at 75 degrees Fahrenheit 3 hours at 35 degrees Fahrenheit 0.5 hours at 75 degrees Fahrenheit 5.5 hours at 95 degrees Fahrenheit FIG. 24 shows the average temperature of the payload within each of the bag 102 and the control bag. During the test, 63 degrees Fahrenheit was selected as the failing temperature based on established food safety guidelines. As shown, the average temperature of the contents of the control bag exceeded 63 degrees Fahrenheit 7.5 hours into the testing, which is approximately 3.5 hours after the temperature was increased from 35 degrees Fahrenheit. In comparison, the temperature within the bag 102 did not exceed 63 degrees Fahrenheit by the end of the test, roughly 6 hours after the temperature was increased from 35 degrees Fahrenheit.

FIG. 25 shows the test results for the individual components of the payload, including the milk, yogurt, sausage, cheese, and chicken, within the bag 102 while FIG. 26 shows the test results for the individual components of the payload in the control bag. For the bag 102, the milk exceeded 63 degrees Fahrenheit at approximately 7.75 hours into the test; the yogurt, sausage, and cheese exceeded 63 degrees Fahrenheit at between 9 and 10 hours into the test; and the chicken did not exceed 63 degrees Fahrenheit during the test. In comparison, for the control bag, the milk, yogurt, and chicken exceeded 63 degrees Fahrenheit between 6 and 7 hours into the test; the sausage exceeded 63 degrees Fahrenheit at approximately 7.5 hours into the test; and the cheese exceeded 63 degrees Fahrenheit between 9 and 10 hours into the test.

Figure 27:
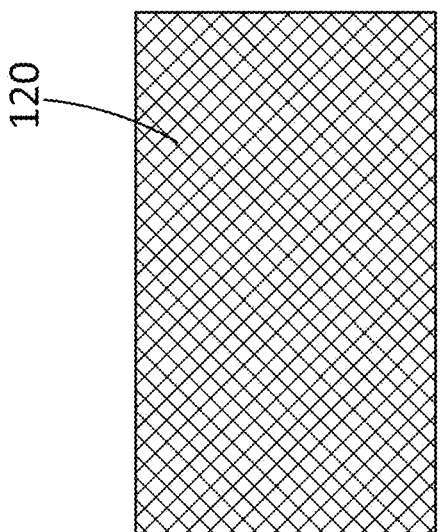
FIG. 27 is an exploded view of a multi-sheet blank comprising an inner sheet and an outer sheet in accordance with another aspect of the present disclosure.
Figure 27:
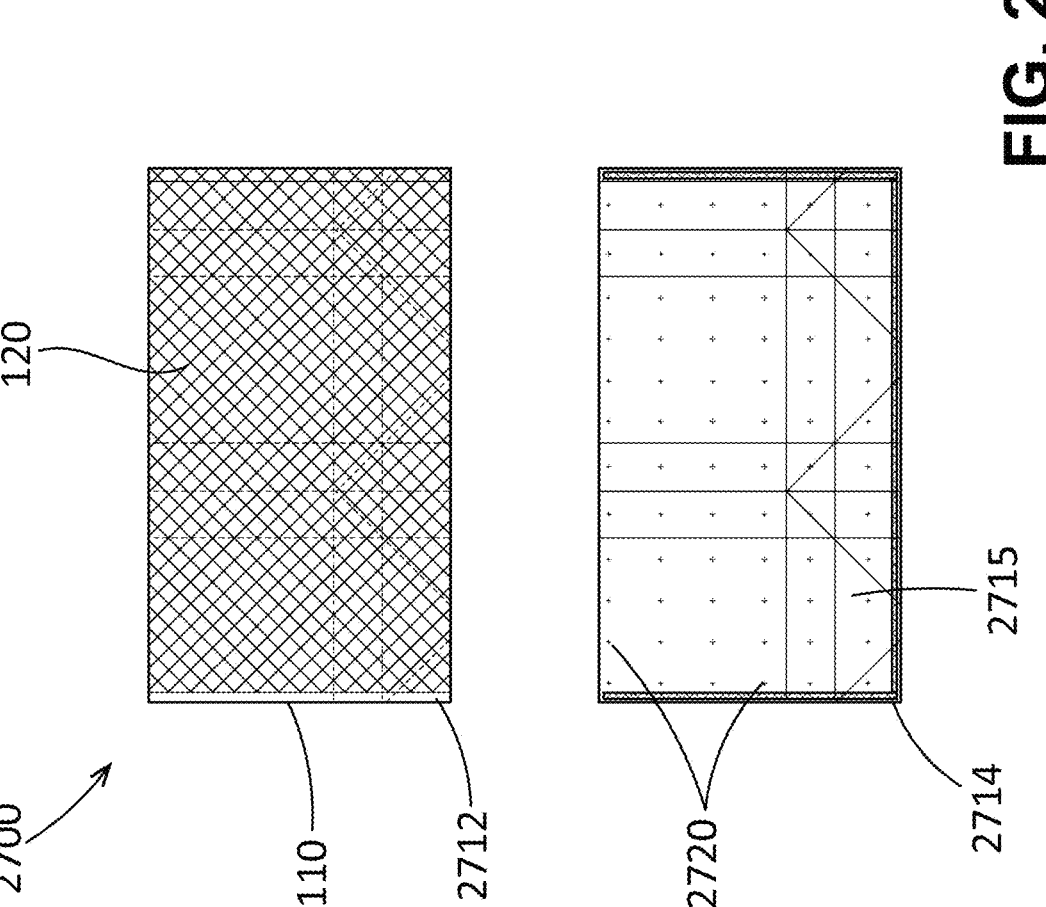

FIGS. 27-34 relate to a multi-sheet form of the bag 102, such as a multi-sheet bag, or multi-ply bag, 3000 (shown in FIG. 30) in accordance with another aspect of the present disclosure. FIG. 27 shows an exploded view of a multi-sheet blank 2700, or multi-ply blank, of the multi-sheet bag 3000. The dimensions shown are merely exemplary and should not be viewed as limiting.

In the aspect shown in FIG. 27, the multi-sheet blank 2700 can be a duplex blank 2710, which can comprise two sheets 2712,2714. The sheet 2712 can be referred to as an inner sheet 2712. The sheet 2714 can be referred to as an outer sheet 2714. In some aspects, the multi-sheet blank 2700 can comprise more than two sheets. In such aspects, the blank 2710 can further comprise one or more interior sheets (not shown) positioned between the inner sheet 2712 and the outer sheet 2714.

The inner sheet 2712 can be substantially similar to the blank 1330 (shown in FIG. 13), and the inner sheet 2712 can comprise the base layer 110 and the film 120. In various aspects, the inner sheet 2712 can be constructed similarly to any of the aspects shown and described with respect to FIGS. 5-7. The film 120 (depicted as a hatched pattern) is shown placed atop the base layer 110, which is exposed along a left edge (with respect to the present viewing angle) of the inner sheet 2712. A separate, standalone example of the film 120 is also shown at a top right side of the page.

With respect to the outer sheet 2714, one or more adhesives 2720 can be deposited on an inner surface 2715 of the outer sheet 2714. The outer sheet 2714 is further shown and discussed with respect to FIG. 28.

Figure 28:
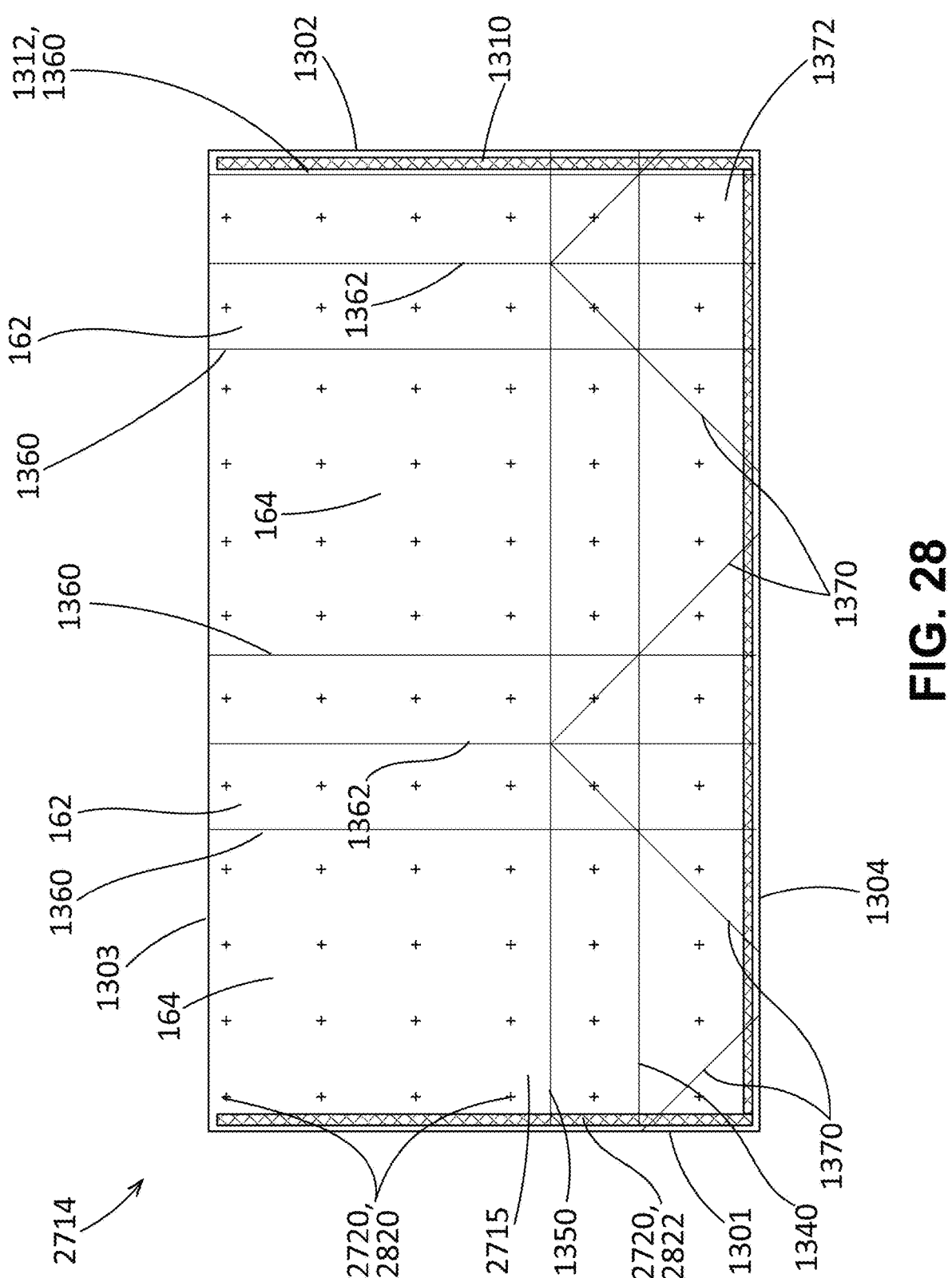
FIG. 28 is a plan view of the outer sheet of FIG. 27.

Turning to FIG. 28, the outer sheet 2714 can be substantially similar to the base layer 110. For example and without limitation, the outer sheet 2714 can comprise a fibrous material, such as paper. In some aspects, the outer sheet 2714 can comprise Kraft paper. In some aspects, the outer sheet 2714 can comprise a different material, such as corrugated cardboard, posterboard, or any other suitable material.

The positioning of the various fold lines 1312,1340,1350, 1360, 1362, 1370, panels 162, 164, subpanels 1372, and connecting strip 1310 can be substantially similar to the layout of the blank 1330, shown in FIG. 3. The dimensions shown are exemplary and should not be viewed as limiting.

As noted above, one or more adhesives 2720 can be deposited on the inner surface 2715. The one or more adhesives 2720 can attach the outer sheet 2714 to the inner sheet 2712 (shown in FIG. 27). Specifically, the outer sheet 2714 can be attached to the inner sheet 2712 on the opposite side from the film 120 (shown in FIG. 27), with the inner surface 2715 facing the inner sheet 2712.

A first adhesive pattern 2820 of the one or more adhesives 2720 can comprise a plurality of dots of adhesive, such as glue for example and without limitation, spaced between the first end 1301 and the second end 1302 and from the top end 1303 to the bottom end 1304. In the present aspect, the dots of adhesive of the first adhesive pattern 2820 can be organized into columns and rows. In some aspects, the rows and columns can be offset, rather than aligned, such as in an alternating pattern. For example, the dots can be placed in a diamond pattern.

The first adhesive pattern 2820 can secure the outer sheet 2714 to the inner sheet 2712 while providing a gap, or void, between the sheets 2712,2714, which can be filled with air.

A second adhesive pattern 2822 of the one or more adhesives 2720 can comprise one or more strips of adhesive (shown as strips with a spaced pattern of "x" markings) extending along the first end 1301, the second end 1302, and the bottom end 1304. The strips of adhesive can be continuous or broken. For example and without limitation, a first continuous strip can extend along the first end 1301 from the top end 1303 to the bottom end 1304, a second continuous strip can extend along the bottom end 1304 from the first end 1301 to the second end 1302, and a third continuous strip can extend along the second end 1302 from the top end 1303 to the bottom end 1304. In various aspects, these strips can intersect to form one continuous strip or can be spaced apart from one another. In some aspects, the second adhesive pattern 2822 can also extend along the top end 1303 from the first end 1301 to the second end 1302. In such aspects, gaps can be defined in the second adhesive pattern 2822 and/or either or both of the inner sheet 2712 and the outer sheet 2714 can define one or more perforations configured to allow air to pass into the void and out from the void between the two sheets 2712,2714. In some aspects, a perimeter of the sheets 2712,2714 can be fully sealed, and air can be trapped between the sheets 2712,2714 in the void.

The adhesives of the respective patterns 2820,2822 can be the same or different from one another. For example and without limitation, either or both patterns 2820,2822 can be defined by a glue. In some aspects, a different type of adhesive can be used. For example and without limitation, a tape, such as a double-sided tape, can be utilized for one or both of the patterns 2820,2822. In some aspects, double-sided tape can be used along the edges to of the sheets 2712,2714 to define the second adhesive pattern 2822.

Figure 29:
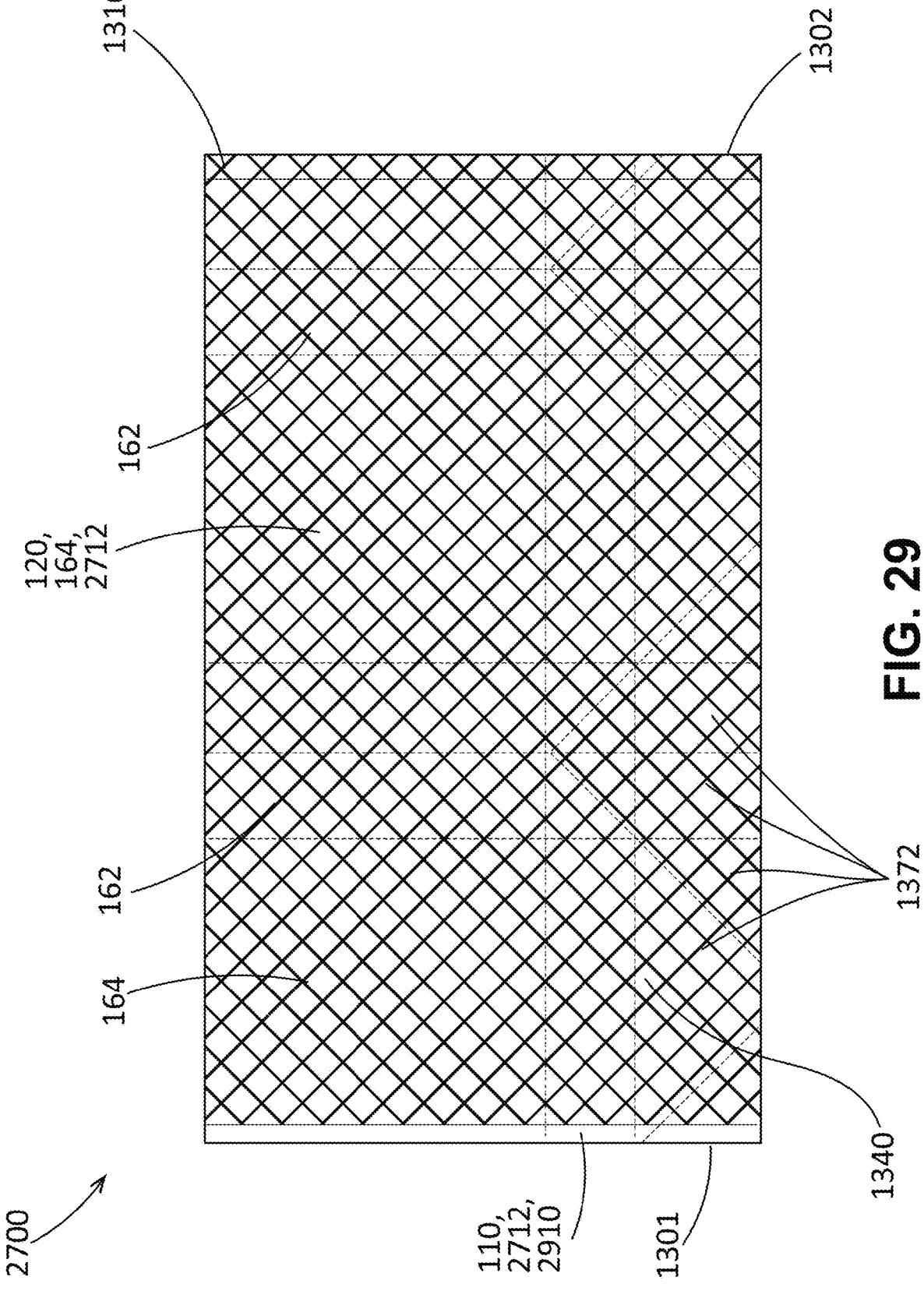
FIG. 29 is a plan view of the multi-sheet blank of FIG. 27 in an assembled state.

FIG. 29 shows the multi-sheet blank 2700 in an assembled state, facing the film 120 of the inner sheet 2712. The inner sheet 2712 can define substantially the same fold lines, panels, and sub-panels as the outer sheet 2714 (shown in FIG. 28). The film 120 can be sized smaller in width than the base layer 110 of the inner sheet 2712, and a strip 2910 of the base layer 110 can be exposed along the first end 1301, opposite from the connecting strip 1310 at the second end 1302. To assemble the multi-sheet bag 3000 (shown in FIG. 3) from the multi-sheet blank 2700, the multi-sheet blank 2700 can be folded, and the strip 2910 can be adhered to the connecting strip 1310. Specifically, the strip 2910 can be adhered to a portion of the connecting strip 1310 defined by the outer sheet 2714.

Figure 30:
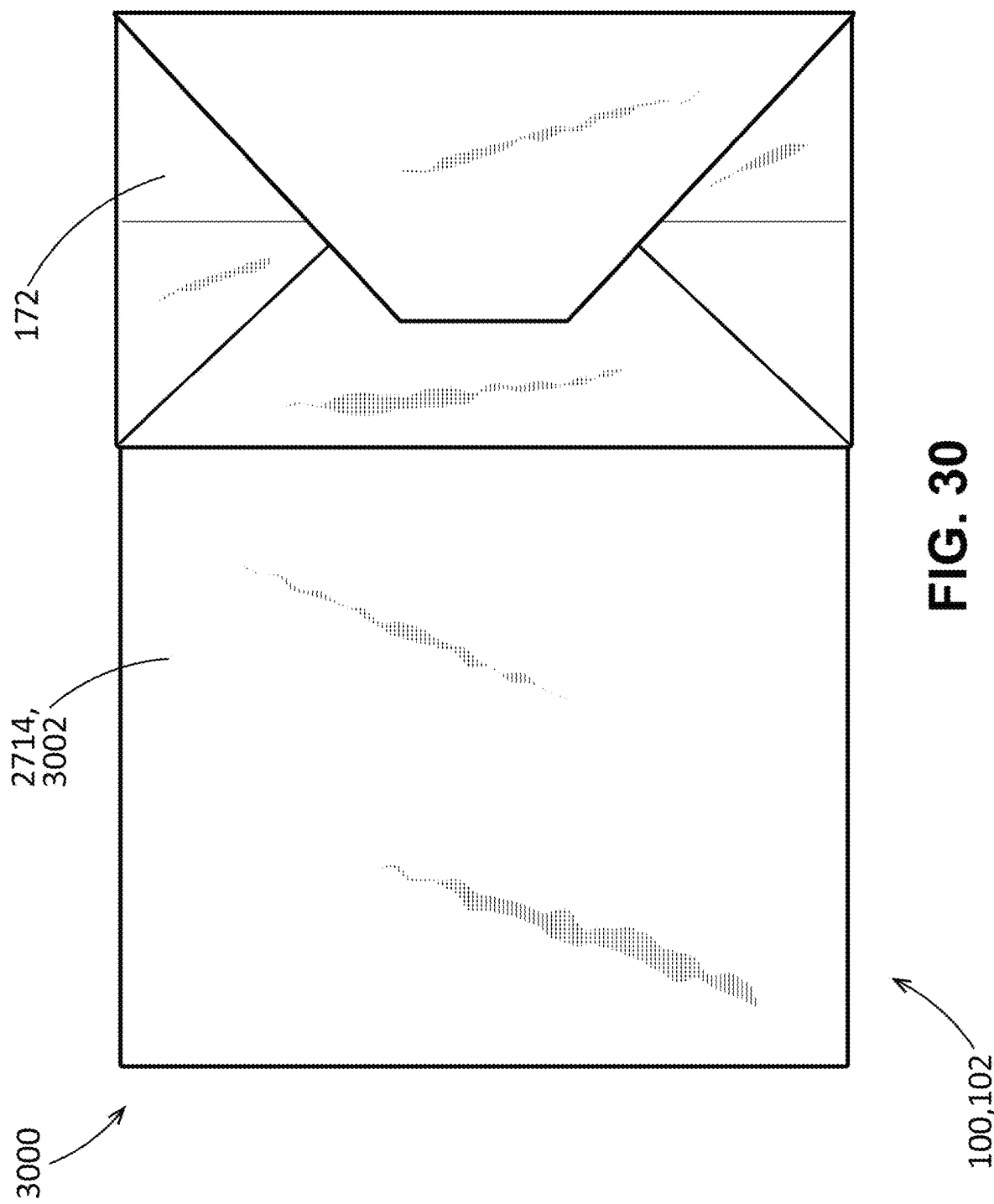
FIG. 30 is a front view of a multi-sheet bag assembled from the multi-sheet blank of FIG. 27 in accordance with another aspect of the present disclosure.
Figure 31:
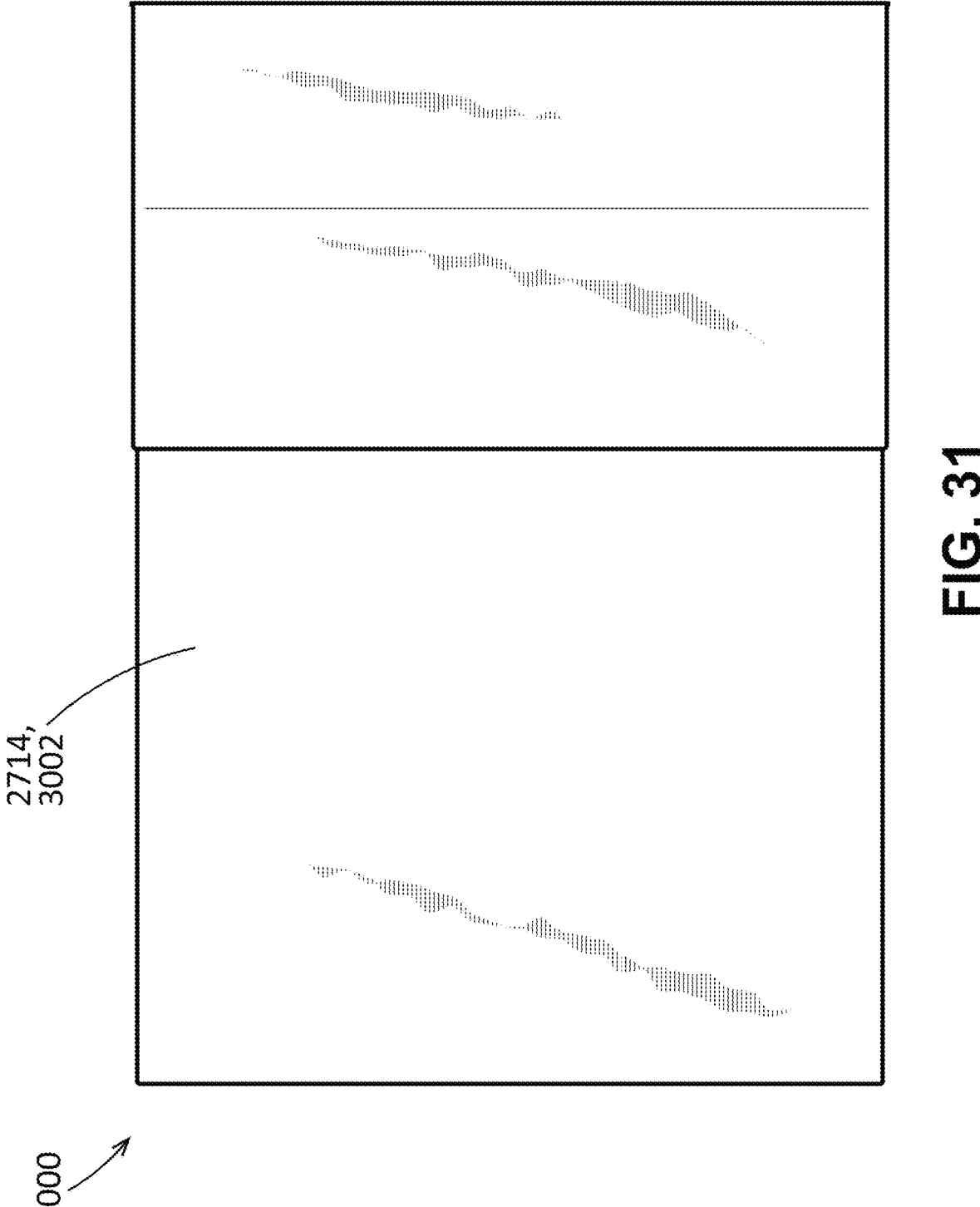
FIG. 31 is a rear view of the multi-sheet bag of FIG. 30.

The bottom subpanels 1372 that are attached to the side panels 162 can be folded towards one another about the bottom fold line 1340. The bottom subpanels 1372 that are attached to the main panels 164 can be folded about the bottom fold line 1340 to overlap and attach together to form the bottom panel 172, as shown by the multi-sheet bag 3000 in FIG. 30. FIG. 31 shows the opposite side of the multi-sheet bag 3000. As shown in FIGS. 30 and 31, an exterior surface 3002 of the multi-sheet bag 3000 can be defined by the outer sheet 2714.

FIGS. 32-35 are top views of the multi-sheet bag 3000. An interior surface 3204 of the multi-sheet bag 3000 can define a cavity 3201 within the multi-sheet bag 3000. The interior surface 3204 can be defined by the film 120 of the inner sheet 2712. As shown, the interior surface 3204 can be reflective.

Figure 32:
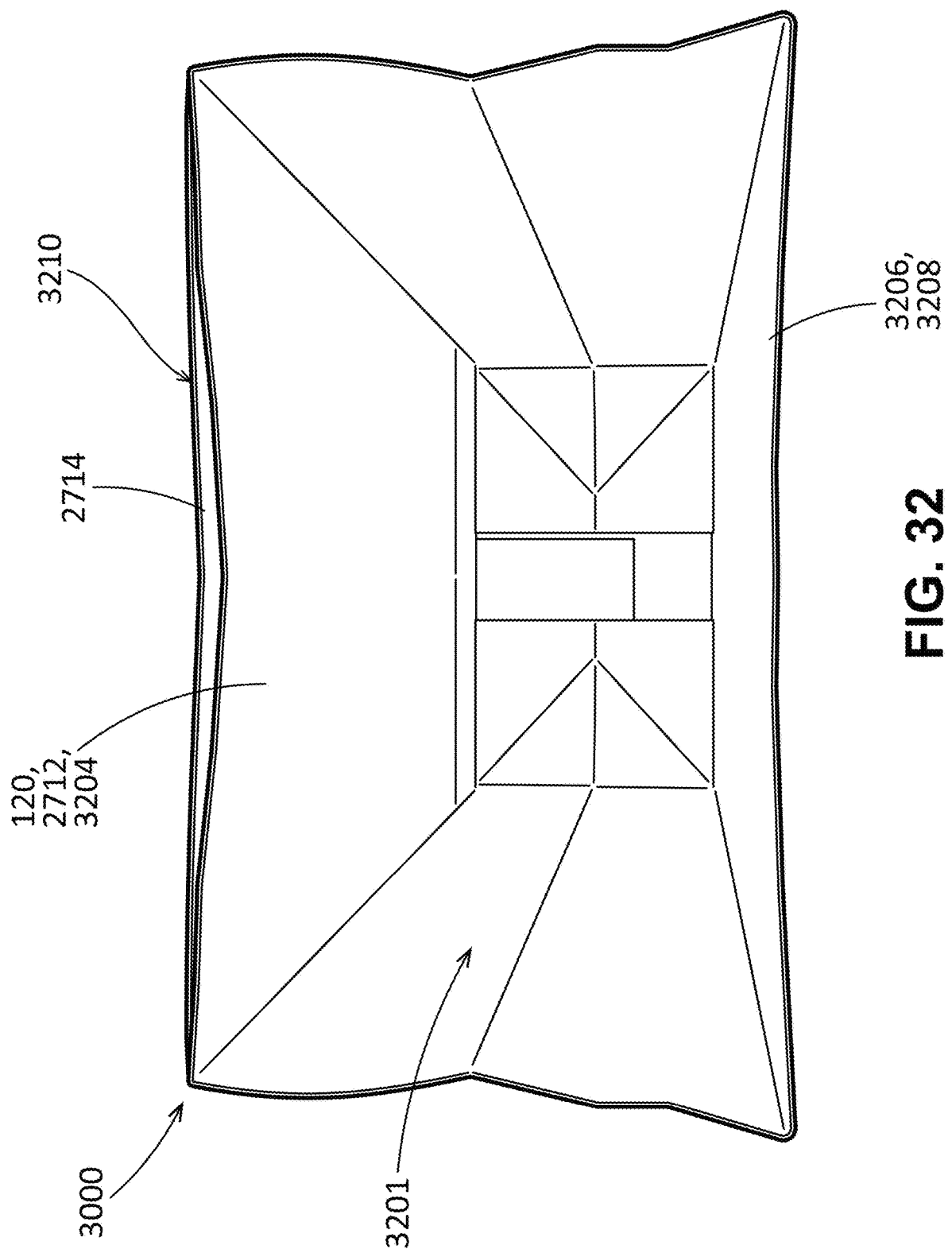
FIG. 32 is a top view of the multi-sheet bag of FIG. 30.

As shown by FIG. 32, a top end 3206 of the multi-sheet bag 3000 can define an opening 3208 to the cavity 3201. As demonstrated by an upper portion, with respect to the present viewing aspect, a gap or void 3210 can be present between the inner sheet 2712 and the outer sheet 2714, and air can be retained between the sheets 2712,2714 to further insulate the cavity 3201. As shown, the void 3210 can be open at the top end 3206 in the present aspect. In some aspects, the void 3210 can be sealed at the top end 3206. In such aspects, the void 3210 can be completely sealed or the void 3210 can be vented, or otherwise open, in another location. In some aspects, the void 3210 can be selectively vented. For example and without limitations, a vent (not shown) can be defined between the void 3210 and the external atmosphere, and the vent can be selectively sealable. In some aspects, the vent can be sealed by placing a sticker, adhesive, tape, film, membrane, or other suitable sealing material over the vent to seal the void 3210.

Figure 33:
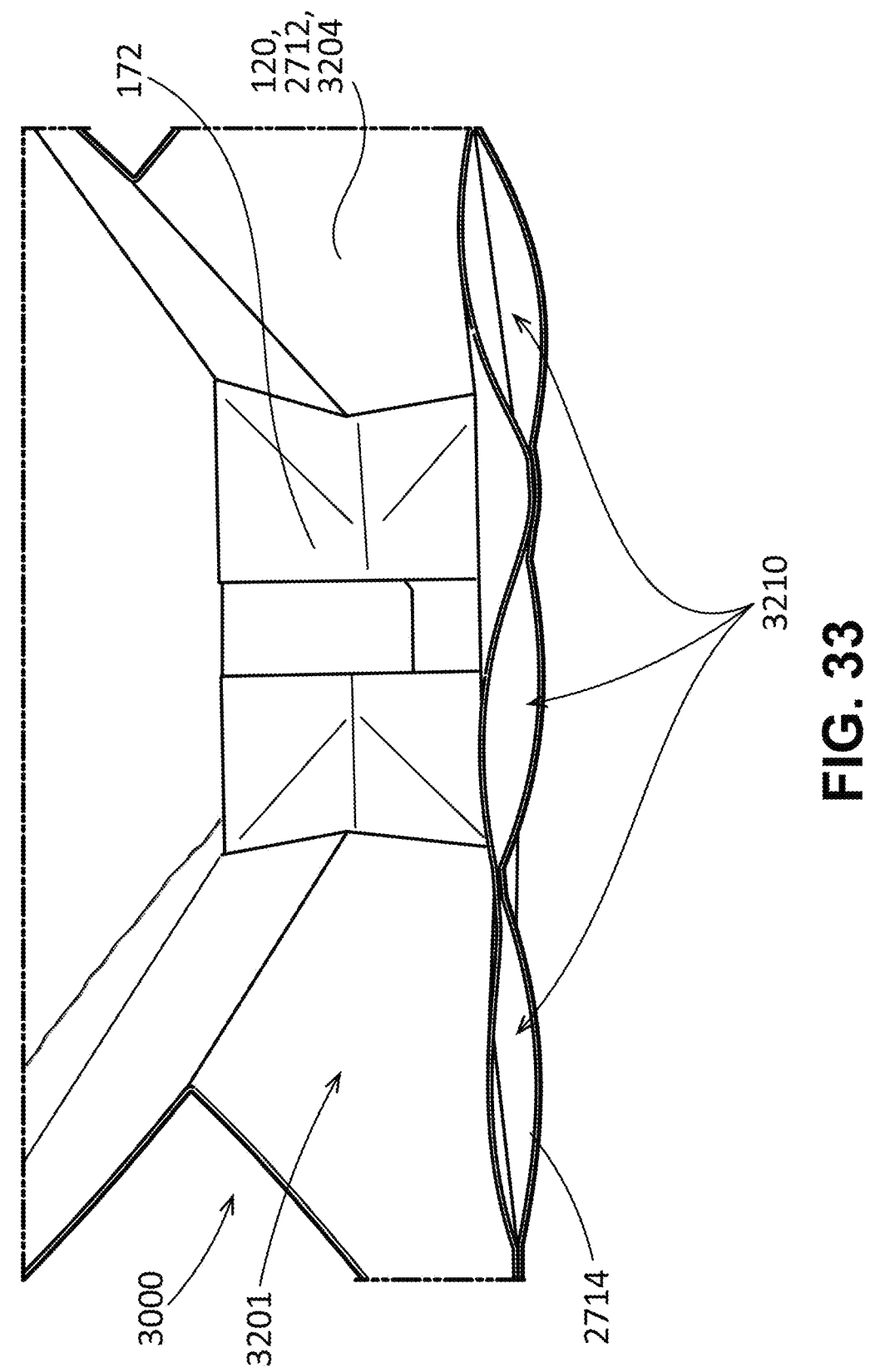
FIG. 33 is a top view of the multi-sheet bag of FIG. 30.
Figure 34:
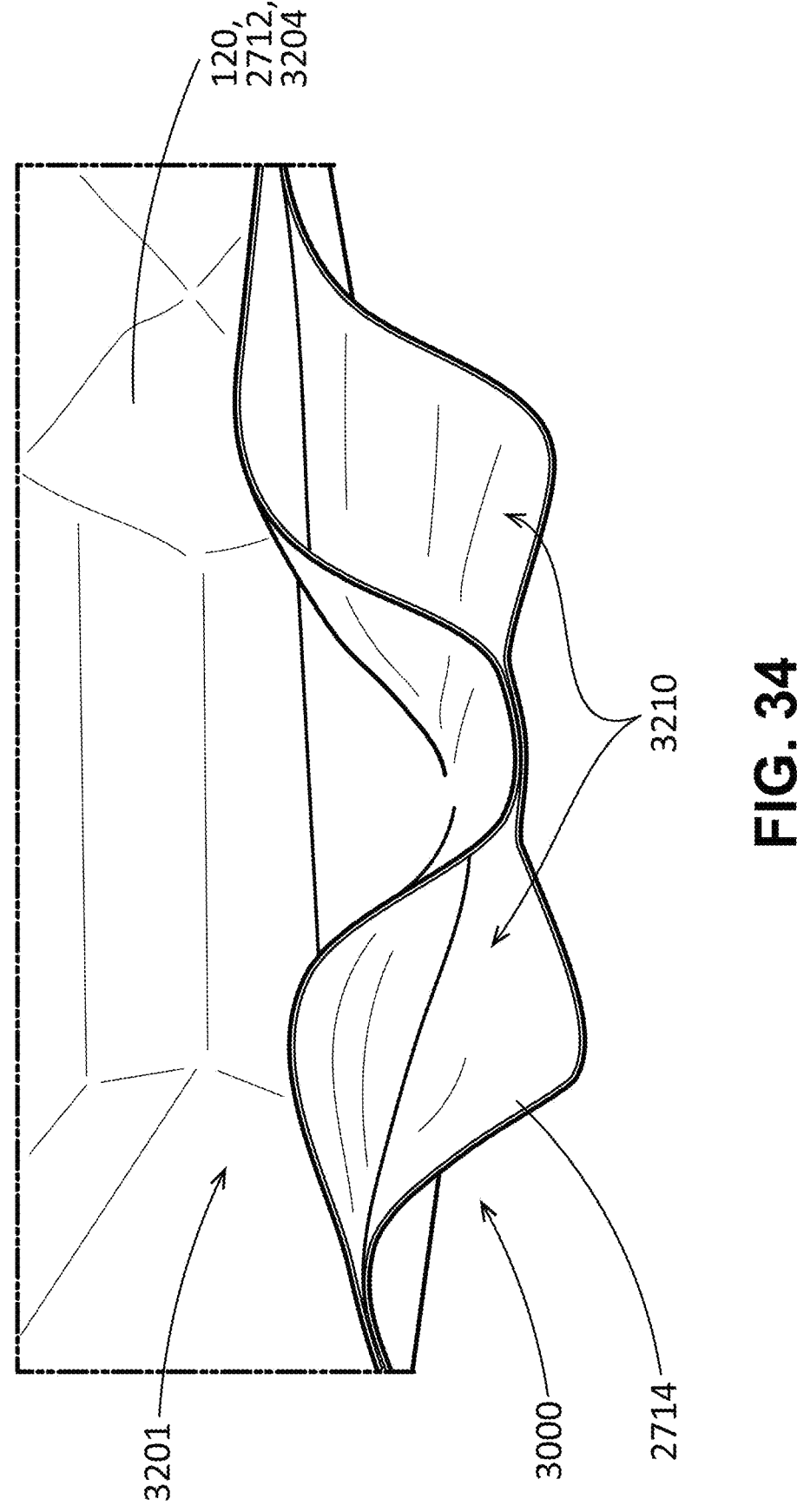
FIG. 34 is a top view of the multi-sheet bag of FIG. 30.

FIGS. 33 and 34 show detail views of the top end 3206 of the multi-sheet bag 3000, showing the gap or void 3210 between the sheets 2712,2714. In FIG. 34, a portion of the multi-sheet bag 3000 is pinched together to further expand the void 3210 and demonstrate a shape of the void 3210 around the dots of adhesive of the first adhesive pattern 2820 (shown in FIG. 28). The distribution of the first adhesive pattern 2820 can define the shape of the void 3210 as a square-shaped, rectangular-shaped, or diamond-shaped grid pattern, for example and without limitation. The grid pattern can be interconnected in some aspects. In some aspects, the void 3210 can comprise a plurality of isolated pockets, or cavities. For example and without limitation, in some aspects, the first adhesive pattern 2820 can be distributed in strips, which can define a plurality of flutes (not shown) of the void 3210. In some aspects, separate panels of the multi-sheet bag 3000 can define separate cavities of the void 3210. Air within the void 3210 can reduce heat transfer between the two sheets 2712,2714.

Figure 35:
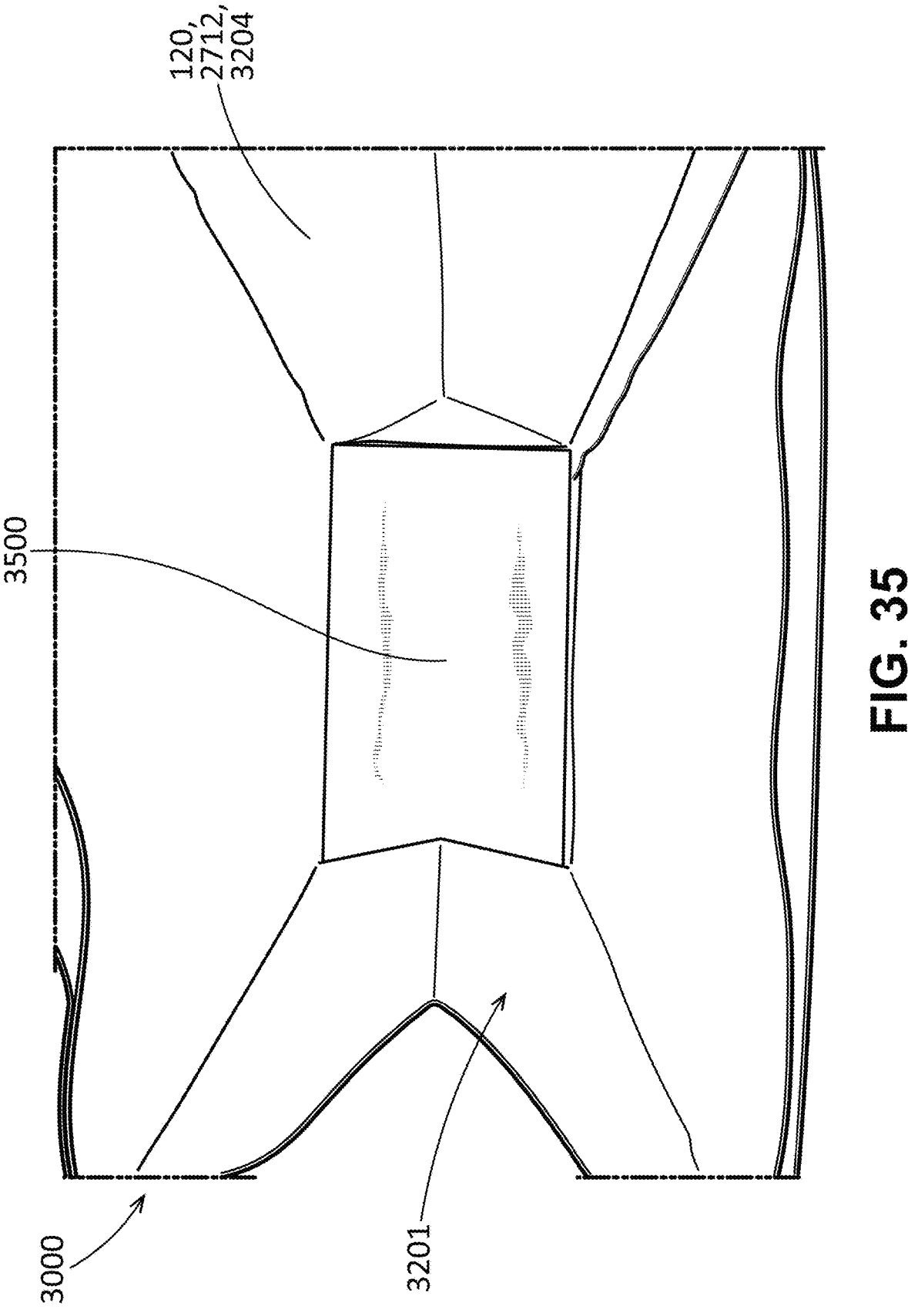
FIG. 35 is a top view of the multi-sheet bag of FIG. 30 with a pad positioned within a cavity of the multi-sheet bag in accordance with another aspect of the present disclosure.
Figure 36:
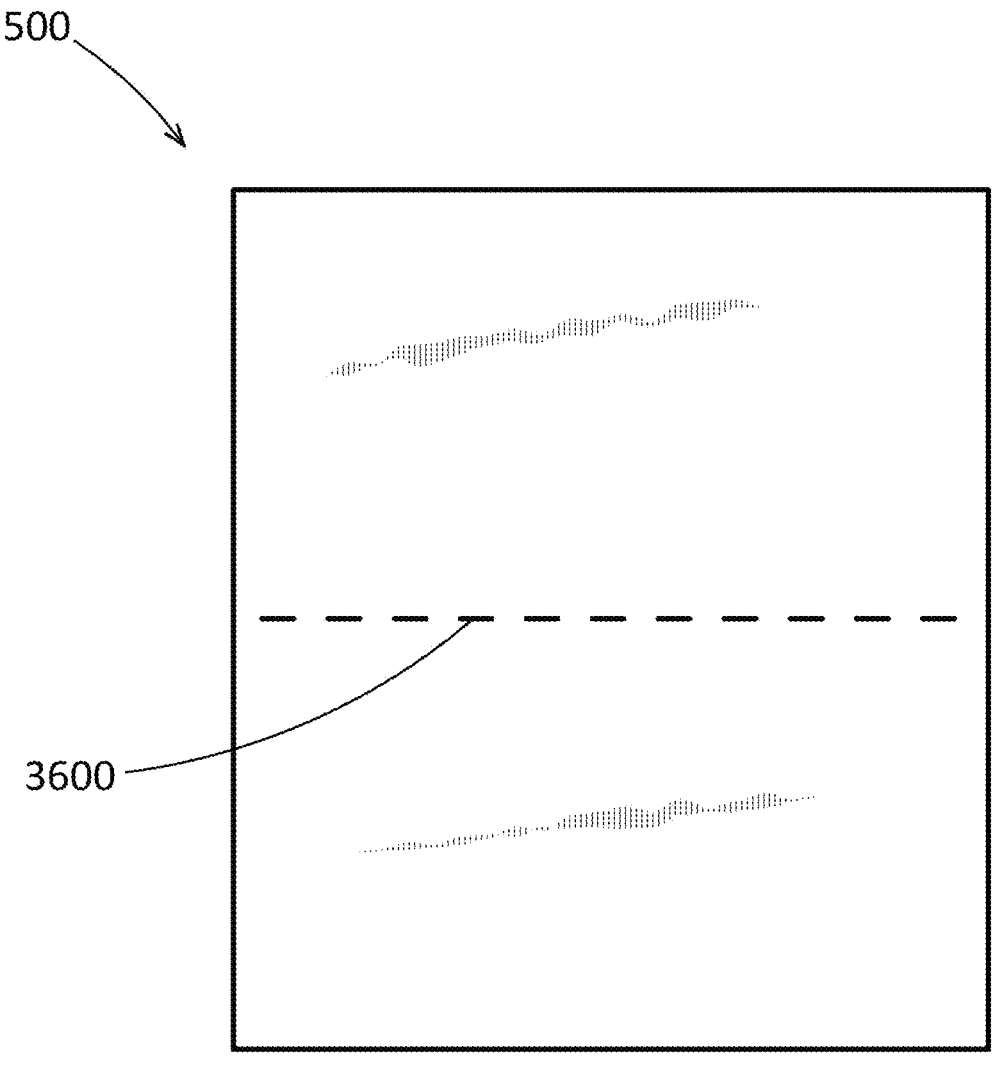
FIG. 36 is a plan view of the pad of FIG. 35.
Figure 37:
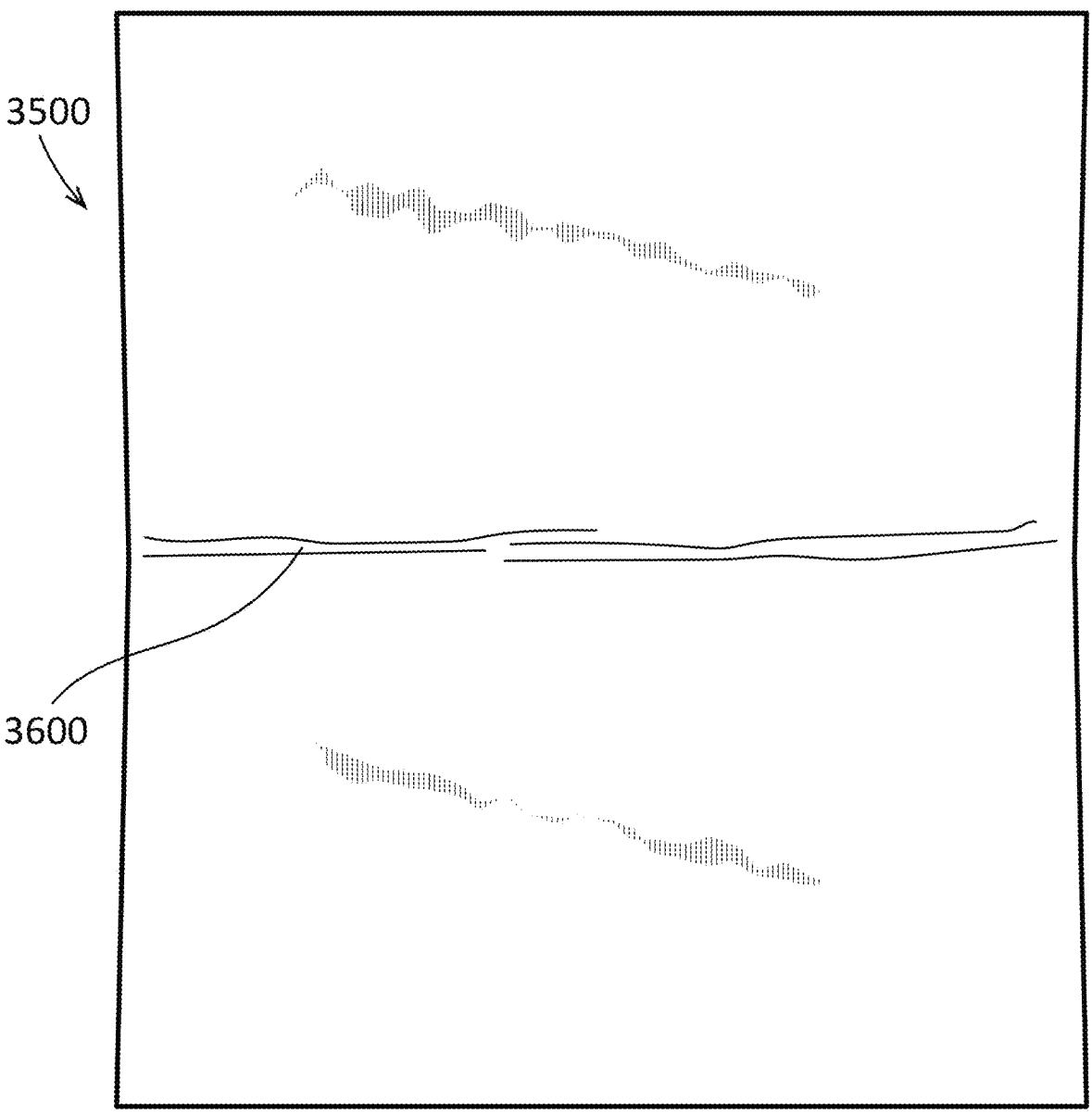
FIG. 37 is a plan view of the pad of FIG. 35.
Figure 38:
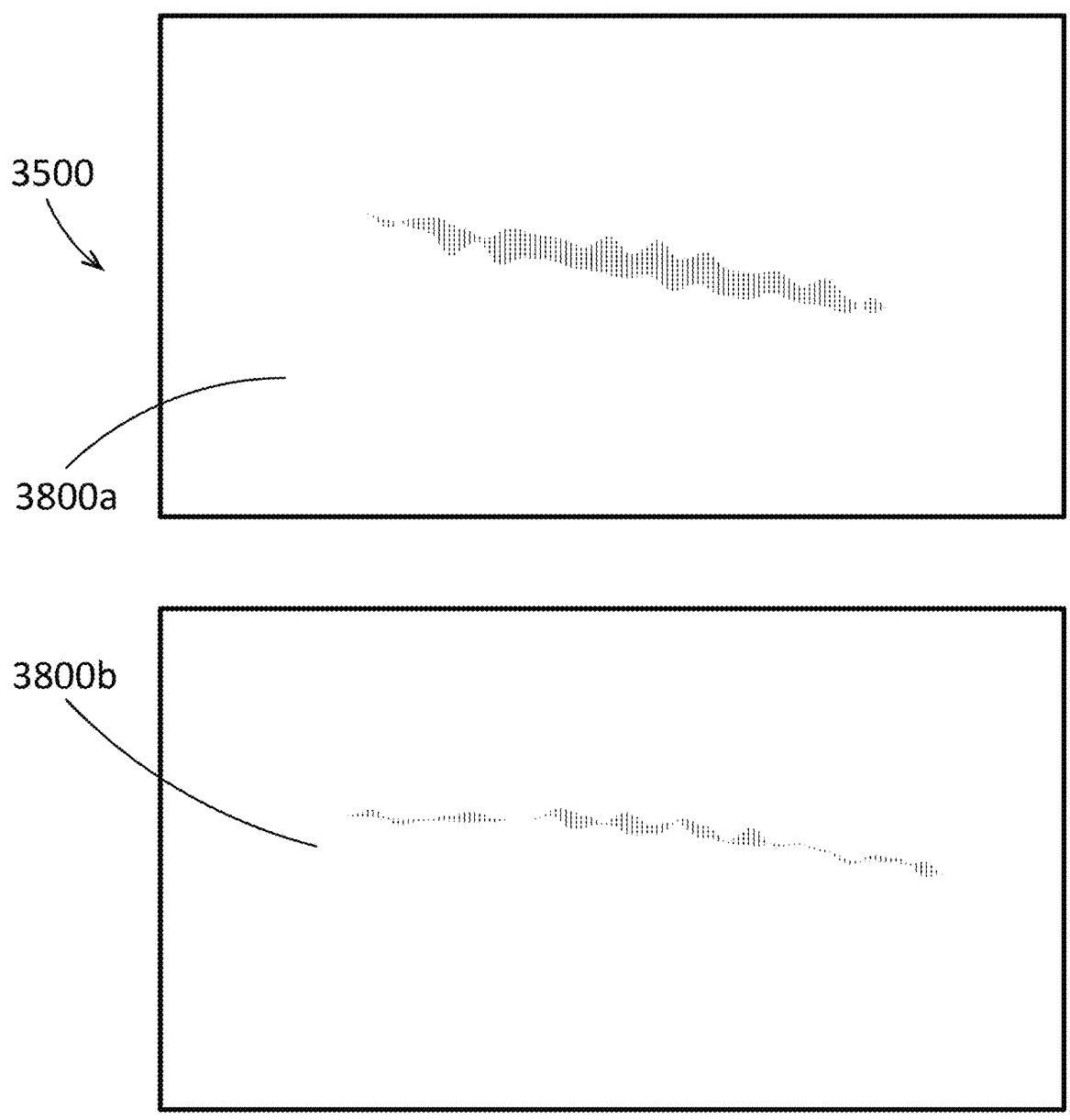
FIG. 38 is a plan view of the pad of FIG. 35 separated in two along a line of weakness of the pad to form two separate pads in accordance with another aspect of the present disclosure.

FIG. 35 shows a top view of the multi-sheet bag 3000 with a pad 3500 positioned on the bottom panel 172 within the cavity 3201. FIGS. 36 and 37 show an exemplary aspect of the pad 3500 with exemplary dimensions, which should not be viewed as limiting. As shown, the pad 3500 can define a line of weakness 3600, such as a cut, score, crease, series of perforations, or other suitable feature. The line of weakness 3600 can be configured to facilitate folding and/or tearing the pad 3500. FIG. 38 demonstrates an aspect of the pad 3500, which has been torn into two separate smaller pads 3800a,b along the line of weakness (shown in FIG. 36). The line of weakness 3600 can substantially bisect the pad 3500. In the aspect shown in FIG. 35, the pad 3500 can be folded in half and positioned within the cavity 3201 on the bottom panel 172 of the multi-sheet bag 3000.

The pad 3500 can comprise corrugated material, such as corrugated cardboard for example and without limitation. The pad 3500 can provide thermal insulation to contents within the cavity 3201 of the multi-sheet bag 3000, such as to limit transfer through the bottom panel 172 (shown in FIG. 30) of the multi-sheet bag 3000. Folding the pad 3500 in half can provide additional protection and insulation to the bottom of the multi-sheet bag 3000. In aspects wherein additional protection or insulation is not desired, a single half of the pad 3500, such as either of the two separate smaller pads 3800*a,b*, can be utilized. This arrangement can be desirable to reduce weight and material usage.

Figure 39:
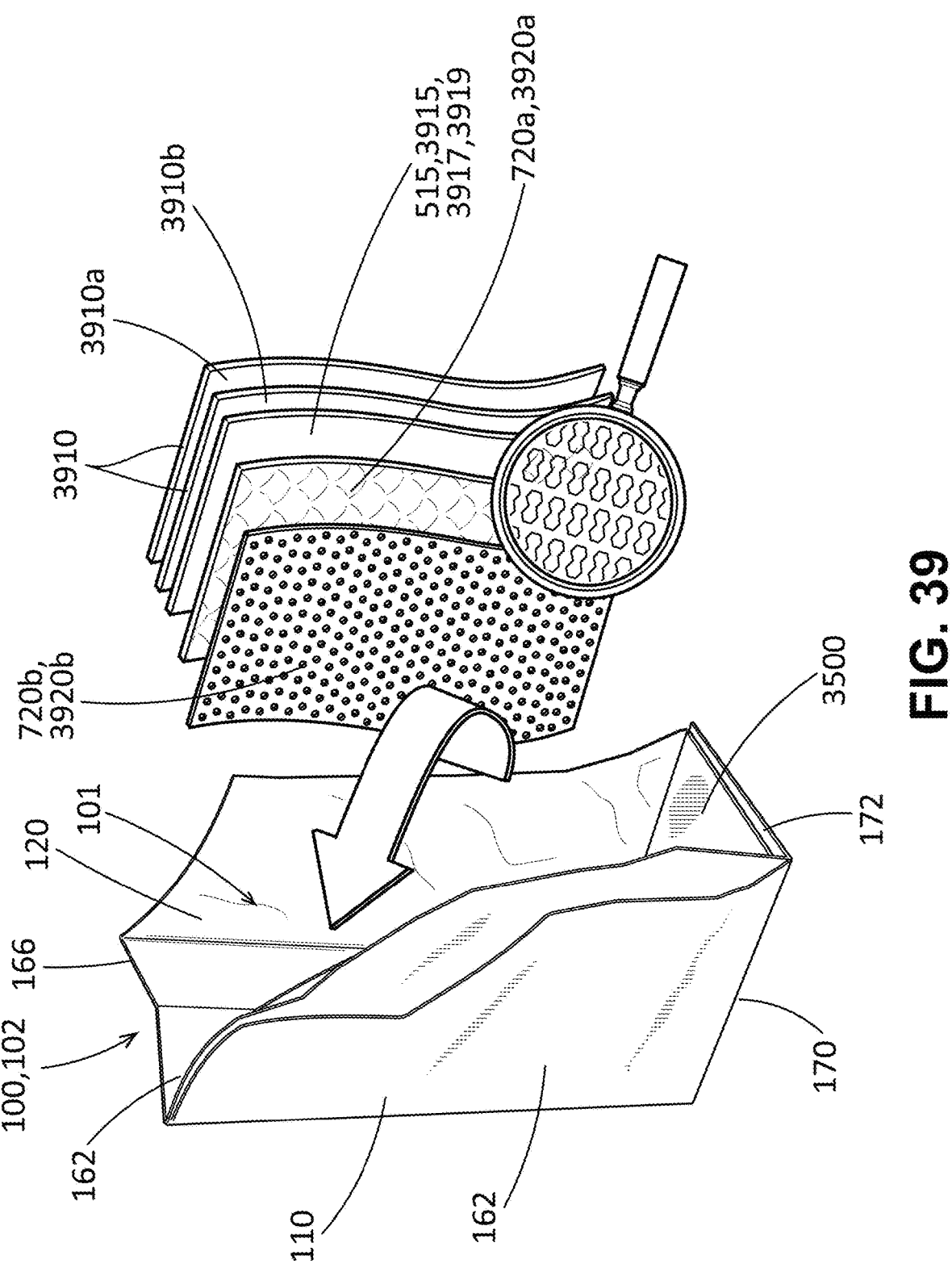
FIG. 39 is a schematic of the bag in accordance with another aspect of the present disclosure.

FIG. 39 illustrates a schematic of the container 100 in accordance with another example aspect of the disclosure. The container 100 can be the bag 102, for example. The bag 102 can define the pair of opposing side panels 162 and the pair of opposing main panels 164. The pair of opposing side panels 162 and the pair of opposing main panels 164 can define the top end 166 and the bottom end 170 of the bag 102. The bag 102 can further comprise the bottom panel 172 disposed at the bottom end 170 thereof. As shown, the bag 102 can comprise the base layer 110, which in the present aspect can be formed from two paper layers 3910—an outer paper layer 3910*a* and an inner paper layer 3910*b*. In other aspects, the base layer 110 can comprise more or fewer paper layers 3910.

The bag 102 can further comprise the film 120 applied to the base layer 110. The film 120 can face and define the cavity 101 of the bag 102, as shown. In example aspects, the film 120 can comprise the reflective layer 720*a* and the protective layer 720*b* positioned over the reflective layer 720*a*, as previously described. The reflective layer 720*a* can be a thermally treated material 3920*a*, and the protective layer 720*b* can be an FDA certified layer 3920*b*. The FDA certified layer 3920*b* of the film 120 can be the innermost layer of the bag 102 and can define the cavity 101. It can thus be safe for the inside of the bag 102 to contact the contents received within the cavity 101. The reflective layer 720*a* can be disposed between the protective layer 720*b* and the base layer 110. The film 120, and specifically the reflective layer 720*a* can have low emissivity and high reflectivity to improve the insulation of the bag 102.

In example aspects, the bag 102 can further comprise one or more intermediate layers 3915 disposed between the base layer 110 and the film 120. For example, in the present aspect, the intermediate layers 3915 can comprise a first intermediate layer 3917, which can be the intermediary layer 515. The first intermediate layer 3917 can be a treated substrate layer 3919, which can comprise a polyester film in the present aspect. In other aspects, the treated substrate layer 3919 can comprise a starch-based film, such as a plant-based starch film, or any other suitable material known in the art. The reflective layer 720*a* of the film 120 can be disposed between the first intermediate layer 3917 and the protective layer 720*b* of the film 120, and either or both of the first intermediate layer 3917 and the protective layer 720*b* can be configured to protect the reflective layer 720*a* from various factors, such as from oxidation or mechanical abrasion for example and without limitation, that might degrade the emissivity of the reflective layer 720*a*.

Example aspects of the container 100 can further comprise the pad 3500 positioned within the cavity 101 on the bottom panel 172 of the bag 102. The pad 3500 can provide further thermal insulation and reinforcement to the bottom panel 172. Contents, such as groceries or other food items for example and without limitations, can be received within the cavity 101 and supported on the pad 3500. Other aspects of the container 100 may not comprise the pad 3500, and the contents can be supported directly on the bottom panel 172.

The container 100 can provide various benefits. For example, the container 100 can be water-resistant or water-proof in some aspects, which can improve the performance of the container 100 in wet weather conditions, such as humidity, rain, or snow, and/or if condensation or a leak should occur within the cavity 101 of the bag 102. In some aspects, the film 120 can be substantially water-resistant and/or the paper base layer 110 can be treated to be substantially water-resistant. The container 100 furthermore can optionally be provided with a coolant disposed within the cavity 101 to further improve the refrigeration of the bag 102. That is, a coolant, such as dry ice, a frozen ice pack, or a frozen gel pack for example and without limitation, can optionally be provided within the cavity 101 to decrease the temperature within the cavity 101 and/or to prolong the refrigeration of the contents therein. In some aspects, the bag 102 can perform suitably (e.g., stay below 63° within the cavity 101) in high temperature conditions (e.g., around about) 90° for up to or beyond about 7 hours without a coolant, and up to or beyond about 12 hours with a coolant. Another advantage of the container 100 is that it can be entirely recyclable, including the film 120 and the pad 3500, and a recipient of the container 100 can easily recycle the container 100 via standard curbside pickup. In some aspects, the paper material of the bag 102 (e.g., the paper base layer 110 and the pad 3500 or portions thereof) can be made from 100% recycled paper material. The container 100 can also be repulpable in example aspects. That is, the container 100 can be converted back into paper pulp after recycling and then formed as a new paper product, with any non-paper materials of the container 100 being filtered out in the repulping process. Furthermore, the paper base layer 110, and specifically the outer paper layer 3910*a*, can be easily customized with unique branding. The outer paper layer 3910*a* can provide a blank canvas on which custom indicia can be printed or otherwise applied (such as by adhesive labels or the like).

Additionally, the multiple layers of the bag 102, as well as the optionally-provided pad 3500, can increase the strength and structural durability of the container 100 to better support heavy contents therein. For example, in some aspects, the container 100 can support up to or beyond about 25 lbs of food items or other contents. The one-piece design of the bag 102 can simplify the manufacturing process and the use of the container 100. For example, the bag 102 can be manufactured as a singular blank, and can simply be folded and sealed in the bag configuration. The container 100 can then ready for use by merely opening the bag 102 and inserting the contents into the cavity 101. Furthermore, the bag 102 can stand upright on its own to streamline setting up the bag 102 and loading the contents therein. The bag 102 can also be lightweight, easy to handle, and can define a small footprint. The bag 102 can be folded flat for efficient storage and shipping and can take up minimal space at an assembly station or register counter. For example, in some aspects, the small footprint of the bag 102 can allow for about twenty five hundred (2500) of the bags 102 to be stacked on a single pallet, as compared to only about one thousand (1000) bubble-style food packaging bags. Thus, if a method of transport, such as a truck, can support one pallet, only one truck would be required to transport twenty five hundred of the bags 102, while three trucks would be required to support the same amount of bubble-style food packaging bags.

One should note that conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more particular embodiments or that one or more particular embodiments necessarily include logic for deciding, with or without user input or prompting, whether these features, elements and/or steps are included or are to be performed in any particular embodiment.

It should be emphasized that the above-described embodiments are merely possible examples of implementations, merely set forth for a clear understanding of the principles of the present disclosure. Any process descriptions or blocks in flow diagrams should be understood as representing modules, segments, or portions of code which include one or more executable instructions for implementing specific logical functions or steps in the process, and alternate implementations are included in which functions may not be included or executed at all, may be executed out of order from that shown or discussed, including substantially concurrently or in reverse order, depending on the functionality involved, as would be understood by those reasonably skilled in the art of the present disclosure. Many variations and modifications may be made to the above-described embodiment(s) without departing substantially from the spirit and principles of the present disclosure. Further, the scope of the present disclosure is intended to cover any and all combinations and sub-combinations of all elements, features, and aspects discussed above. All such modifications and variations are intended to be included herein within the scope of the present disclosure, and all possible claims to individual aspects or combinations of elements or steps are intended to be supported by the present disclosure.

That which is claimed is:

1. A repulpable multiple-ply container adapted for thermal management of a payload, the container comprising:
    a film layer defining an interior of the container configured to accept the payload therewithin, the film layer further configured to offer low emissivity and high reflectivity to radiant heat;
    a first paper layer coextensive with and continuously coupled to the film layer, the film layer and the first paper layer together providing an efficient combined R-value for thermal management within the interior of the container, the first paper layer having a first end, a second end, a top end, and a bottom end;
    a first adhesive pattern providing intermittent bonding points spaced between the first end and the second end and from the top end to the bottom end,
    a second adhesive pattern comprising a first strip of adhesive extending along the first end from the top end to the bottom end, a second strip of adhesive extending along the bottom end from the first end to the second end, and a third strip of adhesive extending along the second end from the top end to the bottom end; and
    a second paper layer coextensive with the first paper layer, intermittently bonded to the first paper layer opposite the film layer via the adhesive layer bonding points,
    wherein a plurality of air-filled gaps are created by the first paper layer, the second paper layer, and the adhesive layer bonding points further insulating the interior of the container while maintaining the repulpability of the container.

2. The repulpable multiple-ply container of claim 1, wherein the plurality of air-filled gaps at the top end are selectively sealable between a sealed and a vented configuration.

3. A container adapted for thermal management of a payload, the container comprising:
    a blank assembly comprising
        a first sheet assembly, the first sheet assembly comprising a base layer and a metallized film applied to the base layer, the metallized film comprising a reflective layer and a protective layer;
        a second sheet adhered to the base layer, the second sheet adhered to the base layer by an adhesive arranged at intermittent bonding points such that a plurality of voids are defined by the inner sheet assembly, the outer sheet assembly, and the adhesive, the intermittent bonding points organized into columns and rows between a first end and a second end and from a top end to a bottom end of the blank;
        wherein the plurality of voids define a plurality of air pockets, wherein at least one of the plurality of air pockets comprises a vent at the top end;
        wherein the blank assembly is defined from a plurality of wall panels, each wall panel being one of a main panel and a side panel;
    wherein the blank assembly is formed into the container by arranging the wall panels in end-to-end relationship to define a side wall of the container and by arranging a portion of the blank assembly as the bottom of the container such that the second sheet defines an outer surface of the container,
    wherein the metallized film is arranged to define an interior surface of the container, the interior surface defining a cavity configured to accept the payload therewithin, the metallized film further configured to offer low emissivity and high reflectivity to radiant heat;
    wherein the metallized film comprises a polymer;
    wherein each of the base layer and the second sheet are of paper;
    wherein each of the base layer, the second sheet, and the metallized film are repulpable.

4. The container of claim 3, wherein the vent is selectively sealable between a sealed and a vented configuration.

5. A blank for forming a multi-ply bag having an inner cavity, the blank comprising:
    an inner sheet, the inner sheet comprising a base layer having a first side and a second side opposite the first side, the inner sheet comprising a film coextensive with and coupled to the first side of the base layer; and
    an outer sheet coextensive with and coupled to the second side of the base layer by a first adhesive pattern deposited between the outer sheet and the base layer, the first adhesive pattern comprising a plurality of dots of adhesive between a first end and a second end and from a top end to a bottom end of the blank;
    a second adhesive pattern comprising at least one strip of adhesive extending along the first end, the second end, and the bottom end of the blank,
    a plurality of air pockets formed between the outer sheet and the base layer, the plurality of air pockets defined by the first adhesive pattern, wherein the plurality of air pockets insulate the blank, wherein at least one of the plurality of air pockets at the top end of the blank is configured as a vent, wherein the blank is configured to be folded into the multi-ply bag such that the film defines the inner cavity of the multi-ply bag.

6. The blank of claim 5, wherein the outer sheet is coupled to the second side of the base layer by the first adhesive pattern deposited between the outer sheet and the base layer, the first adhesive pattern being deposited in a discontinuous pattern.

7. The blank of claim 5, wherein the blank is repulpable.

8. The blank of claim 5, wherein each of the inner sheet, the outer sheet, and the film are repulpable.

9. The blank of claim 5, wherein the film comprises a reflective layer.

10. The blank of claim 9, wherein the reflective layer comprises metal.

11. The blank of claim 5, wherein the film comprises multiple layers and wherein at least one of the multiple layers is a reflective layer.

12. The blank of claim 11, wherein at least one of the multiple layers is a protective layer.

13. The blank of claim 5, wherein the vent is selectively sealable between a sealed and a vented configuration.

14. A blank assembly adapted for thermal management of a payload, the blank assembly comprising:

a first sheet assembly, the first sheet assembly comprising a base layer and a metallized film applied to the base layer;

a second sheet adhered to the base layer, the second sheet adhered to the base layer by a first adhesive pattern arranged at intermittent bonding points such that a plurality of voids are defined by the first sheet assembly, the second sheet, and the first adhesive pattern, the intermittent bonding points organized between a first end and a second end and from a top end to a bottom end of the blank, wherein at least one of the plurality of voids is vented at the top end of the blank;

a second adhesive pattern comprising a plurality of strips of adhesive extending along the first end, the second end, the top end, and the bottom end;

wherein the metallized film comprises a polymer;

wherein each of the base layer and the second sheet are of paper;

wherein each of the base layer, the second sheet, and the metallized film are repulpable.

\* \* \* \* \*